(12) United States Patent
Tsai et al.

(10) Patent No.: US 12,588,216 B2
(45) Date of Patent: Mar. 24, 2026

(54) PILLAR BASED MEMORY (MRAM) EMBEDDED WITHIN THE BURIED POWER RAIL WITHIN A BACKSIDE POWER DISTRIBUTION NETWORK

(71) Applicant: International Business Machines Corporation, Armonk, NY (US)

(72) Inventors: Wu-Chang Tsai, Albany, NY (US); Alexander Reznicek, Troy, NY (US); Michael Rizzolo, Delmar, NY (US); Ailian Zhao, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 727 days.

(21) Appl. No.: 17/942,822

(22) Filed: Sep. 12, 2022

(65) Prior Publication Data

US 2024/0090235 A1 Mar. 14, 2024

(51) Int. Cl.
| | |
|---|---|
| *H10B 61/00* | (2023.01) |
| *H10B 63/00* | (2023.01) |
| *H10N 50/01* | (2023.01) |
| *H10N 70/00* | (2023.01) |

(52) U.S. Cl.
CPC ............ *H10B 61/22* (2023.02); *H10B 63/30* (2023.02); *H10N 50/01* (2023.02); *H10N 70/011* (2023.02)

(58) Field of Classification Search
CPC ........ H10B 61/22; H10B 63/30; H10N 50/01; H10N 70/011; H10N 59/00
See application file for complete search history.

(56) References Cited

U.S. PATENT DOCUMENTS

| | | | |
|---|---|---|---|
| 10,872,820 B2 | 12/2020 | Block | |
| 10,916,583 B2 | 2/2021 | Wang | |
| 11,043,532 B2 | 6/2021 | Yokoyama | |
| 11,056,492 B1 | 7/2021 | Gomes | |
| 11,133,254 B2 | 9/2021 | Lai et al. | |
| 2010/0181547 A1* | 7/2010 | Kuroda .................. | H10B 53/30 |
| | | | 257/295 |
| 2014/0264235 A1 | 9/2014 | Gong | |
| 2014/0346624 A1* | 11/2014 | Shoji ...................... | H10N 50/01 |
| | | | 257/421 |
| 2020/0266169 A1 | 8/2020 | Kang | |
| 2021/0351303 A1* | 11/2021 | Ju ..................... | H01L 21/76897 |

(Continued)

FOREIGN PATENT DOCUMENTS

| | | |
|---|---|---|
| CN | 107527646 A | 12/2017 |
| CN | 108370250 A | 8/2018 |

(Continued)

OTHER PUBLICATIONS

Hossen et al., "Design Space Exploration of Power Delivery For Advanced Packaging Technologies", Cornell University, arXiv, 2008.03124, Jul. 10, 2020, 4 pages.

(Continued)

*Primary Examiner* — Shih Tsun A Chou

(74) *Attorney, Agent, or Firm* — Aaron N. Pontikos

(57) ABSTRACT

An apparatus comprising a backside power distribution network; a backside power rail joined to the backside power distribution network; and a backside contact via that couples at least one front end of line transistor to the backside power rail; wherein the backside contact via comprises a pillar based memory device.

15 Claims, 48 Drawing Sheets

(56) References Cited

U.S. PATENT DOCUMENTS

| | | | |
|---|---|---|---|
| 2021/0399099 A1 | 12/2021 | Chu et al. | |
| 2022/0028758 A1 | 1/2022 | Song et al. | |
| 2022/0084561 A1 | 3/2022 | Chen | |
| 2022/0406754 A1* | 12/2022 | Sharma | H10D 86/201 |
| 2023/0067715 A1* | 3/2023 | Yuh | H10D 30/6729 |

FOREIGN PATENT DOCUMENTS

| | | | |
|---|---|---|---|
| CN | 109983594 A | 7/2019 | |
| CN | 119856584 A | 4/2025 | |
| DE | 11202303790 T5 | 7/2025 | |
| EP | 3324436 A1 | 5/2018 | |
| JP | 2014229758 A | 12/2014 | |
| WO | 2024/055884 A1 | 3/2024 | |

OTHER PUBLICATIONS

International Searching Authority, "Notification of Transmittal of the International Search Report and the Written Opinion of the International Searching Authority, or the Declaration", Applicant File Reference: F23W4017, International Application No. PCT/CN2023/117277, International Filing Date: Sep. 6, 2023, Date of Mailing: Nov. 9, 2023, 8 pages.

* cited by examiner

| FIG.7-1 | FIG.7-2 |

204

Si

STI

ILD

EPITAXY

BEOL

CARRIER WAFER

| FIG.44-1 | FIG.44-2 |

4500

FORMING A BACKSIDE POWER DISTRIBUTION NETWORK (2302) — 4510

JOINING A BACKSIDE POWER RAIL (2308) TO THE BACKSIDE POWER DISTRIBUTION NETWORK (2302) — 4520

FORMING A CONTACT VIA (601, 1504, 2312), THE CONTACT VIA (601, 1504, 2312) COUPLING AT LEAST ONE FRONT END OF LINE TRANSISTOR (2314) TO THE BACKSIDE POWER RAIL (2308) — 4530

WHEREIN THE CONTACT VIA (601, 1504, 2312) COMPRISES A PILLAR BASED MEMORY DEVICE (1908) — 4540

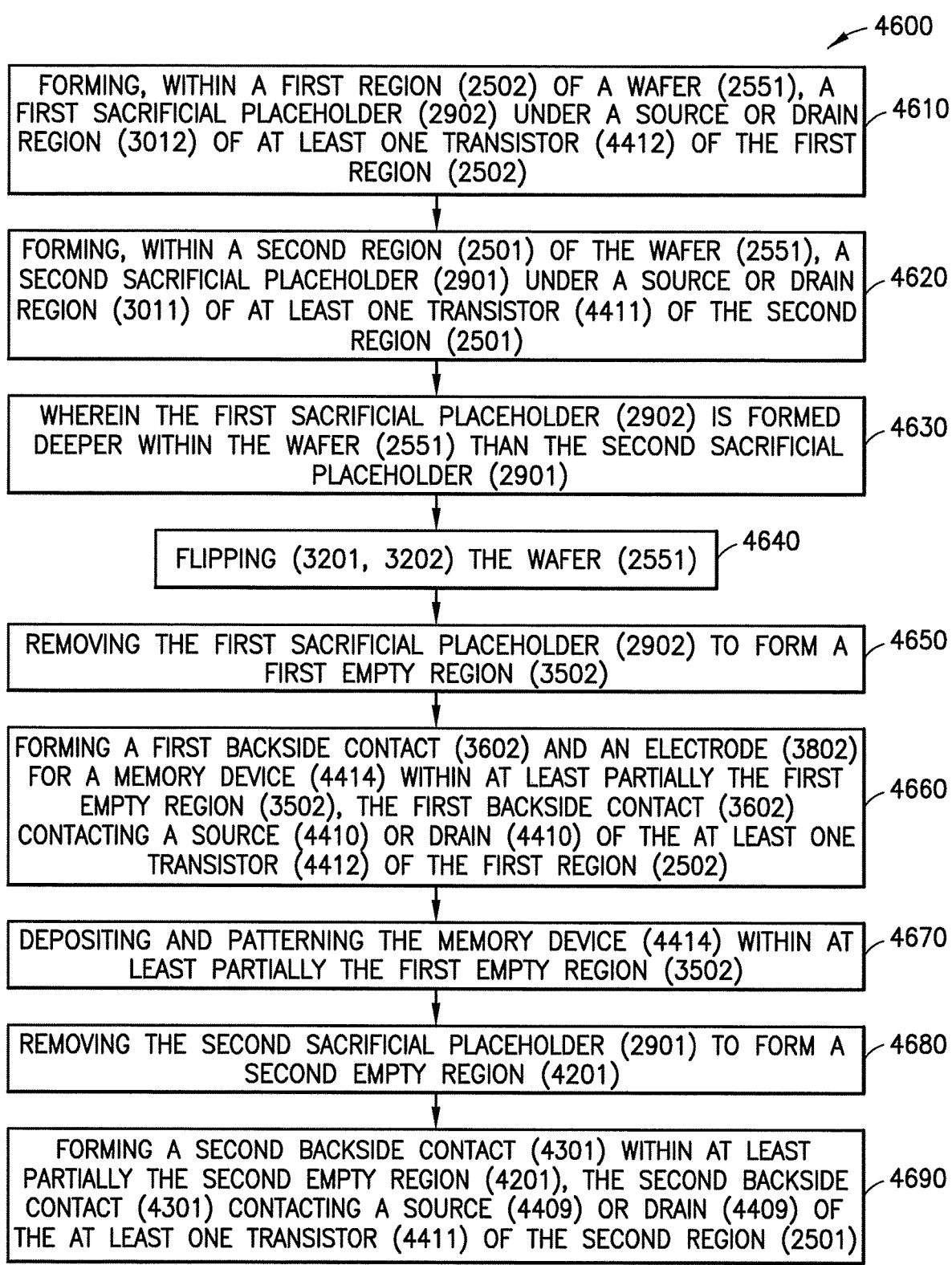

4600

FORMING, WITHIN A FIRST REGION (2502) OF A WAFER (2551), A FIRST SACRIFICIAL PLACEHOLDER (2902) UNDER A SOURCE OR DRAIN REGION (3012) OF AT LEAST ONE TRANSISTOR (4412) OF THE FIRST REGION (2502) — 4610

FORMING, WITHIN A SECOND REGION (2501) OF THE WAFER (2551), A SECOND SACRIFICIAL PLACEHOLDER (2901) UNDER A SOURCE OR DRAIN REGION (3011) OF AT LEAST ONE TRANSISTOR (4411) OF THE SECOND REGION (2501) — 4620

WHEREIN THE FIRST SACRIFICIAL PLACEHOLDER (2902) IS FORMED DEEPER WITHIN THE WAFER (2551) THAN THE SECOND SACRIFICIAL PLACEHOLDER (2901) — 4630

FLIPPING (3201, 3202) THE WAFER (2551) — 4640

REMOVING THE FIRST SACRIFICIAL PLACEHOLDER (2902) TO FORM A FIRST EMPTY REGION (3502) — 4650

FORMING A FIRST BACKSIDE CONTACT (3602) AND AN ELECTRODE (3802) FOR A MEMORY DEVICE (4414) WITHIN AT LEAST PARTIALLY THE FIRST EMPTY REGION (3502), THE FIRST BACKSIDE CONTACT (3602) CONTACTING A SOURCE (4410) OR DRAIN (4410) OF THE AT LEAST ONE TRANSISTOR (4412) OF THE FIRST REGION (2502) — 4660

DEPOSITING AND PATTERNING THE MEMORY DEVICE (4414) WITHIN AT LEAST PARTIALLY THE FIRST EMPTY REGION (3502) — 4670

REMOVING THE SECOND SACRIFICIAL PLACEHOLDER (2901) TO FORM A SECOND EMPTY REGION (4201) — 4680

FORMING A SECOND BACKSIDE CONTACT (4301) WITHIN AT LEAST PARTIALLY THE SECOND EMPTY REGION (4201), THE SECOND BACKSIDE CONTACT (4301) CONTACTING A SOURCE (4409) OR DRAIN (4409) OF THE AT LEAST ONE TRANSISTOR (4411) OF THE SECOND REGION (2501) — 4690

FIG.46

PILLAR BASED MEMORY (MRAM) EMBEDDED WITHIN THE BURIED POWER RAIL WITHIN A BACKSIDE POWER DISTRIBUTION NETWORK

BACKGROUND

The exemplary embodiments described herein relate generally to semiconductor device design and integrated circuit design, and more specifically, to a pillar based memory (MRAM) embedded within a buried power rail within a backside power distribution network.

In some systems there may be integration of an MRAM device with a TSV, placing the MRAM considerably far apart from the respective transistors. However, there is a need to place the MTJs close to the transistors to minimize RC delay for last level cache applications to replace eDRAM. Also, in some systems the MRAM device is not directly connected to a backside contact connected to the transistor, whereas to for example improve on that described by U.S. Pat. No. 10,916,583 B2, it may be advantageous for the MRAM to be directly connected to the backside contact connected to the transistor.

SUMMARY

In one aspect, an apparatus includes a backside power distribution network; a backside power rail joined to the backside power distribution network; and a backside contact via that couples at least one front end of line transistor to the backside power rail; wherein the backside contact via comprises a pillar based memory device.

In another aspect, a method includes forming a backside power distribution network; joining a backside power rail to the backside power distribution network; and forming a contact via, the contact via coupling at least one front end of line transistor to the backside power rail; wherein the contact via comprises a pillar based memory device.

In another aspect, an apparatus includes a transistor comprising a source or drain; a backside contact coupled to the transistor; and a memory device formed at a backside of a wafer, the memory device comprising an electrode; wherein the electrode of the memory device is directly connected to the backside contact of the transistor.

In another aspect, a method includes forming, within a first region of a wafer, a first sacrificial placeholder under a source or drain region of at least one transistor of the first region; forming, within a second region of the wafer, a second sacrificial placeholder under a source or drain region of at least one transistor of the second region; wherein the first sacrificial placeholder is formed deeper within the wafer than the second sacrificial placeholder; flipping the wafer; removing the first sacrificial placeholder to form a first empty region; forming a first backside contact and an electrode for a memory device within at least partially the first empty region, the first backside contact contacting a source or drain of the at least one transistor of the first region; depositing and patterning the memory device within at least partially the first empty region; removing the second sacrificial placeholder to form a second empty region; and forming a second backside contact within at least partially the second empty region, the second backside contact contacting a source or drain of the at least one transistor of the second region.

In another aspect, a semiconductor device includes a first region comprising a first backside contact to couple at least one transistor of the first region to a memory device of the first region; and a second region comprising a second backside contact to couple at least one transistor of the second region to a backside power rail of the second region.

BRIEF DESCRIPTION OF THE DRAWINGS

The foregoing and other aspects of exemplary embodiments are made more evident in the following Detailed Description, when read in conjunction with the attached Drawing Figures, wherein:

FIG. 46 is a logic flow diagram that illustrates a method of forming a semiconductor device.

DETAILED DESCRIPTION

Figure 1:
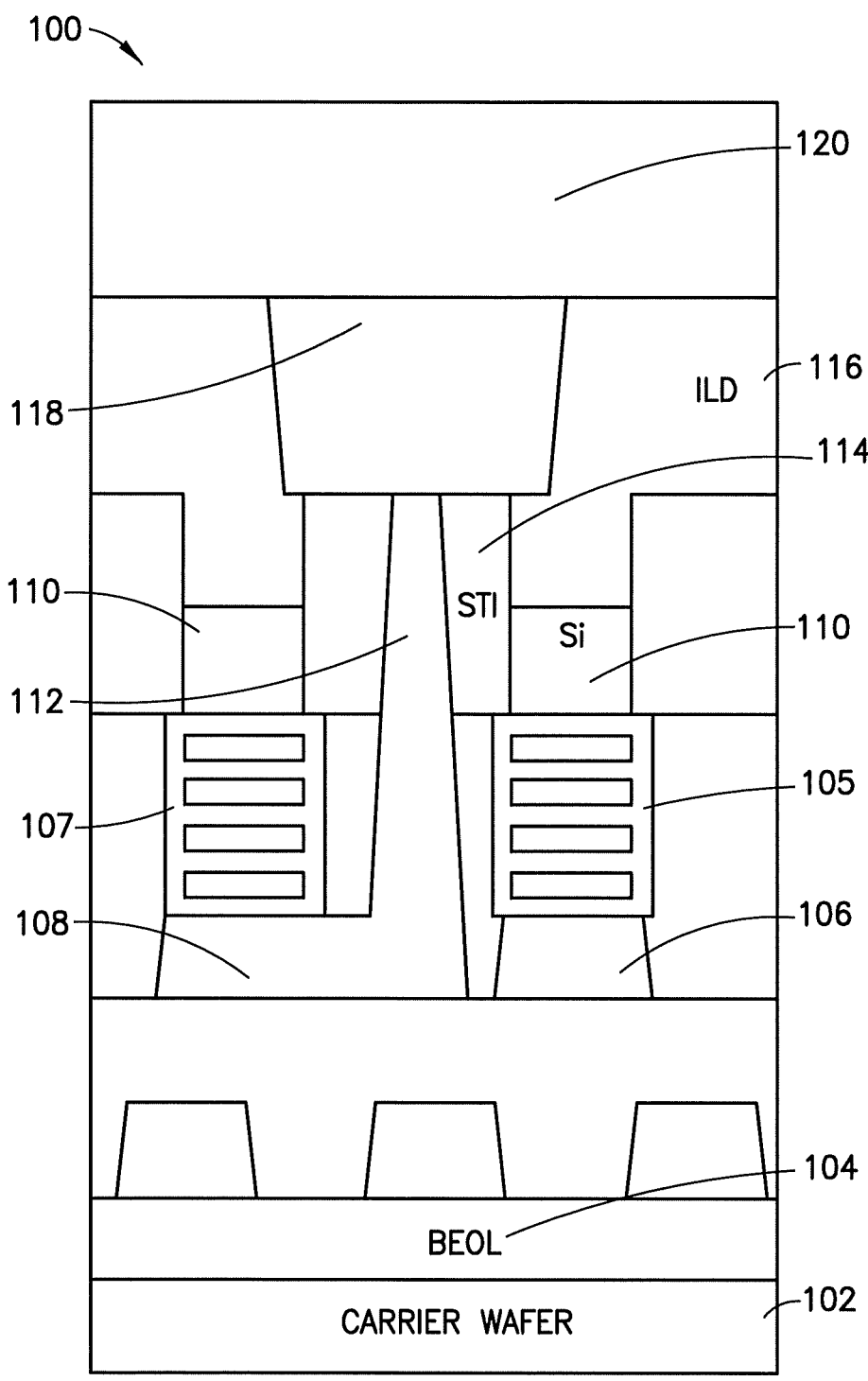
FIG. 1 depicts a via to a buried power rail, which is part of a backside power distribution network.

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Described herein is a pillar based memory (MRAM) embedded within a buried power rail within a backside power distribution network. In particular, described herein is a semiconductor structure having a buried power rail and backside power distribution network. The structure includes a contact via connecting the FEOL transistors with the backside power rail. A pillar based memory device is formed within said contact via. The via may include magnetic materials (like Co). The memory may be an MRAM device. Part of the magnetic contact via forming the bottom contact for the MRAM device has a non-magnetic conductive spacer between the MRAM device and the via (e.g. TiN). In other embodiments the contact via may include non-magnetic conductive materials. Alternately, the memory can be a PCM or ReRAM.

Also described herein is a method of forming a pillar based memory device within a buried power rail and backside power distribution network.

Thus, the examples described herein relate to an MRAM integrated on a backside of a wafer where the backside power distribution network/buried power rail is. A non-magnetic bottom electrode contacts the MRAM device, which avoids interfering with operation.

The device described herein has high value attributes and technical effects. In particular, the structure which forms the MRAM very close to the respective transistor minimizes RC delay. A possible application is last level cache i.e. in 14 nm, 7 nm, 5 nm, 3 nm technology nodes. No additional space is needed because the structure may be integrated in existing unused space.

MRAM is an emerging memory technology being integrated in older, current and future technology nodes (14 nm and below). High performance MRAM integration is severely challenged to embed at the 14 nm and below nodes due to minimal vertical height. While in some systems there may be heterogeneous integration of MRAM with a TSV, placing the MRAM considerably far apart from the respective transistors, there is a need to place the MTJs close to the transistors to minimize RC delay for last level cache applications to replace eDRAM. Alternative schemes such as skipping levels between M1 and M3 have notable integration issues, and further move the top contact away from the transistors.

The examples described herein place an MRAM pillar with the via of a buried power rail and backside power distribution network. Part of the magnetic contact via (e.g. Co) is replaced with a non-magnetic conductive spacer (e.g. TiN) thus forming the bottom contact for the MRAM pillar.

FIG. 1 is an example semiconductor device 100. The semiconductor device 100 is a via to buried power rail backside power distribution network device. BEOL 104 is joined to a surface of a carrier wafer 102. A via 112 connects a contact 108 to a buried power rail 118. STI 114 is formed in the initial substrate and the buried power rail 118 is formed later. The backside via 112 is formed within the STI 114. Silicon 110 is left-over silicon from the initial silicon substrate. The backside power distribution network 120 is formed on a side of the buried power rail 118 and ILD 116. The source/drain contact 106 is coupled to source/drain 105, and the source/drain contact 108 is coupled to source/drain 107.

Figure 2:
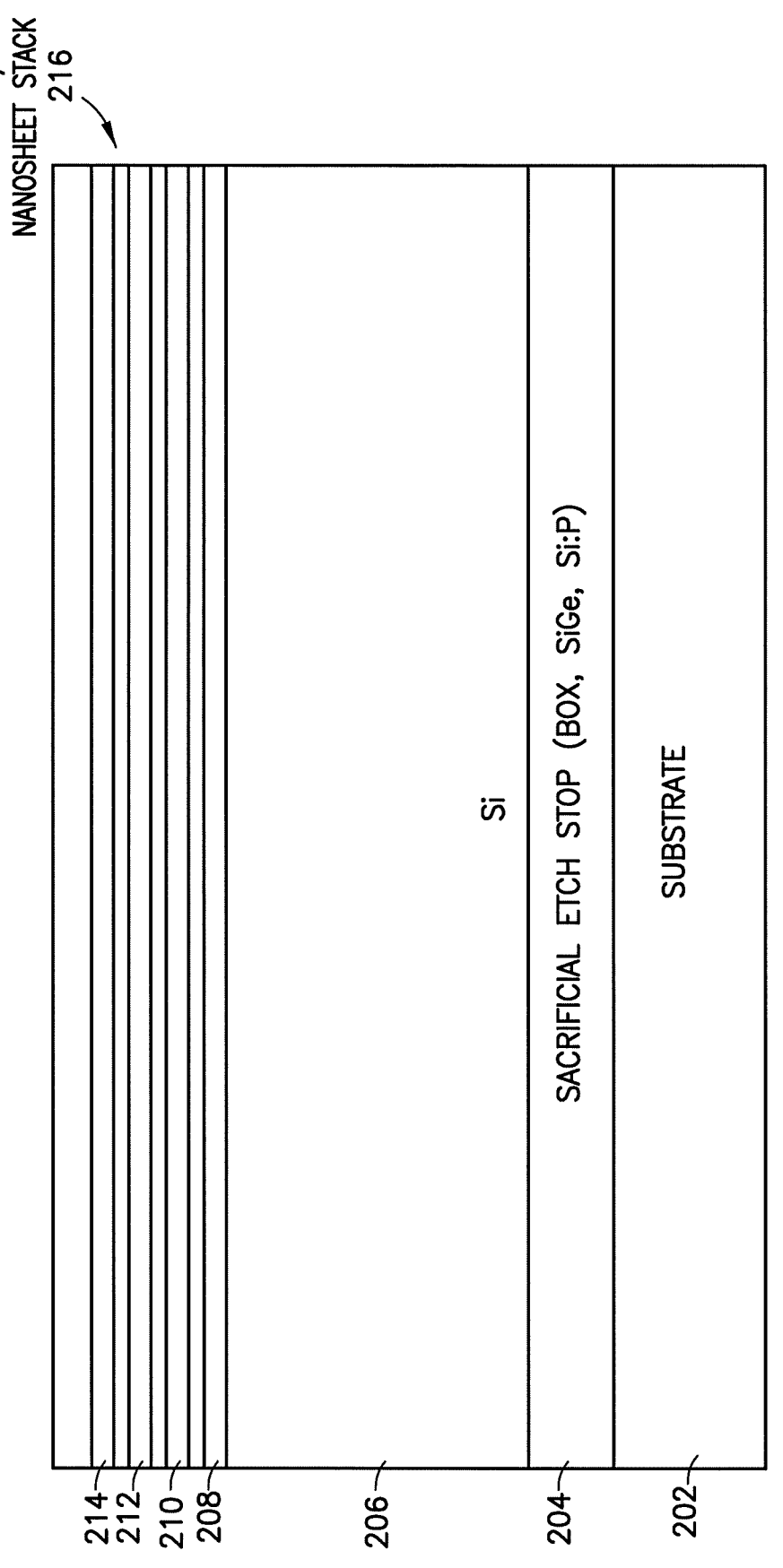
FIG. 2 depicts a starting structure substrate with an n blanket epitaxial SiGe/Si stack.

FIG. 2 depicts a starting structure substrate with an n blanket epitaxial SiGe/Si stack 216. A sacrificial etch stop layer 204 is applied between the substrate 202 and a silicon layer 206. The sacrificial etch stop layer 204 may comprise BOX, Silicon-Germanium alloy (SiGe), or phosphorus doped silicon (Si:P). In the example shown in FIG. 2, the silicon/SiGe nanosheet stack 216 includes 4 layers of SiGe (208, 210, 212, 214).

Figure 3:
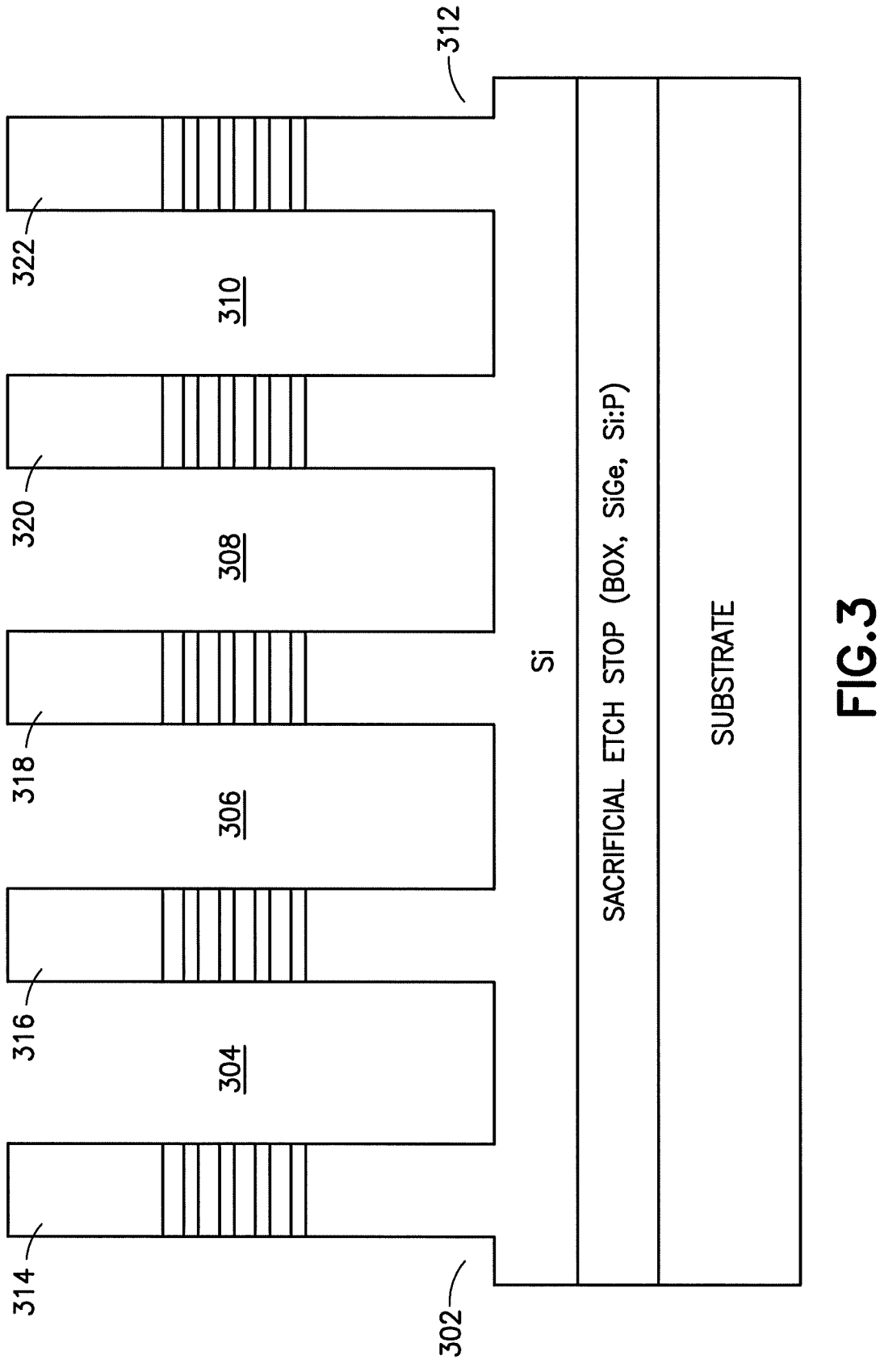
FIG. 3 depicts nanosheet patterning.

FIG. 3 depicts nanosheet patterning. Several etches (302, 304, 306, 308, 310, 312) are fabricated into the structure having the silicon 206 and the silicon/SiGe nanosheet stack 216. As shown, hard mask (314, 316, 318, 320, 322) is fabricated on a side of the etched silicon/SiGe nanosheet stack 216.

Figure 4:
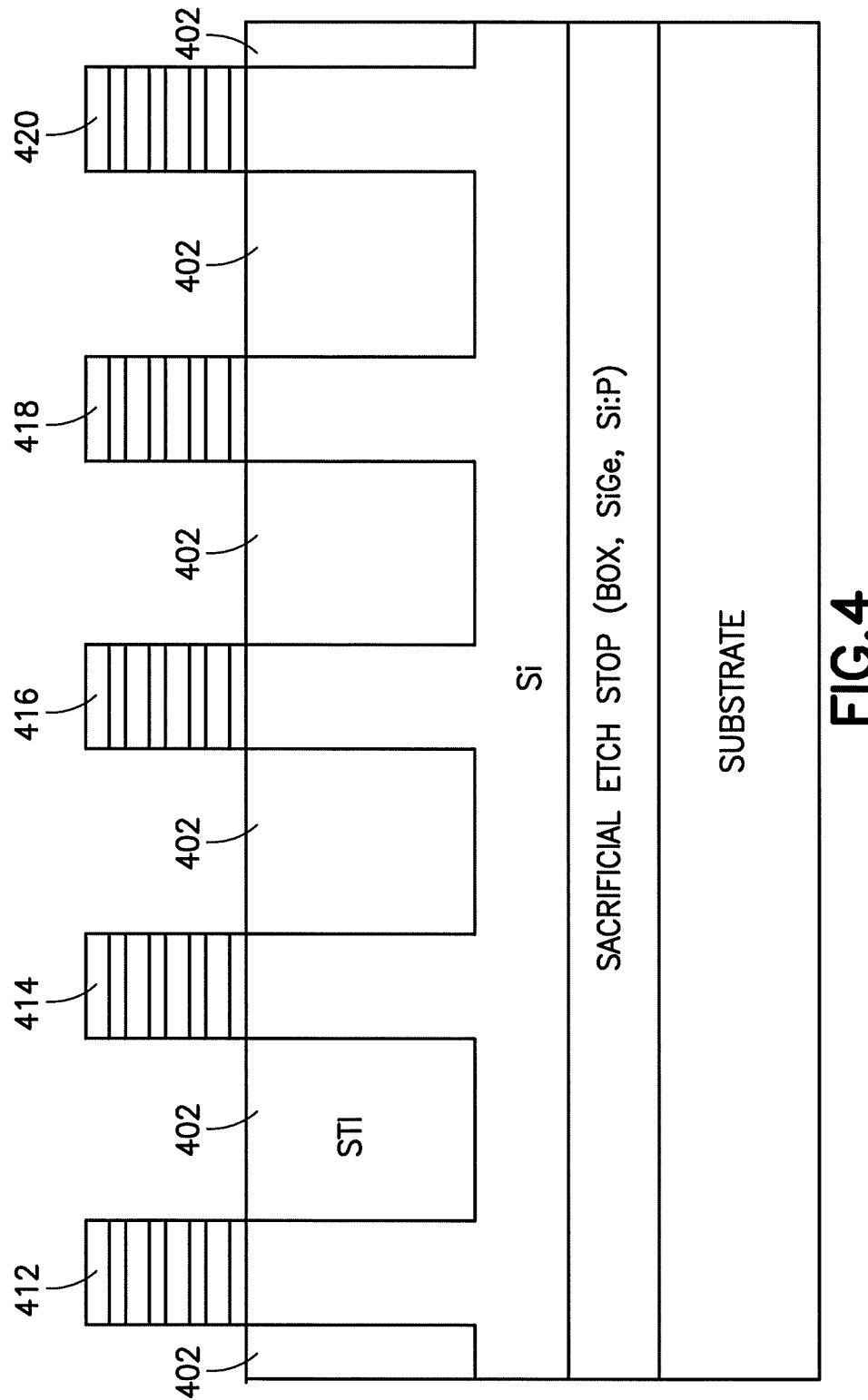
FIG. 4 depicts forming an STI layer and nanosheet stack fin reveal.

FIG. 4 depicts forming an STI layer and fin reveal. An STI layer 402 is formed on a side of the silicon layer 206 and within the etches (302, 304, 306, 308, 310, 312). The hard mask (314, 316, 318, 320, 322) is removed to reveal the fins (412, 414, 416, 418, 420).

Figure 5:
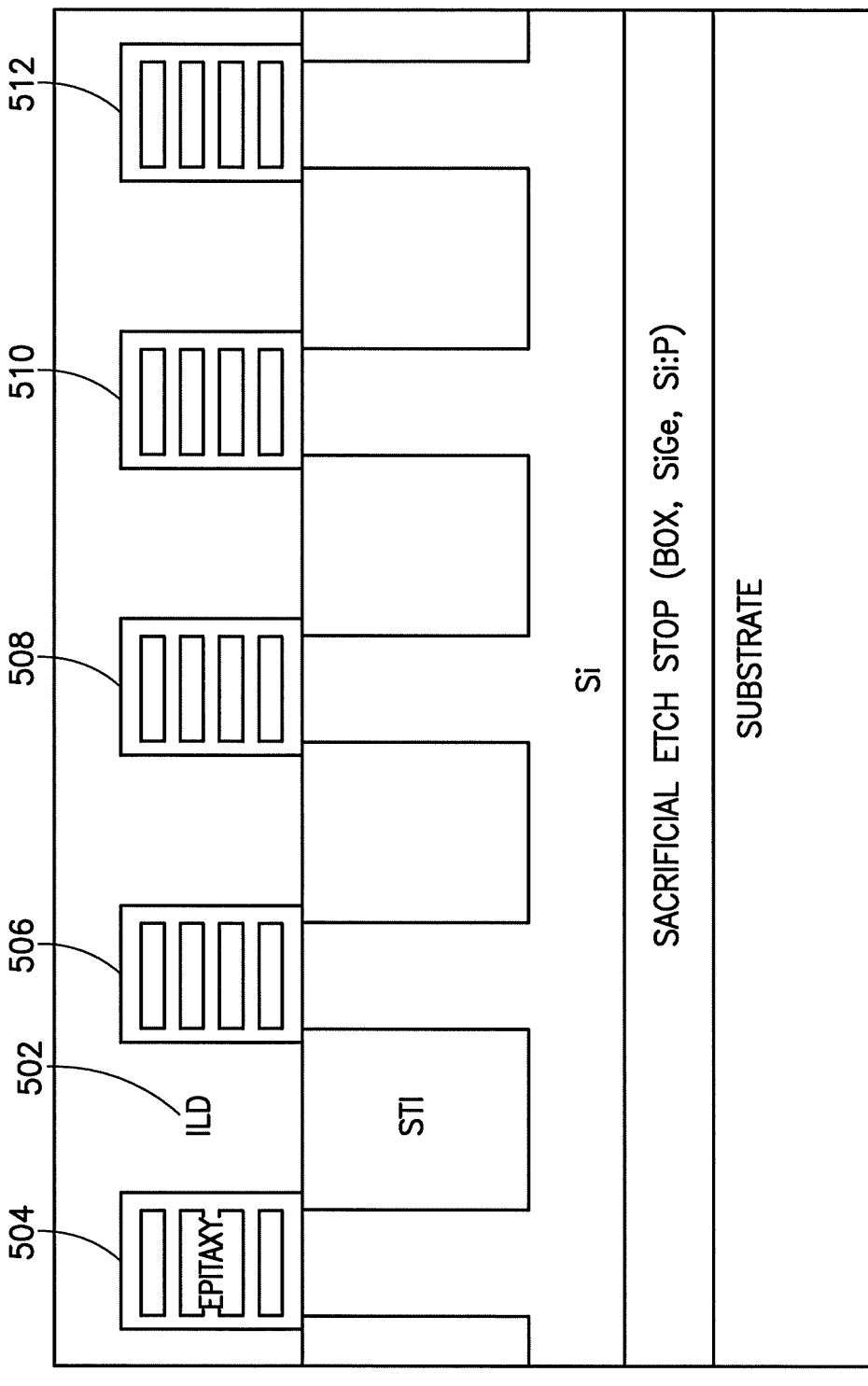
FIG. 5 depicts continuing and finishing FEOL integration.

FIG. 5 depicts continuing and finishing FEOL integration. An ILD layer 502 is formed next to (e.g. above) the STI layer 402 and between the epitaxy based fins (504, 506, 508, 510, 512).

Figure 6:
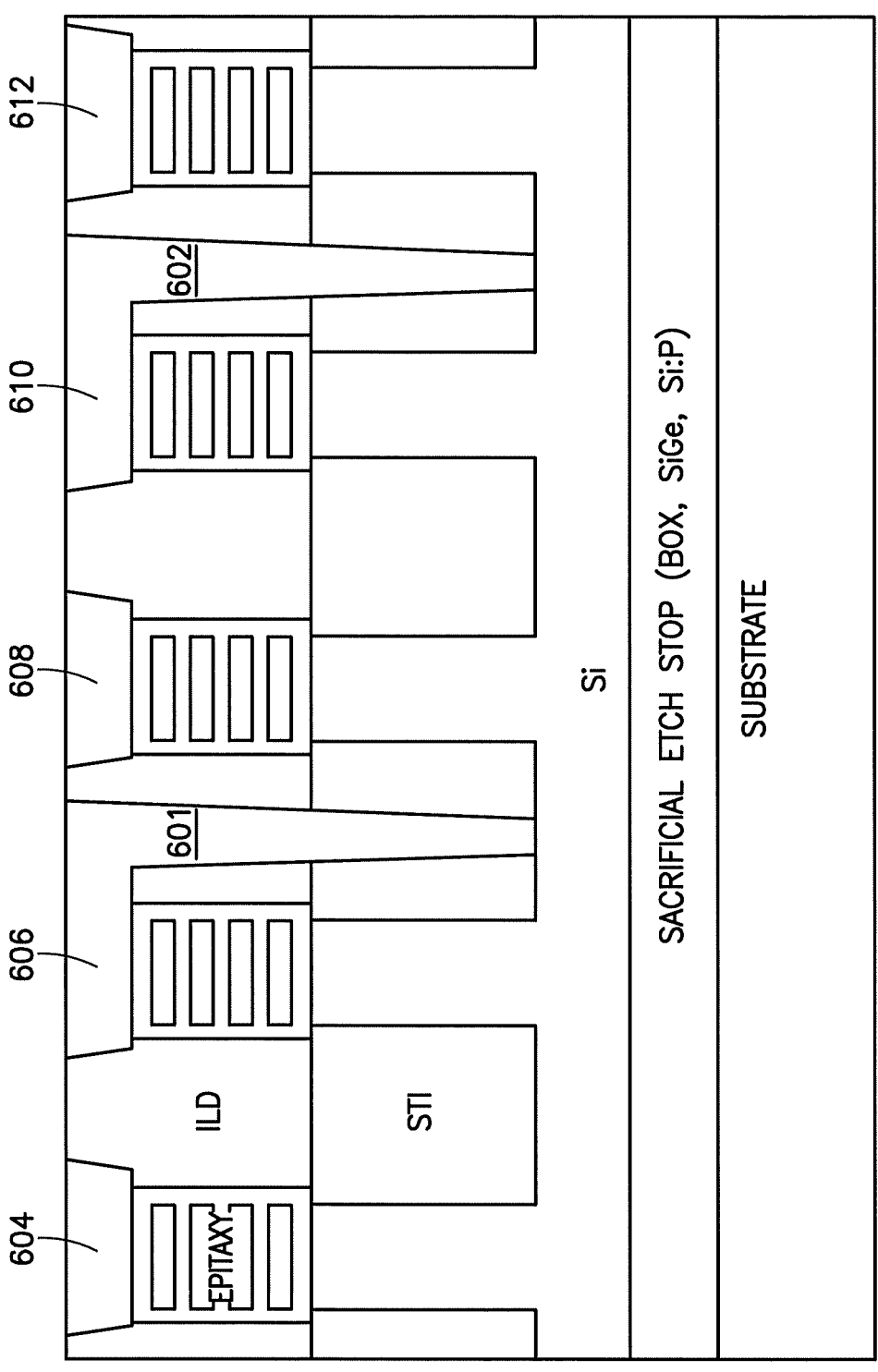
FIG. 6 depicts MOL processing including forming a contact to the source drain and via to a buried power rail connection.

FIG. 6 depicts MOL processing including forming a contact to the source drain and VBPR connection. A plurality of source/drain contacts (604, 606, 608, 610, 612) are fabricated next to (e.g. above) the epitaxy based fins (504, 506, 508, 510, 512) within the ILD layer 502. Two vias (601, 602) connect the source/drain contacts (606, 610) through the ILD layer 502 and the STI layer 402 to the silicon layer 206.

Figures 1, 7:
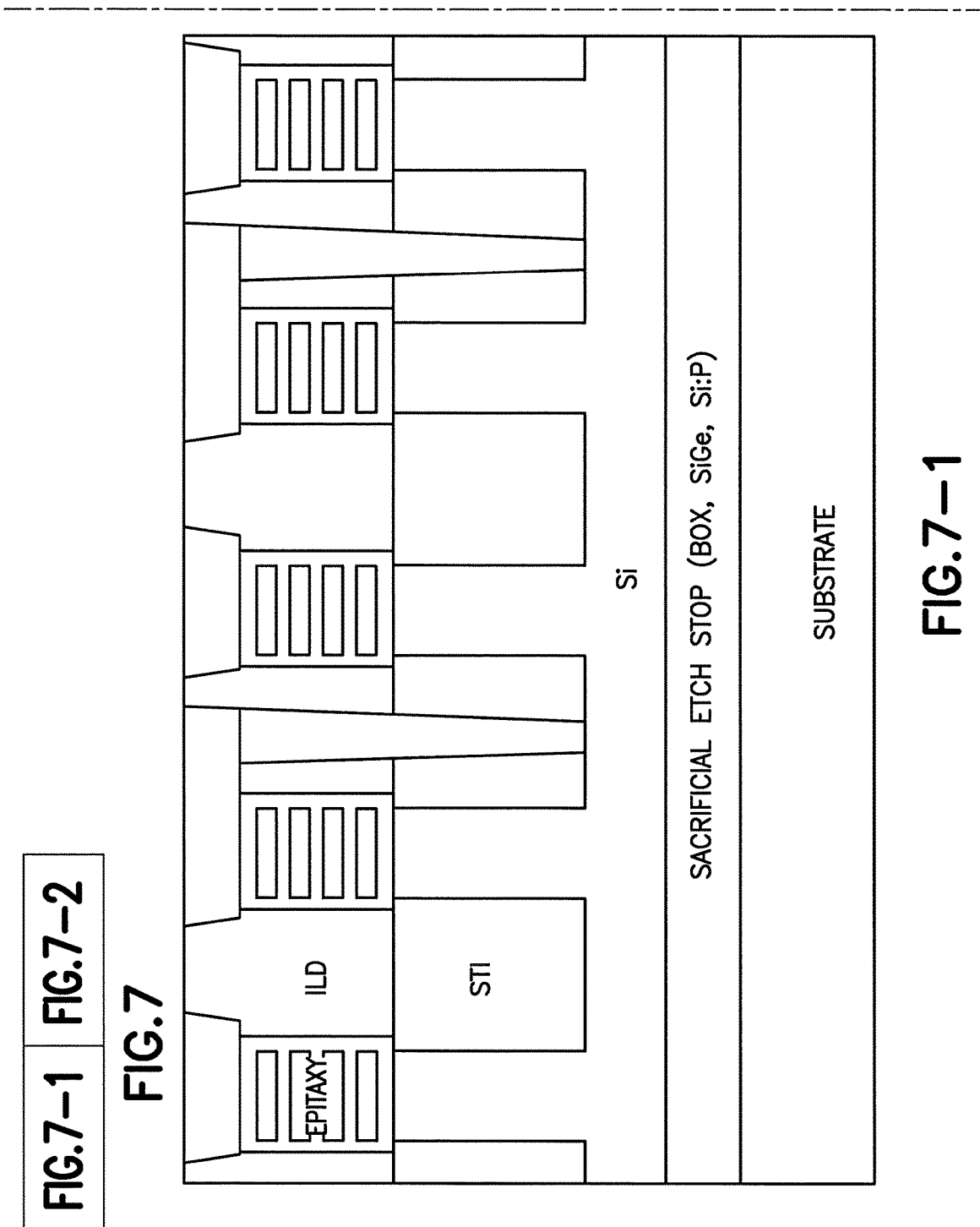
FIG. 7 shows a cross-section view between gates, in a source drain area.
Figures 2, 7:
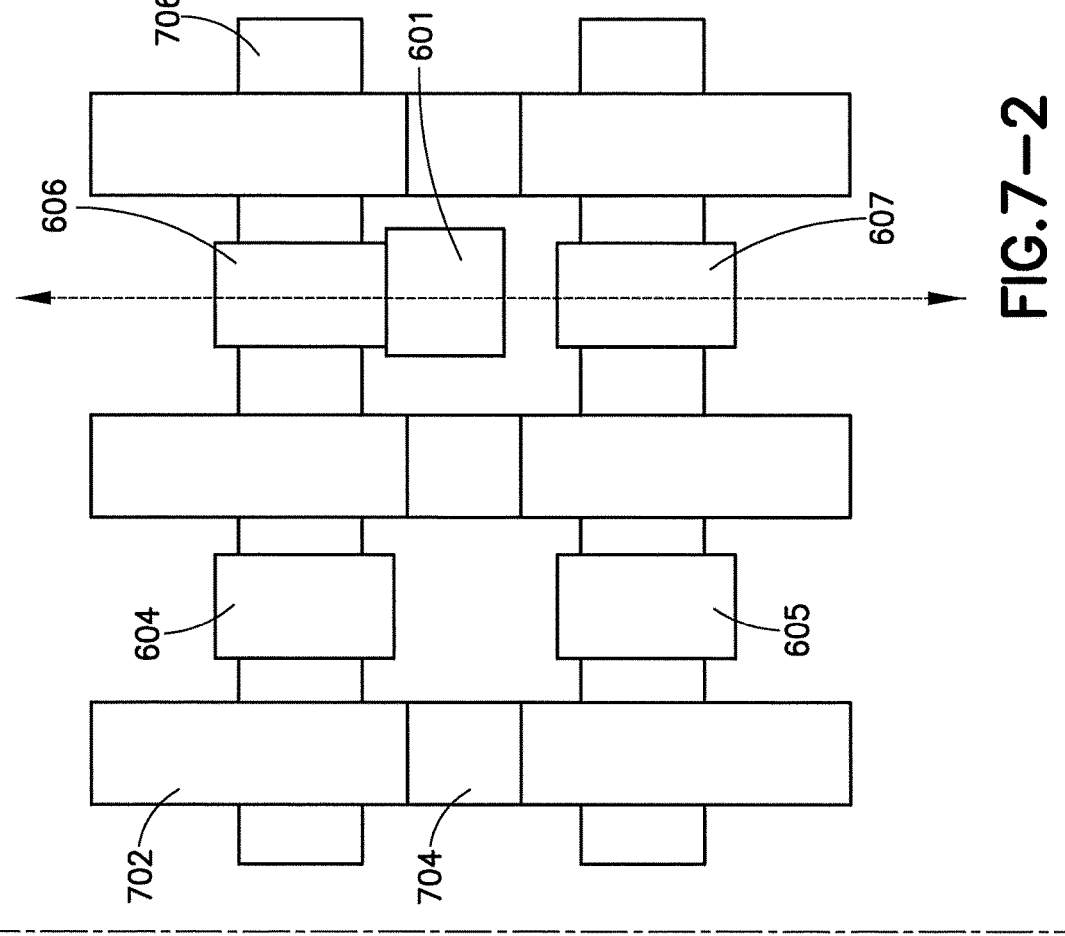

FIG. 7 shows a cross-section view between gates, in a source drain area. Shown is dummy gate line 702 interrupted by gate cuts 704, as well as additional source/drain contacts (605, 607) and active device layer 706 spanning source/drain contact 606, source/drain contact 604 and dummy gate line 702. The cross-sectional view of source/drain contact 606, via 601, and source/drain contact 607 is depicted.

Figure 8:
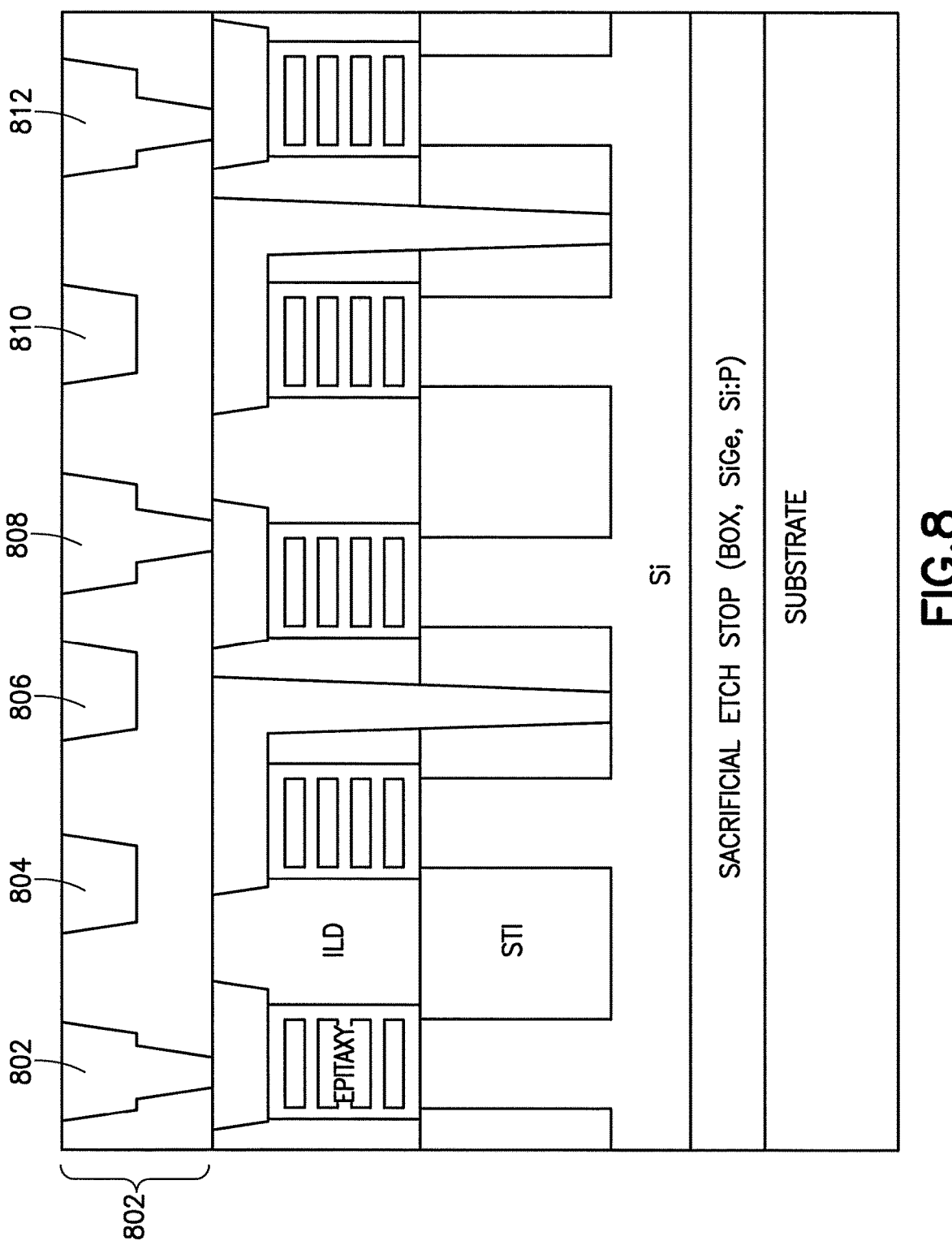
FIG. 8 depicts continuing BEOL processing.

FIG. 8 depicts continuing BEOL processing. A layer of BEOL 802 is formed next to (e.g. above) the source/drain contacts (604, 606, 608, 610, 612). A plurality of vias (802, 804, 806, 808, 810, 812) are formed within the BEOL layer 802, where via 802 is formed on a side of source/drain contact 604, via 808 is formed on a side of source/drain contact 608, and via 812 is formed on a side of source/drain contact 612.

Figure 9:
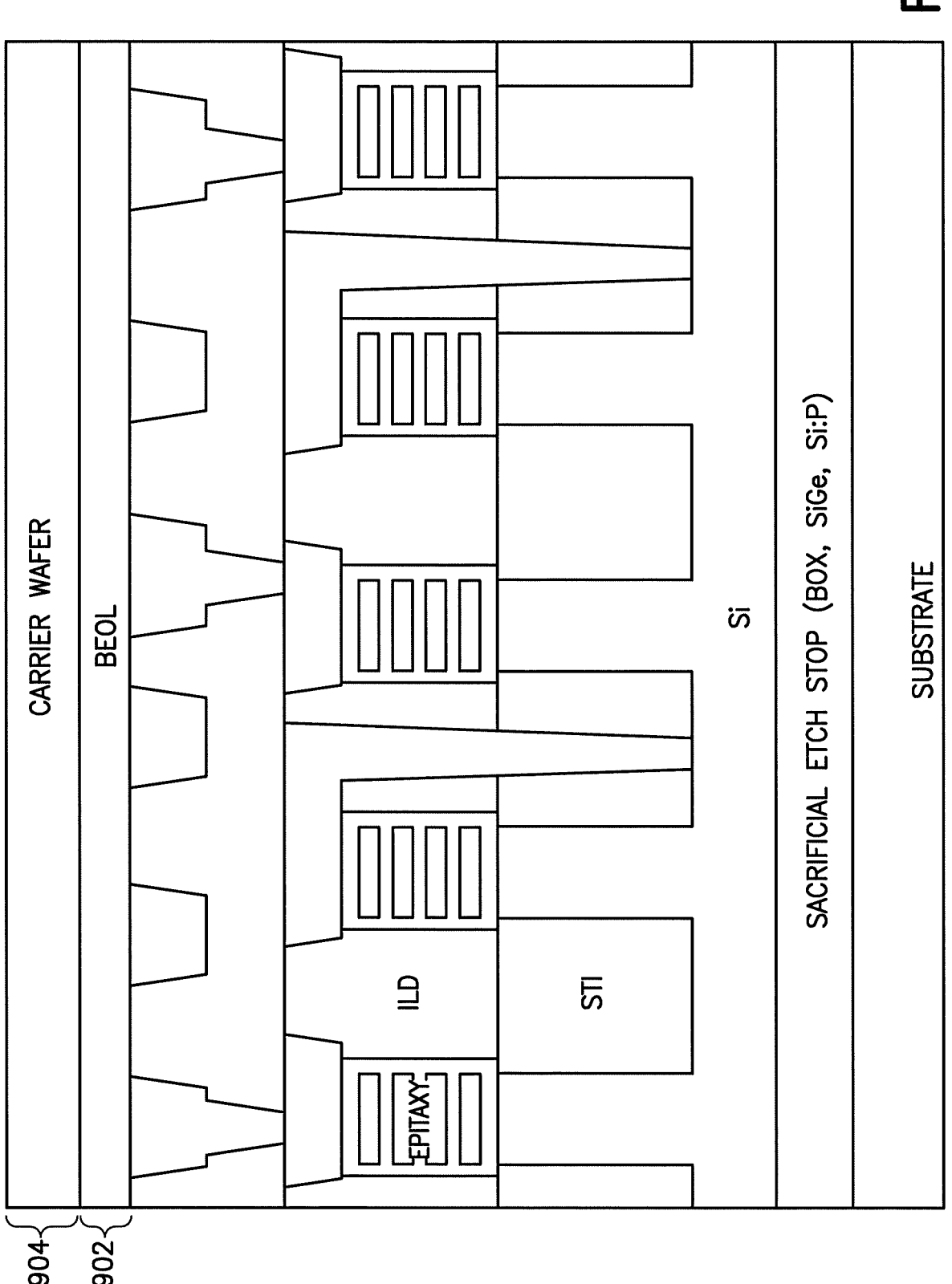
FIG. 9 depicts finishing BEOL processing and bonding to a carrier wafer.

FIG. 9 depicts finishing BEOL processing and bonding to a carrier wafer. Another BEOL layer 902 is formed next to the BEOL layer 802 that is next to the vias (802, 804, 806, 808, 810, 812). The BEOL layer 902 is bonded to the carrier wafer 904.

Figure 10:
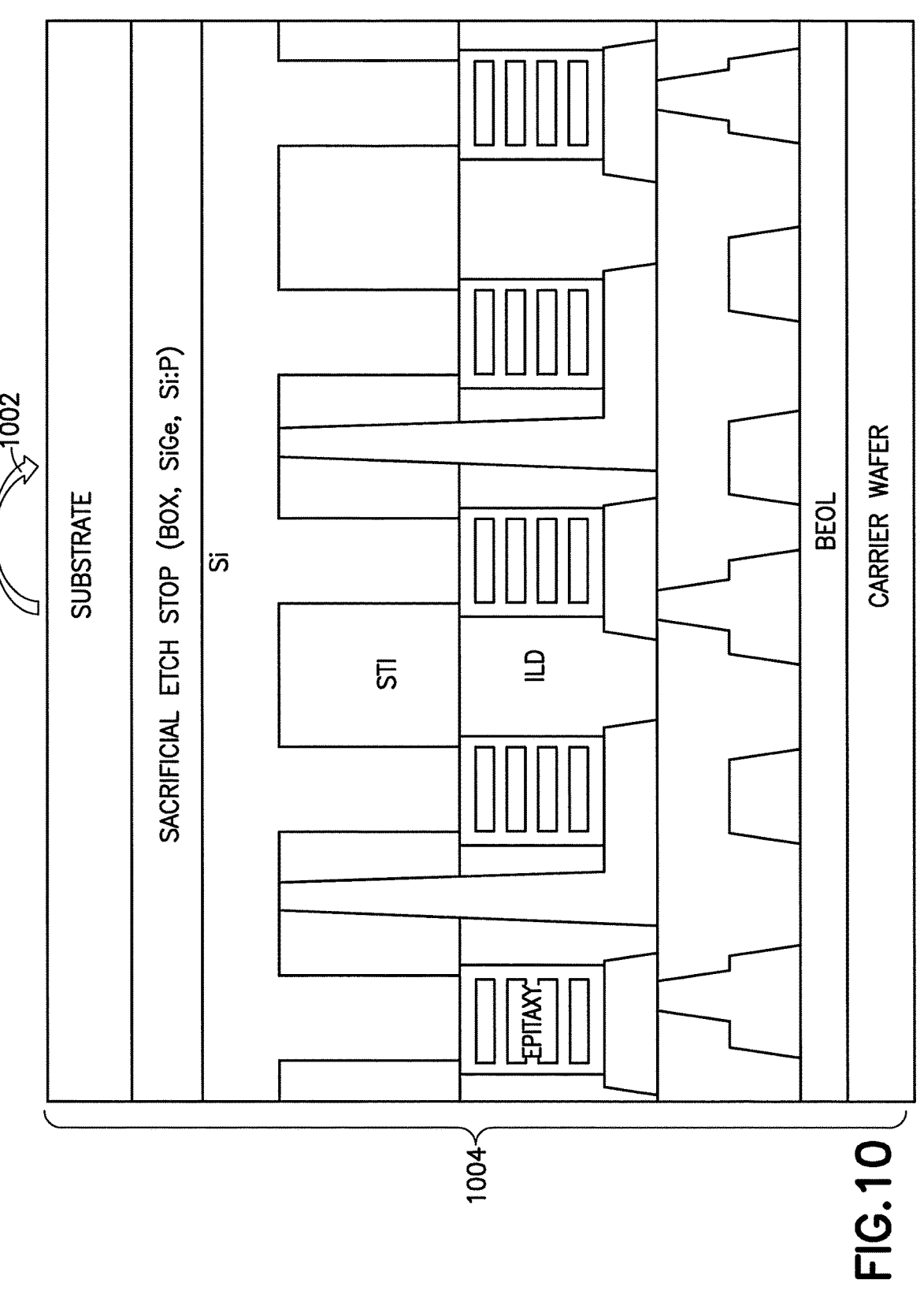
FIG. 10 depicts flipping the wafer.

FIG. 10 depicts flipping (1002) the wafer 1004, so that the carrier wafer 900 previously on one side is on a different side and the starting substrate 202 previously on the different side is on the one side.

Figure 11:
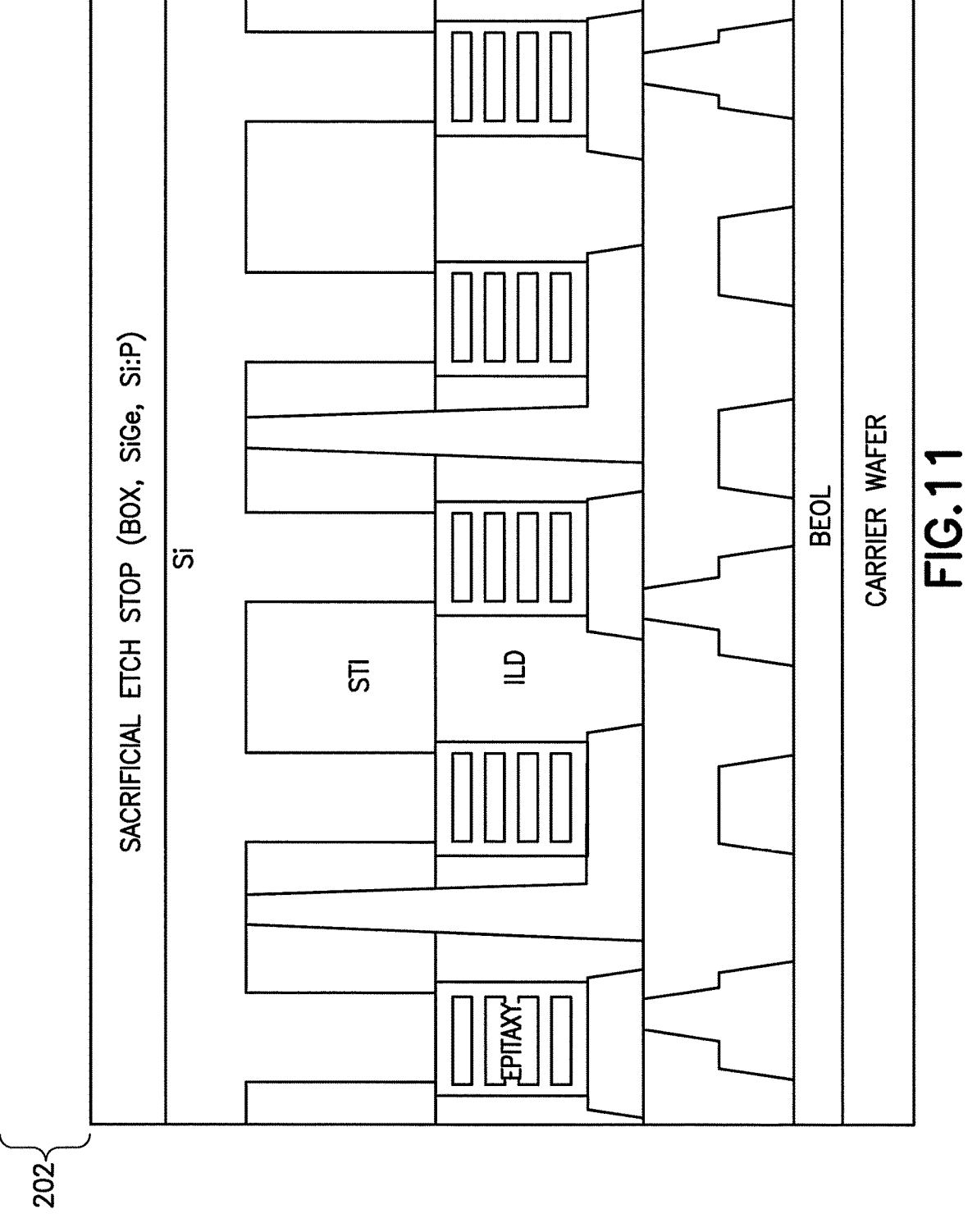
FIG. 11 depicts starting substrate thinning and stopping on an etch stop layer.
Figure 12:
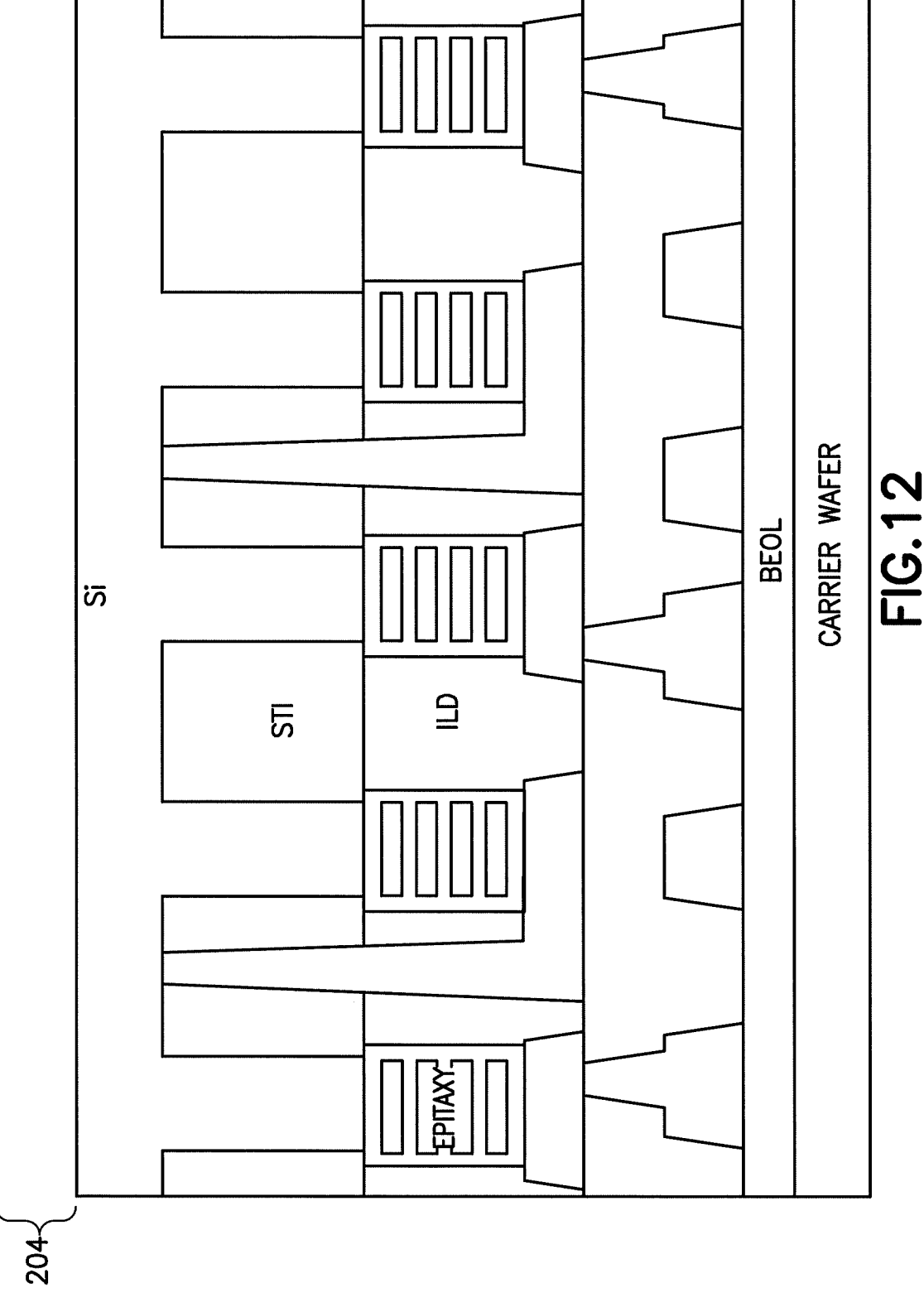
FIG. 12 depicts removing the etch stop layer.

FIG. 11 depicts starting substrate thinning and stopping on an etch stop layer (buried oxide, SiGe, Si:P). The substrate 202 is thinned and removed. FIG. 12 depicts removing the etch stop layer 204.

Figure 13:
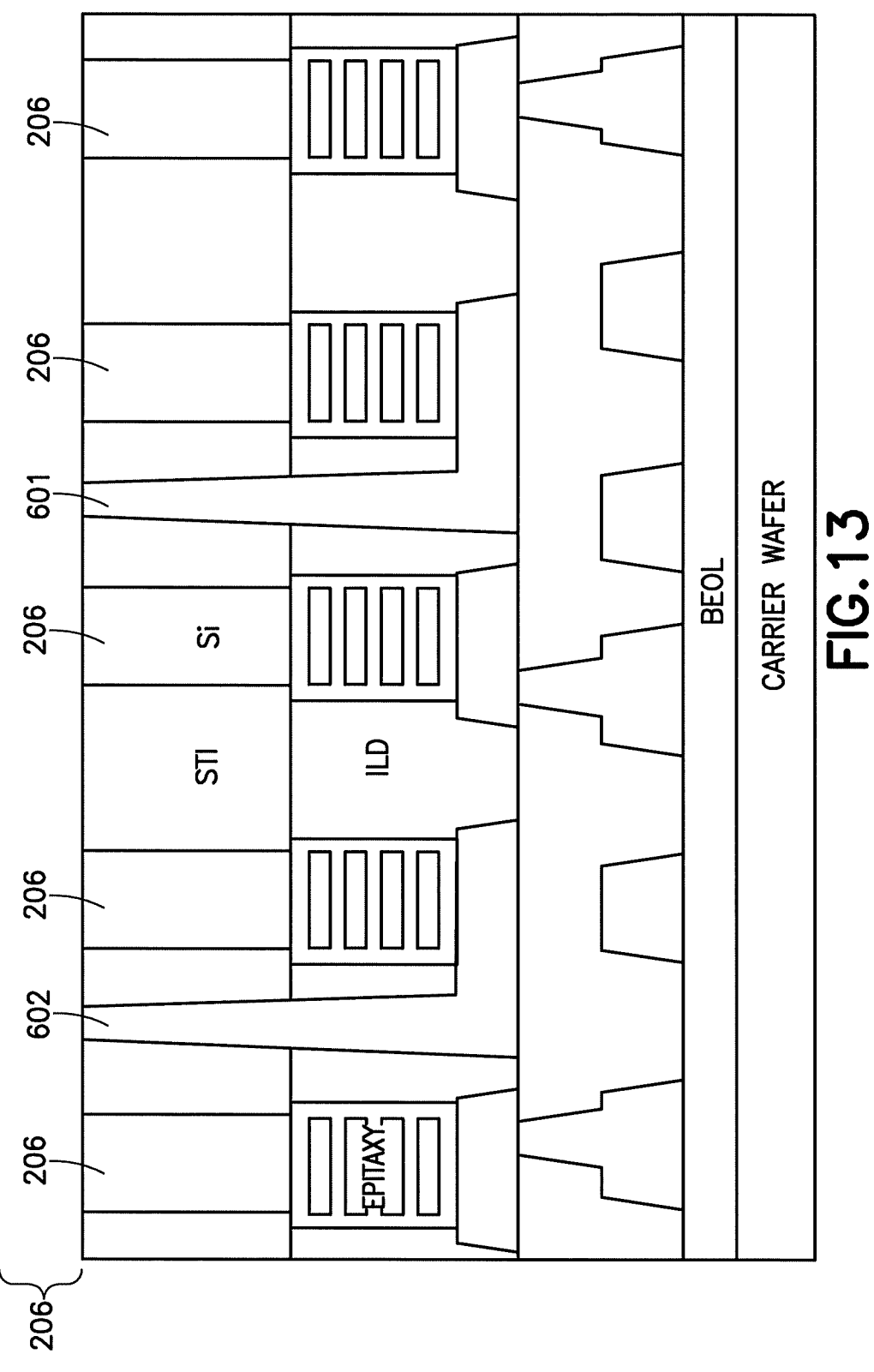
FIG. 13 depicts etching and application of CMP to a portion of the silicon layer to expose backside via contacts.

FIG. 13 depicts etching and application of CMP to a portion of the silicon layer 206 to expose via contacts (602, 601). FIG. 13 represents one embodiment where the via contact 601 is not recessed and the pedestal/MTJ (2316/1802, referring to FIG. 23 and FIG. 18) sits directly on the via contact 601 (compare FIG. 13 having no μ-stud with FIG. 23 having a μ-stud 1504, for example). A downside to this embodiment is that if the via contact 601 is made from magnetic material (i.e. Cobalt), there is a need to adjust the MTJ stack (2304, 2312, 1908, referring to FIG. 23) to compensate for magnetic fields coming from the via 601. In FIG. 13, via 601 is the via for the buried power rail (2308, referring to FIG. 23).

Figure 14:
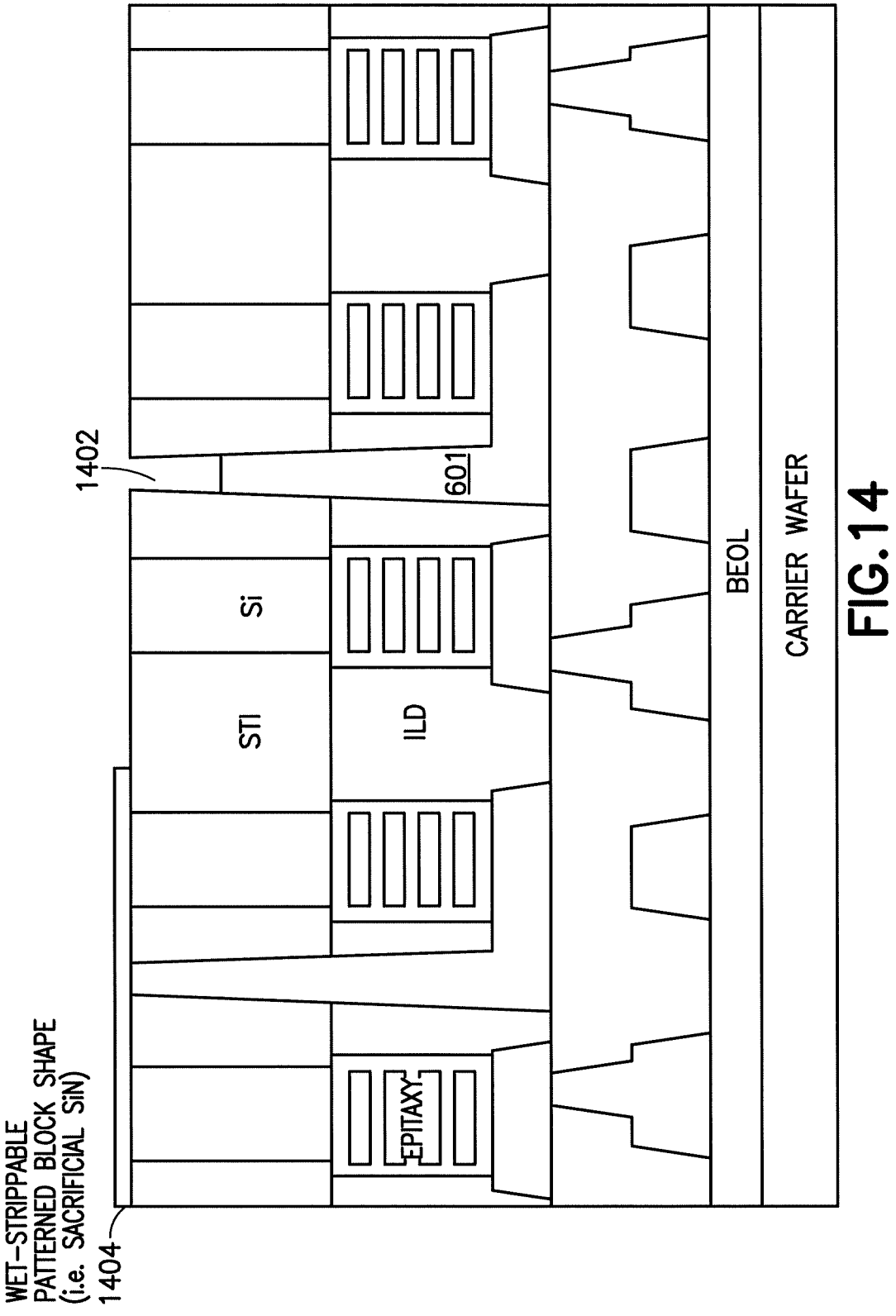
FIG. 14 depicts a recessed MRAM backside via contact.

FIG. 14 depicts a recessed MRAM via contact 601 (e.g. the recess 1402 being greater than 10 nm). Thus, the via contact 601 is recessed. In this embodiment, the recessed MRAM via contact 601 prevents magnetic field interference with possible co-contact metal (magnetic) in the via 601 to the MTJ (1802, referring to FIG. 18). FIG. 14 also depicts fabrication of a wet-strippable patterned block shape 1404 (i.e. a sacrificial SiN), fabricated on a surface of the STI layer 402, a portion of the silicon layer 206, and the via contact 602.

Figure 15:
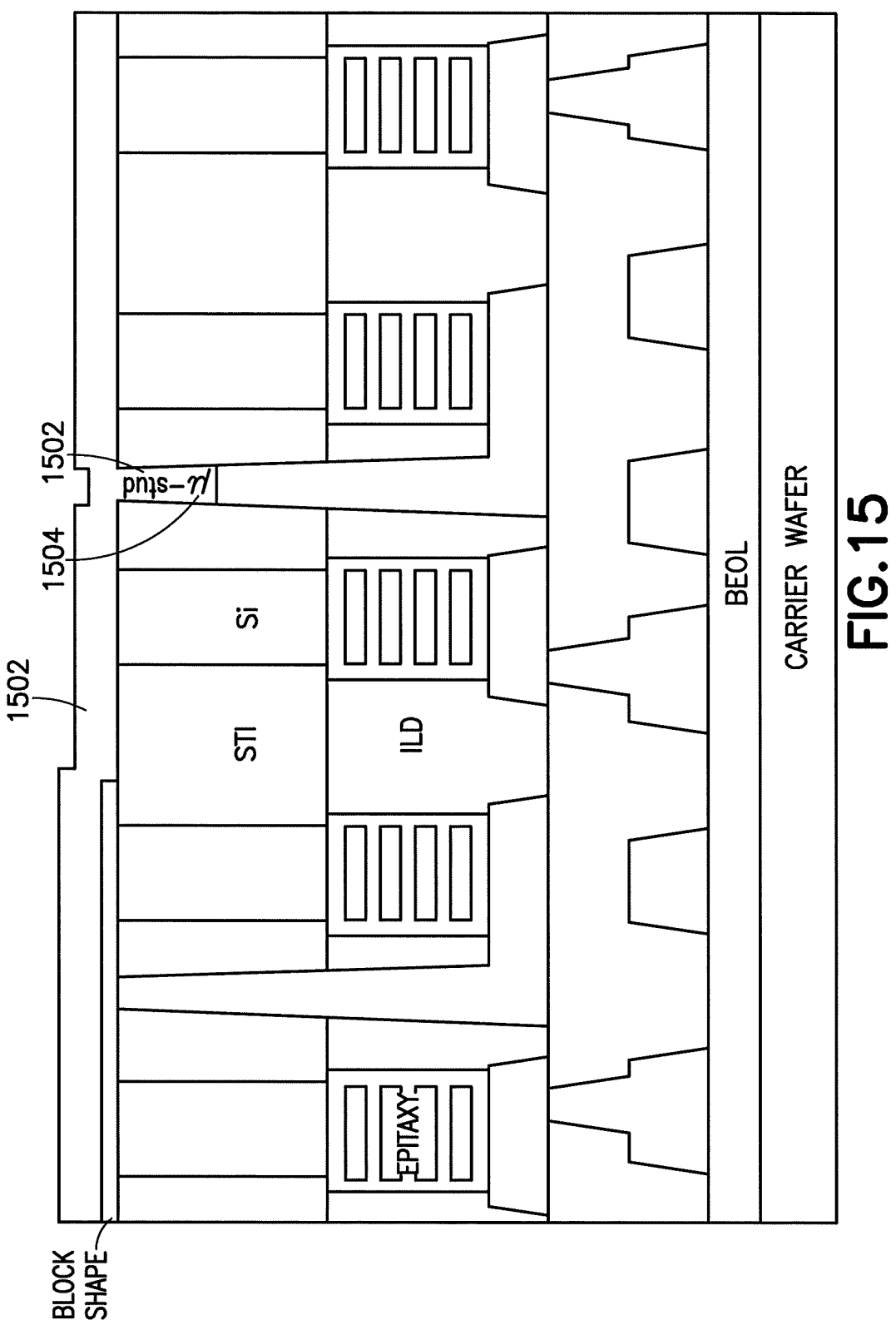
FIG. 15 depicts filling the backside via recess with one or more non-magnetic material/materials.

FIG. 15 depicts filling the via recess 1402 with non-magnetic material/materials (titanium (Ti), titanium nitride (TiN), titanium alloy (Ta), titanium aluminum nitride (TaN), etc.) 1502. The non-magnetic material or materials 1502 are also fabricated on the wet-strippable patterned block shape 1404, the STI layer 402 and the silicon layer 206. The non-magnetic material or materials 1502 within recess 1402 forms μ-stud 1504.

Figure 16:
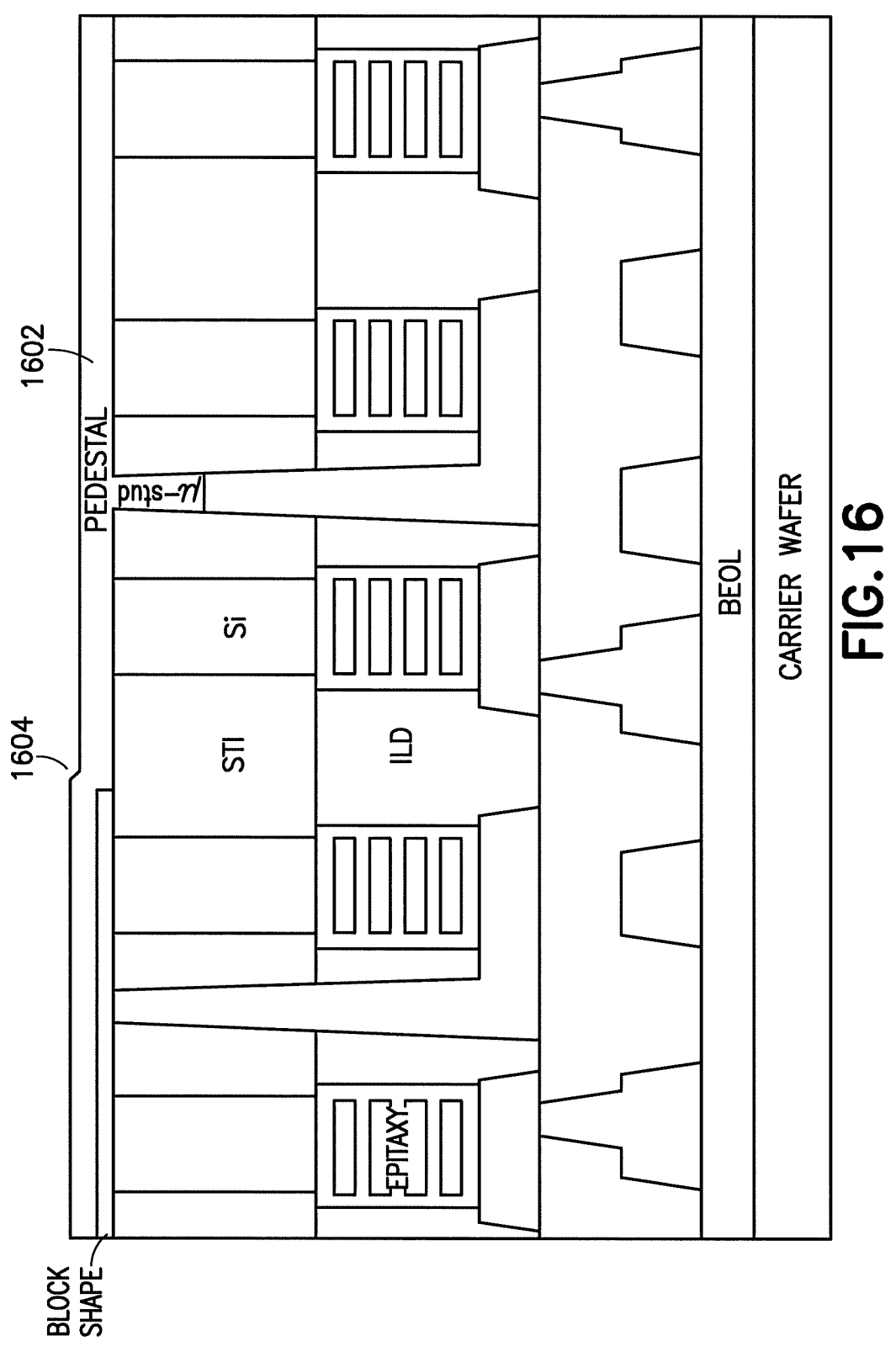
FIG. 16 depicts application of CMP pedestal material.

FIG. 16 depicts application of CMP pedestal material 1602 to ensure a smooth surface incoming to the MTJ deposition. This embodiment does not require the pedestal 2316 to be coplanar above the block shape (refer e.g. to item 1604). The embodiment without the recessed via contact 601 as shown in FIG. 13 would look similar, but without μ-stud 1504 formed with the non-magnetic material or materials 1502.

Figure 17:
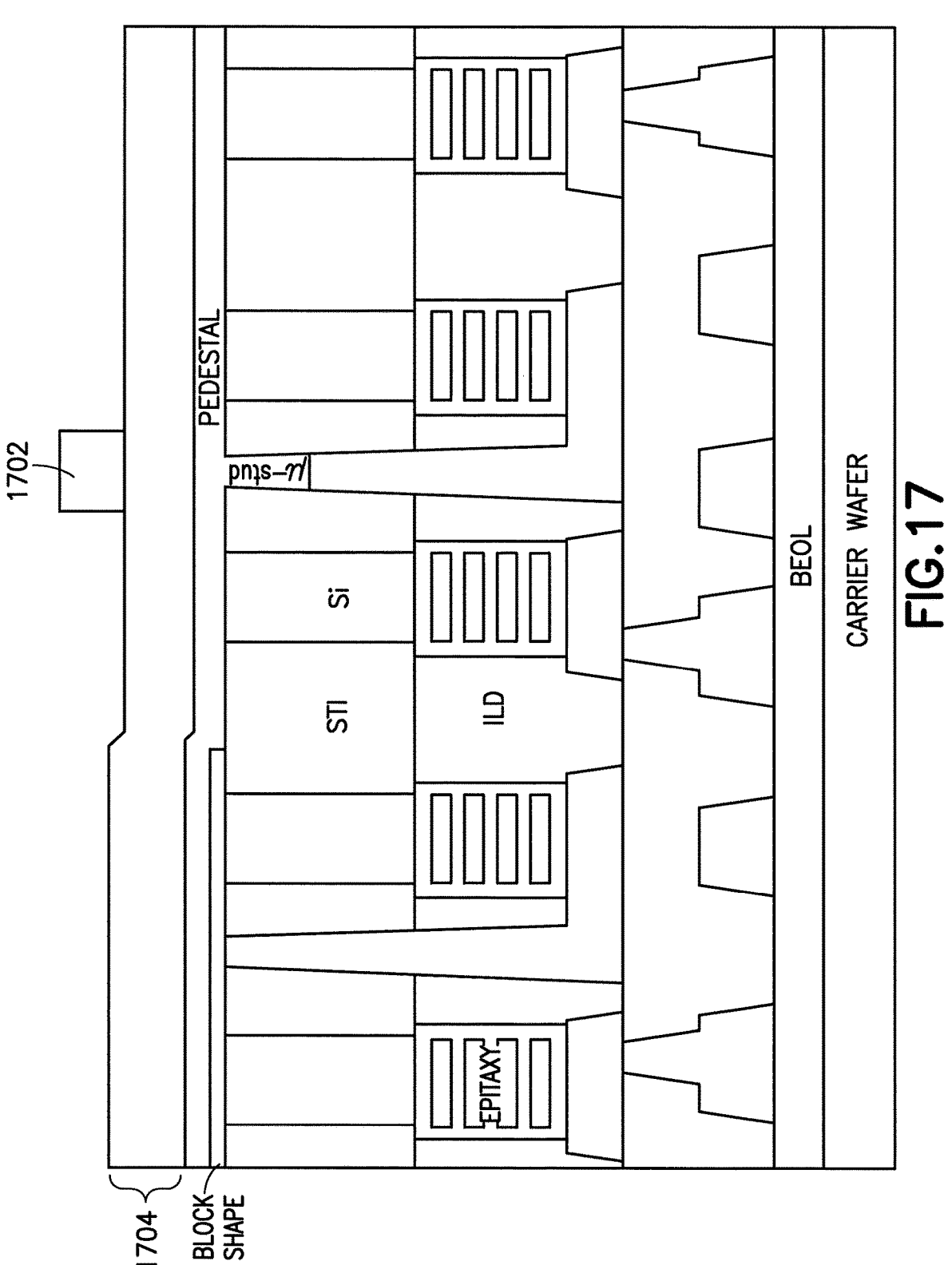
FIG. 17 depicts depositing a hardmask.

FIG. 17 depicts depositing a hardmask 1702, such as a pattern hard mask, and fabrication of an RIE layer 1704 above the pedestal layer 1602.

Figure 18:
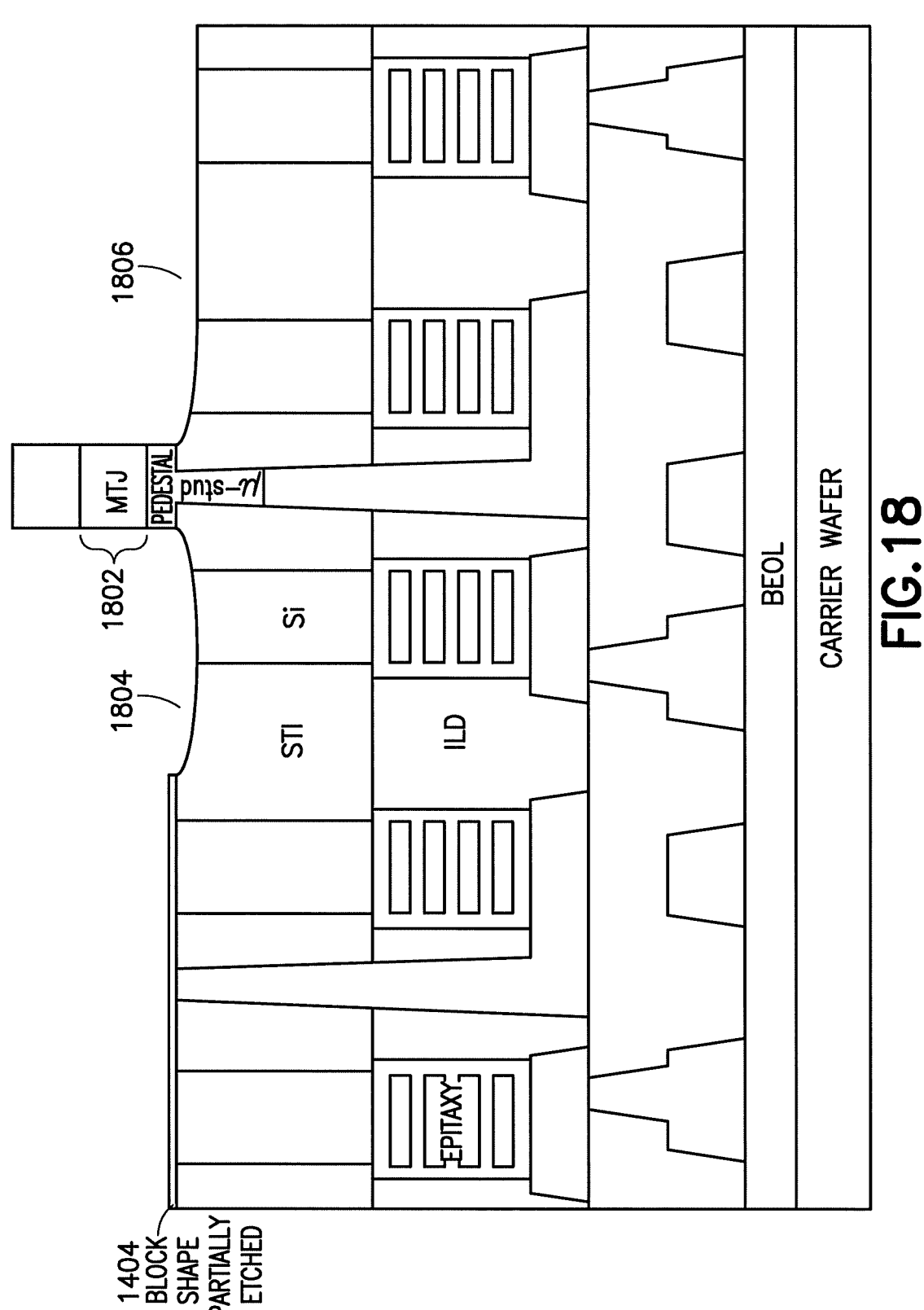
FIG. 18 depicts MTJ patterning.

FIG. 18 depicts patterning (IBE) to form MTJ 1802. The partially etched block shape 1404 prevents etching into the via (e.g. 602), STI 402, and silicon 206 where desired. As shown in FIG. 18, there are two etches (1804, 1806) created in the STI 402 and the silicon 206.

Figure 19:
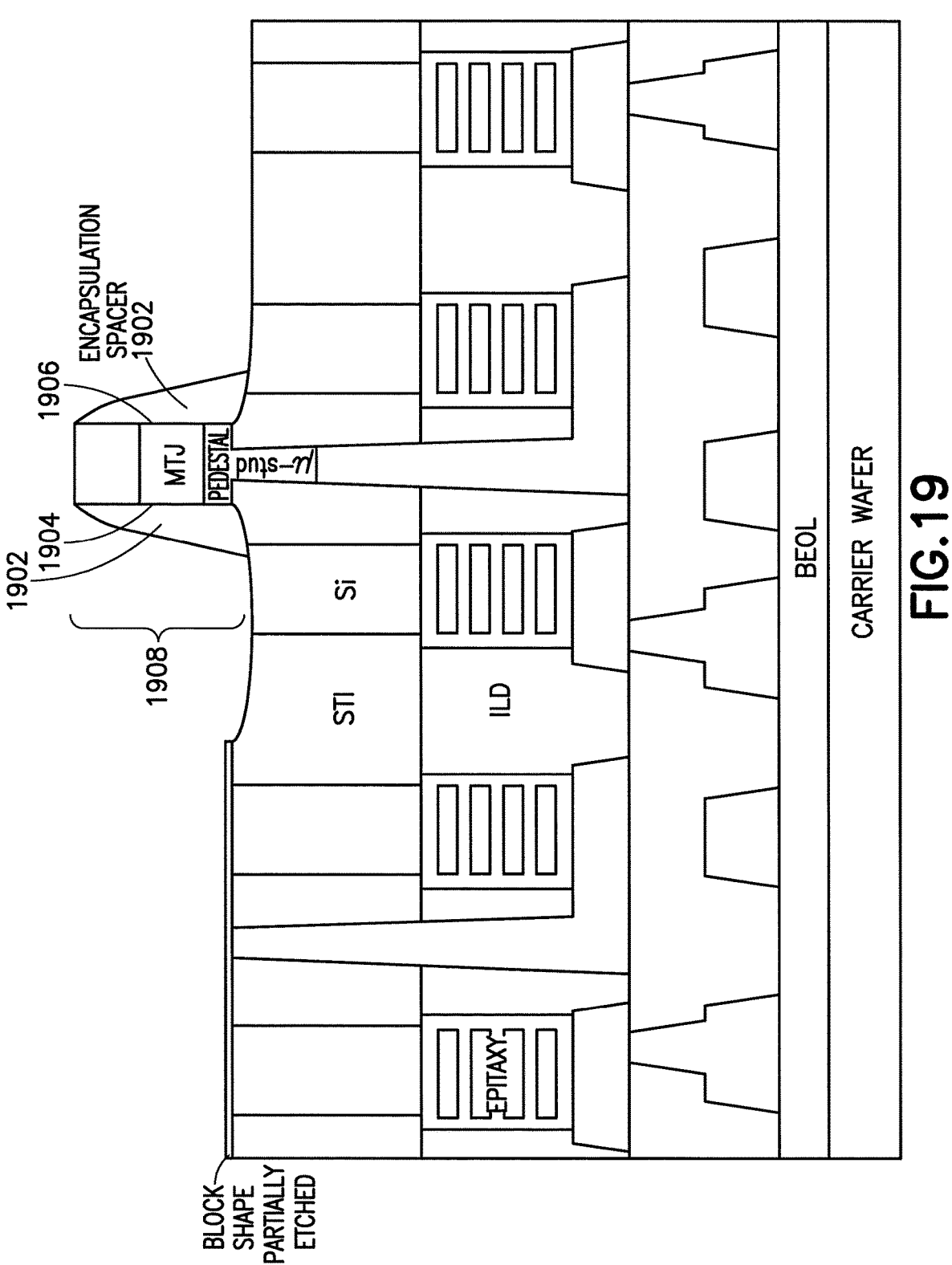
FIG. 19 depicts encapsulation/etchback to protect the MTJ sidewall and to expose the block shape.

FIG. 19 depicts encapsulation/etchback to protect MTJ sidewall (1904, 1906) and to expose the block shape 1404. Encapsulation spacer 1902 protects the sidewalls (1904, 1906) of the MTJ 1802. The MRAM 1908 is formed.

Figure 20:
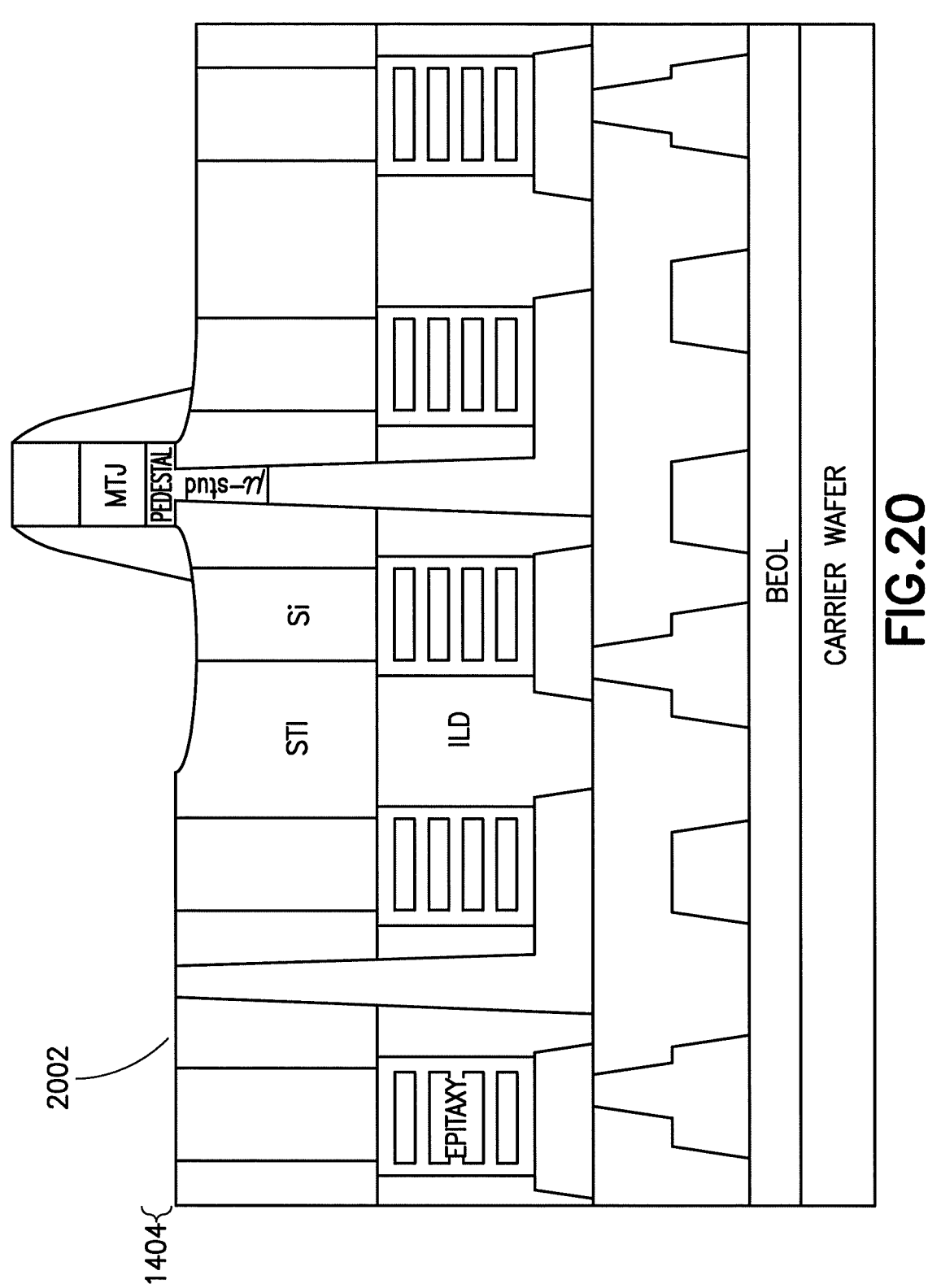
FIG. 20 depicts selectively stripping the strip block shape.
Figure 21:
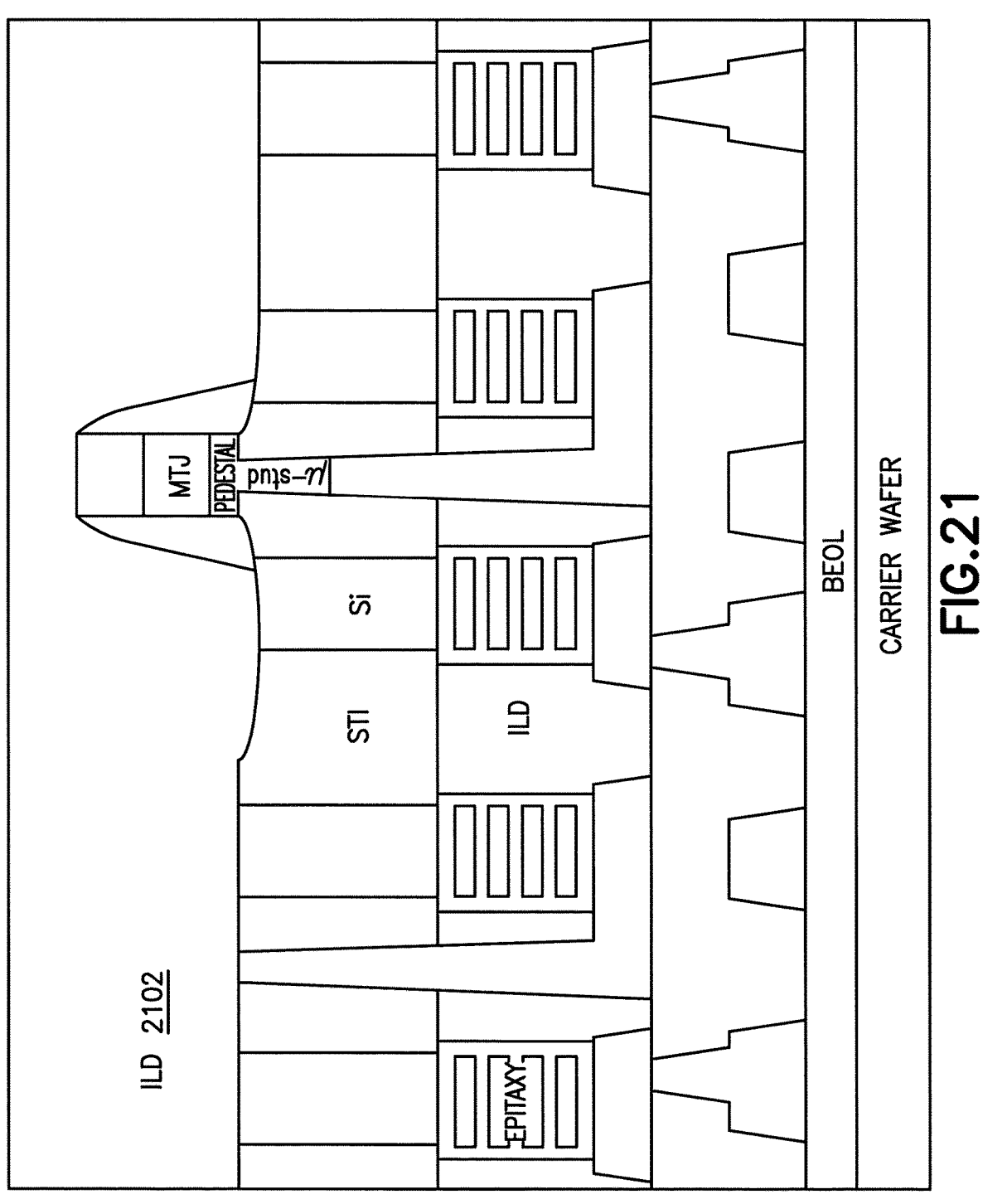
FIG. 21 depicts fill with ILD, followed by CMP.
Figure 22:
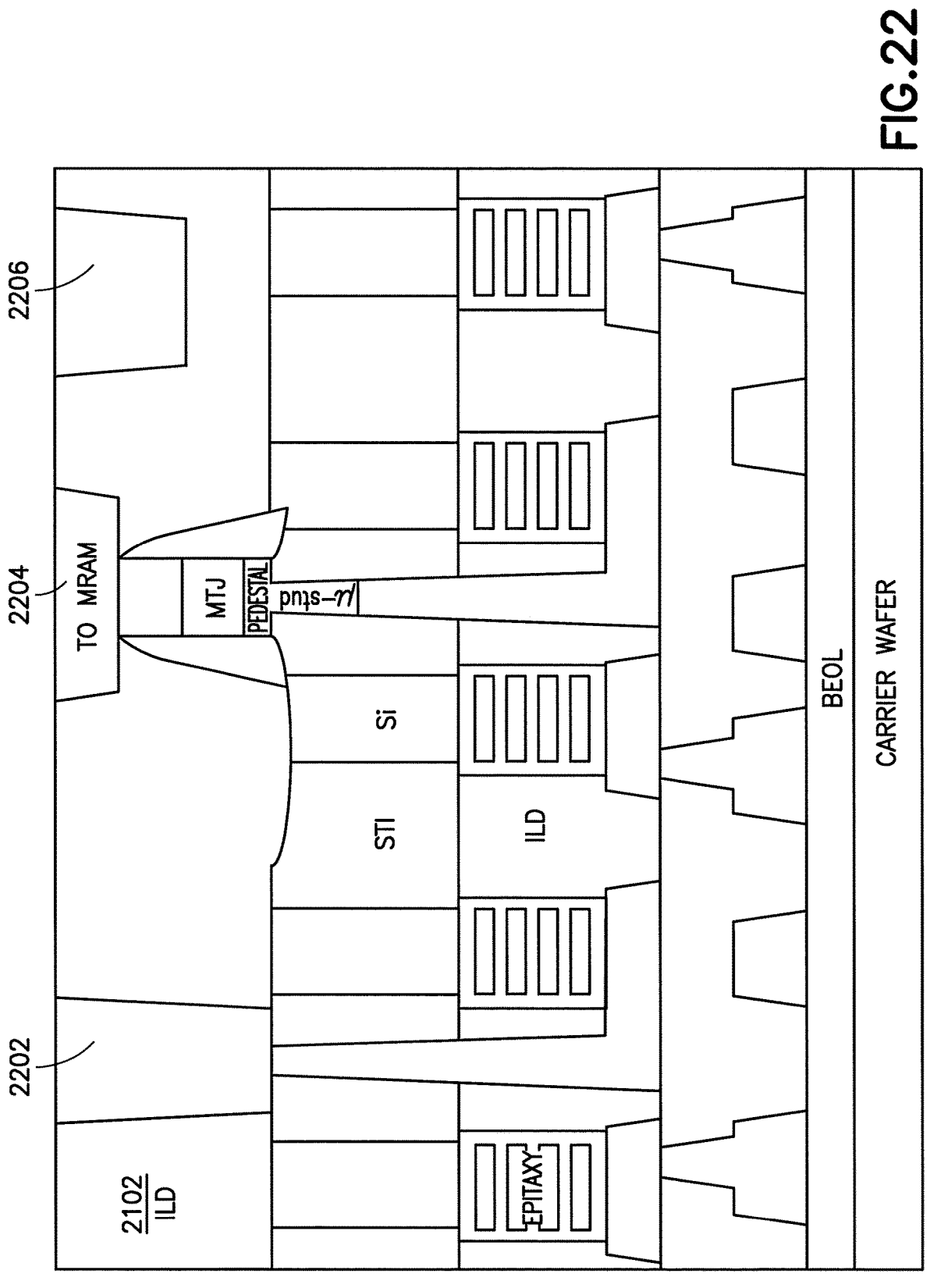
FIG. 22 depicts a backside ILD filling, followed by buried power rail patterning and metallization.

FIG. 20 depicts selectively etching (2002) the block shape 1404 without etching STI 402, silicon 206, at least a portion of SiN encapsulation 1404, and via metal 602. FIG. 21 depicts fill with ILD 2102, followed by CMP. FIG. 22 depicts a backside ILD fill (2102), followed by buried power rail patterning and metallization (2202, 2204, 2206). The spacer 1902 around the MTJ 1802 may be silicoboron carbonitride (SiBCN), silicon oxycarbonitride (SiOCN), silicon boron nitride (SiBN), silicon-oxynitride (SiON), or other high quality silicon nitride (SiN) material, to which the SiN block 1404 may be etched selectively. The block shape 1404 is sacrificial SiN that is wet removable (e.g. silicon carbon nitride (SiCNH) or silicon imidonitride (SiNH) hydrogen). Wet removal is with diluted HF.

Figure 23:
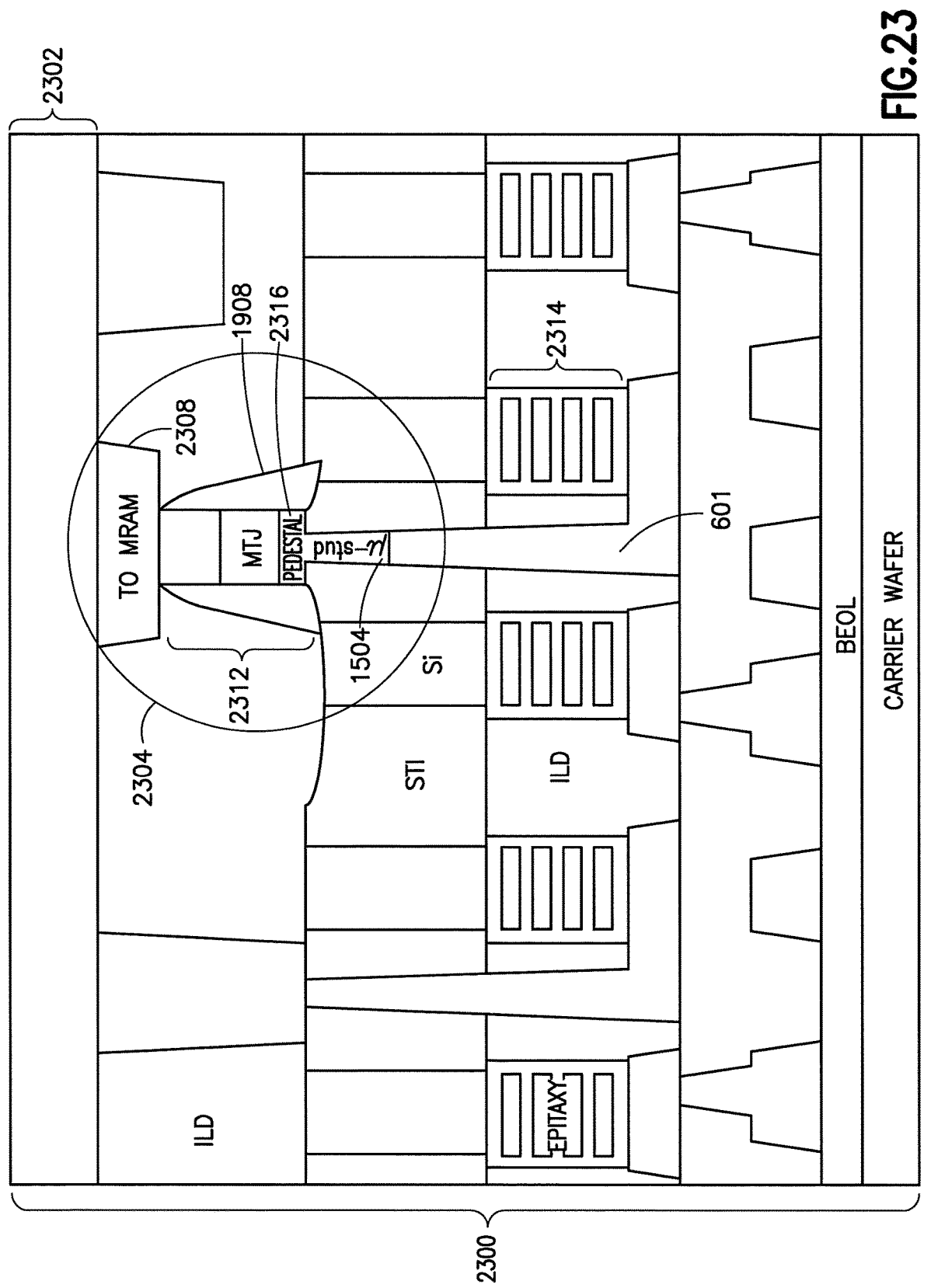
FIG. 23 depicts an MRAM backside power distribution network.

FIG. 23 depicts the MRAM backside power distribution network 2300, including the backside power distribution network 2302 and the MRAM 2304. The MRAM backside power distribution network 2300 may be referred to as an MRAM buried power rail, and embedded MRAM buried power rail, or a memory buried power rail. The buried power rail 2308 is coupled to a via comprising via 601, μ-stud 1504, and pillar via 2312 comprising MRAM 1908. The buried power rail 2308 is also coupled to backside power distribution network 2302. The via 601 and μ-stud 1504 couple the transistor 2314 to the MRAM 1908. Pedestal 2316 is formed from pedestal material/layer 1602).

Also described herein is MRAM integration with a self-aligned backside contact. There is great interest to form the MRAM close to the S/D to increase speed. Backside direct contact offers great opportunity to move the MRAM very close to the device. However, there is a great risk of back sputtering of backside contact metal to degrade MRAM yield.

In an embodiment, a method of forming a semiconductor device comprises forming a deeper sacrificial placeholder under the S/D of MRAM transistors than that of a logic transistor, flipping the wafer after MOL/BEOL fabrication, removing a sacrificial placeholder in an MRAM region first, forming a backside contact and a bottom electrode for an MRAM in the empty placeholder region, depositing and patterning an MRAM stack, removing a sacrificial placeholder in a logic region, and forming a backside contact and backside interconnect. This method provides a promising solution for MRAM integration with a self-aligned backside contact.

Further described herein is a semiconductor device comprising an MRAM formed at a backside of a wafer, where a bottom electrode of the MRAM directly connects to a backside contact of a transistor. The backside contact is substantially aligned with the bottom electrode of the MRAM. The backside contact is substantially aligned with the S/D of the transistor. The backside contact is isolated from the gate metal by BDI and an inner spacer. A backside contact also exist for the transistors in a logic region, where the backside contact in the logic region has an upper surface lower than a lower surface of an MRAM spacer.

Figure 24:
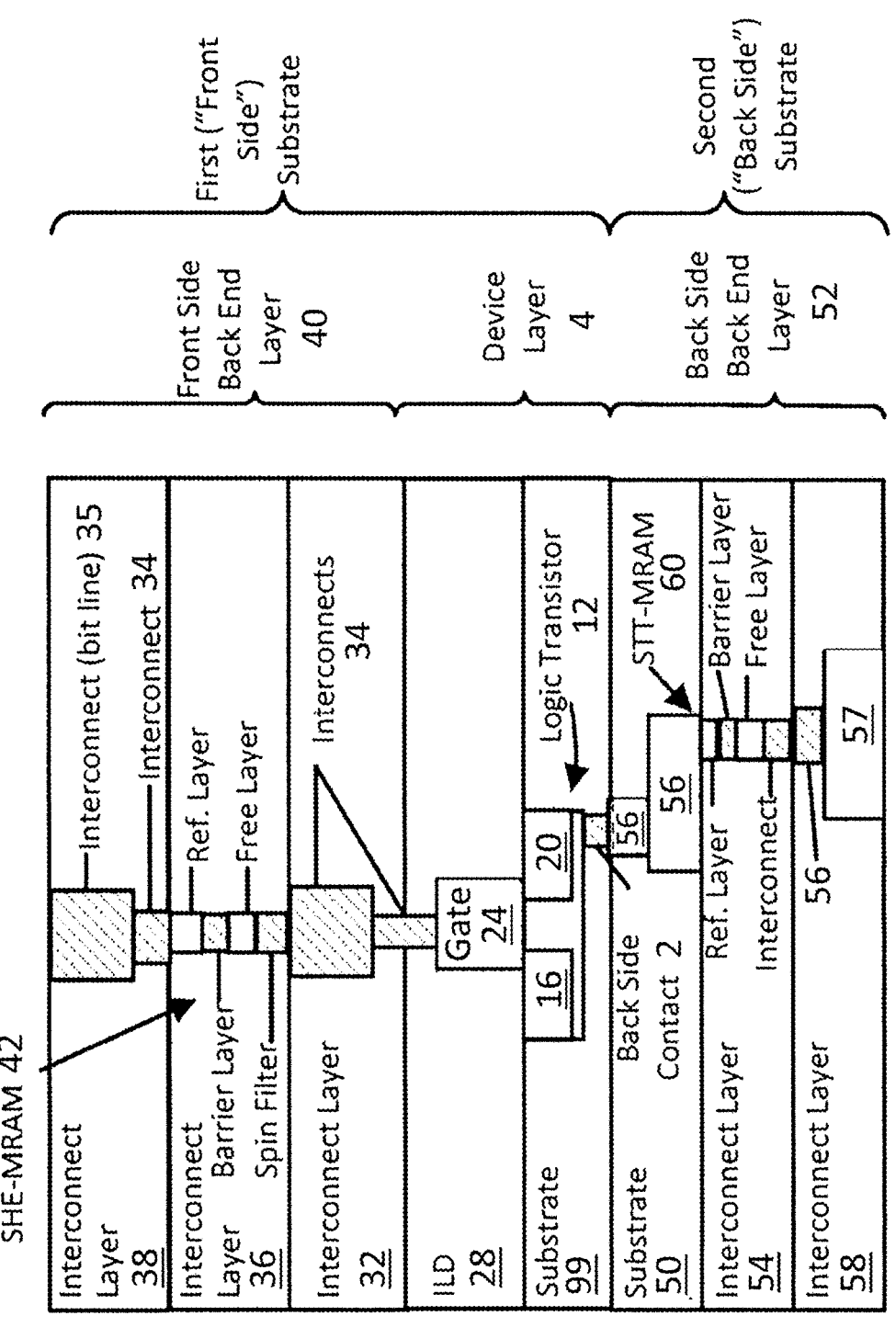
FIG. 24 depicts a semiconductor device.

FIG. 24 depicts a semiconductor device. FIG. 24 provides a renumbering of FIG. 3C of U.S. Pat. No. 10,916,583 B2. The first ("front side") substrate includes front side back end layer 40 and device layer 4. The second ("back side") substrate includes the back side back end layer 52. Front side back end layer 40 includes interconnect layer 38, interconnect layer 36, and interconnect layer 32. Device layer 4 includes ILD 28 and substrate 99. Back side back end layer 52 includes substrate 50, interconnect layer 54, and interconnect layer 58.

Interconnect layer 38 includes interconnect (bit line) 35 and interconnect 34 which connects to the reference layer of interconnect layer 36. Interconnect layer 36 includes SHE-MRAM 42, which SHE-MRAM 42 includes a reference layer, a barrier layer, a free layer, and a spin filter. The spin filter of the interconnect layer 36 is joined to interconnect 34 of the interconnect layer 32. An interconnect 34 is shared with the interconnect layer 32 and ILD 28, and is joined to gate 24 of ILD 28. Gate 24 of ILD 28 is joined to logic transistor 12 of substrate 99, which logic transistor 12 includes source 16 and drain 20.

Figures 1, 44:
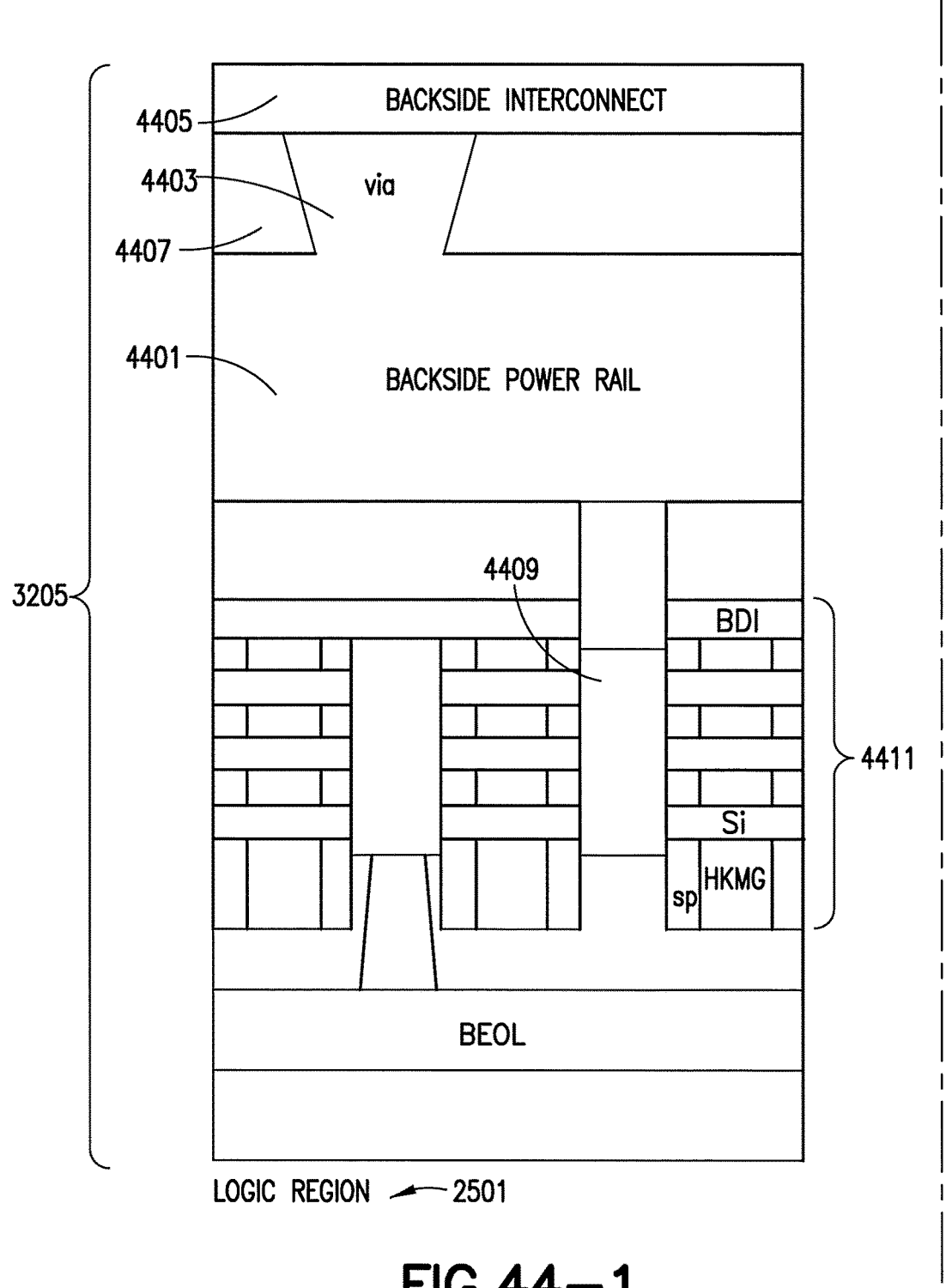
FIG. 44 depicts formation of a backside rail and backside interconnect formation.
Figures 2, 44:
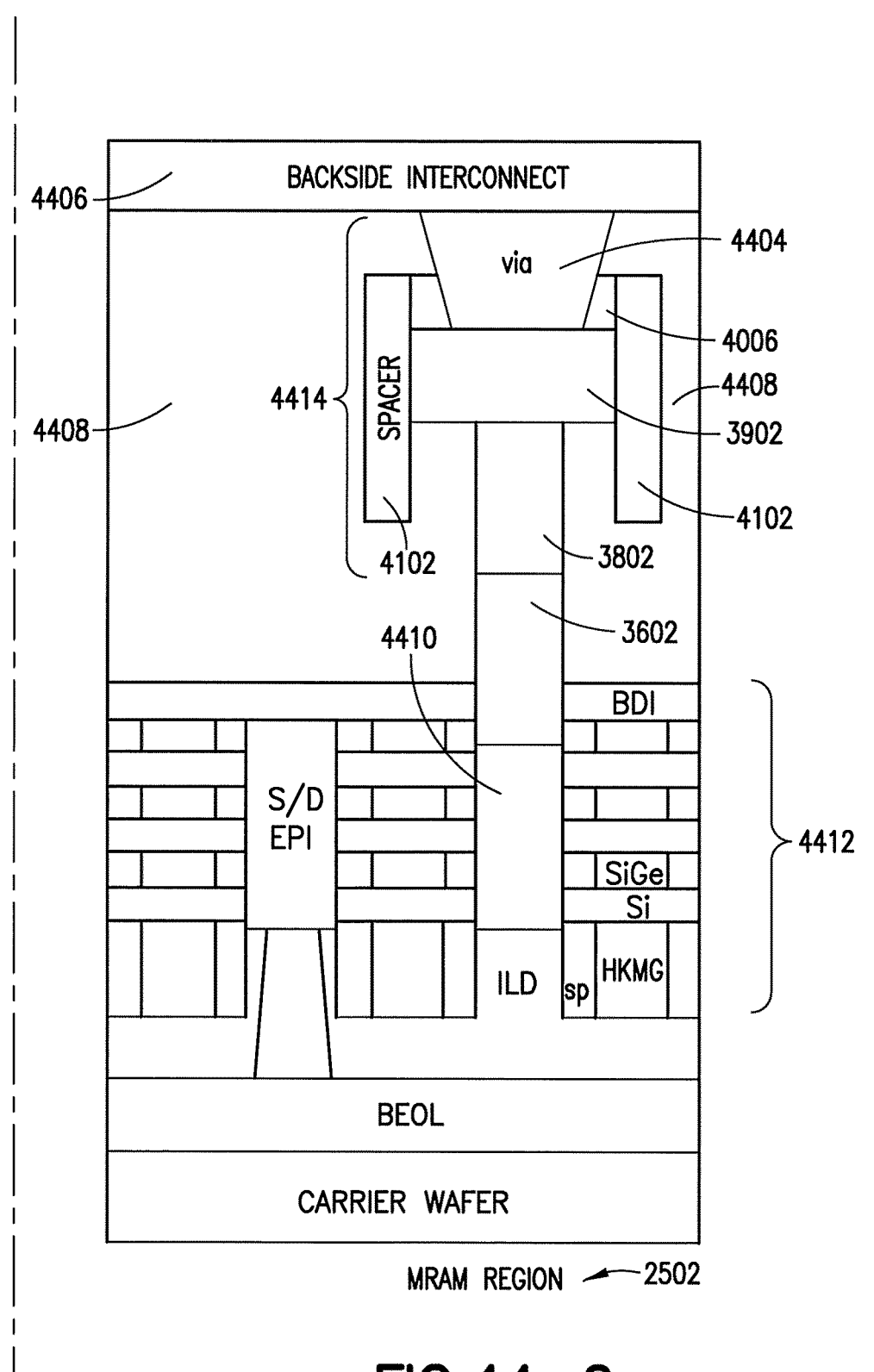

Back side contact 2 of substrate 99 contacts the logic transistor 12, and is coupled to interconnects 56 of the substrate 50. The STT-MRAM device 60 of interconnect layer 54 includes a reference layer, a barrier layer, and a free layer. The interconnect of the interconnect layer 54 is joined to interconnect 56 of interconnect layer 58 which also includes interconnect bit line 57. In FIG. 24, the MRAM device 60 is not directly connected to backside contact 2. FIG. 24 is in contrast to the semiconductor device shown in FIG. 44, where the semiconductor device shown in FIG. 44 is the result of the semiconductor manufacturing method described herein. FIG. 44 shows that the MRAM device 4414 is directly connected to backside contact 3602.

Figure 25:
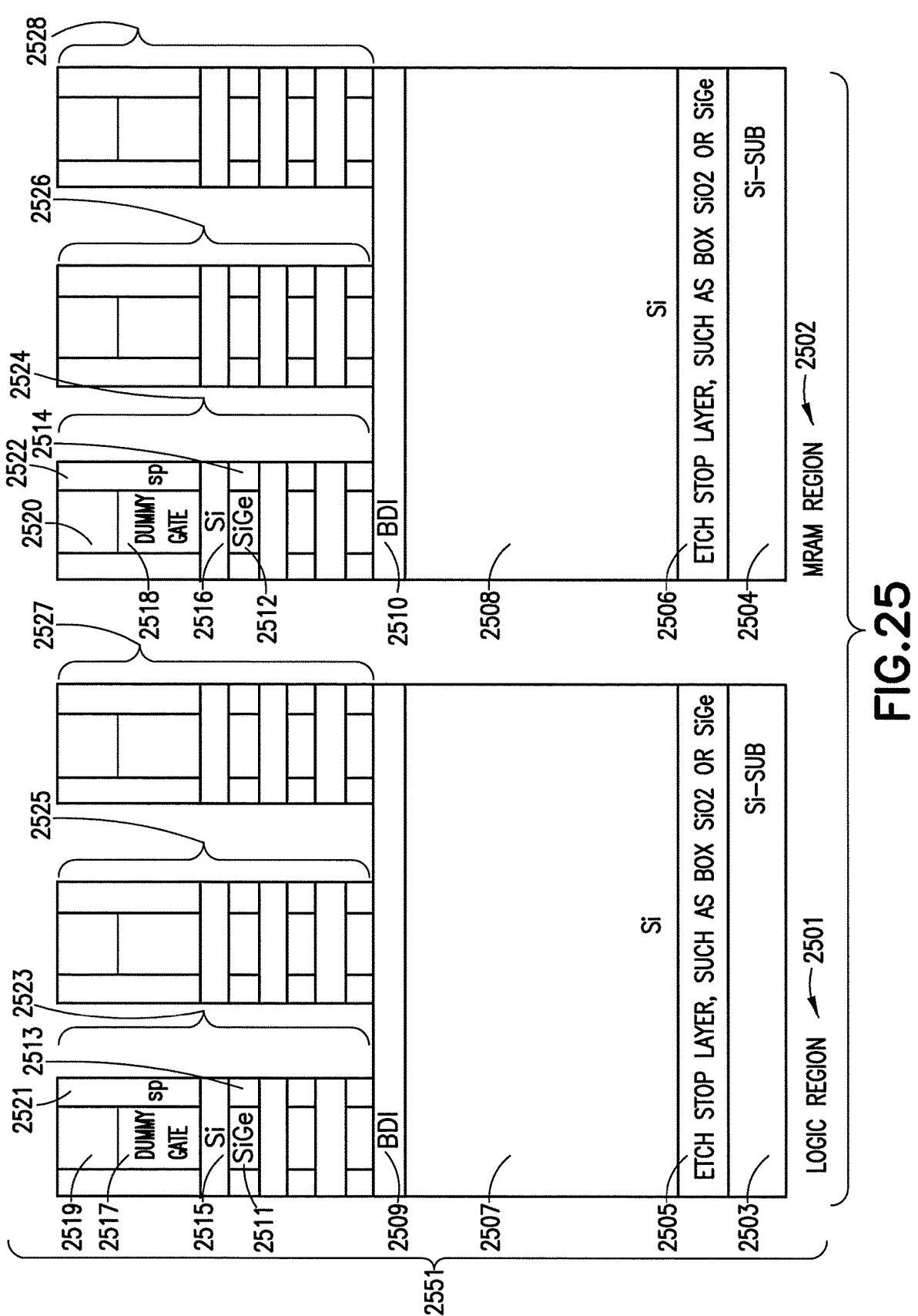
FIG. 25 depicts a logic region and an MRAM region after nanosheet stack patterning, STI formation, gate patterning, BDI/spacer formation, nanosheet recessing, and inner spacer formation.

FIG. 25 depicts a logic region 2501 of a wafer 2551 and an MRAM region 2502 of a wafer 2551 after nanosheet stack patterning, STI formation, gate patterning, BDI/spacer formation, nanosheet recessing, and inner space formation. The logic region 2501 includes silicon substrate 2503, and etch stop layer 2505 (such as BOX, SiO2 or SiGe), and a silicon layer 2507. The logic region 2501 further includes BDI layer 2509, silicon layer 2515 to join the dummy gate 2517 to SiGe 2511, which SiGe is included within inner spacer 2513. Spacer 2521 encapsulates dummy gate 2517 and hard mask 2519. Structures 2525 and 2527 are constructed similarly to structure 2523 comprising SiGe 2511, inner spacer 2513, Si 2515, dummy gate 2517, hard mask 2519, and spacer 2521 (i.e. comprises similar components).

The MRAM region 2502 includes silicon substrate 2504, etch stop layer 2506 (such as BOX, SiO2 or SiGe), and a silicon layer 2508. The MRAM region 2502 further includes BDI layer 2510, silicon layer 2516 to join the dummy gate 2518 to SiGe 2512, which SiGe is included within inner spacer 2514. Spacer 2522 encapsulates dummy gate 2518 and hard mask 2520. Structures 2526 and 2528 are constructed similarly to structure 2524 comprising SiGe 2512, inner spacer 2514, Si 2516, dummy gate 2518, hard mask 2520, and spacer 2522 (i.e. comprises similar components).

Figure 26:
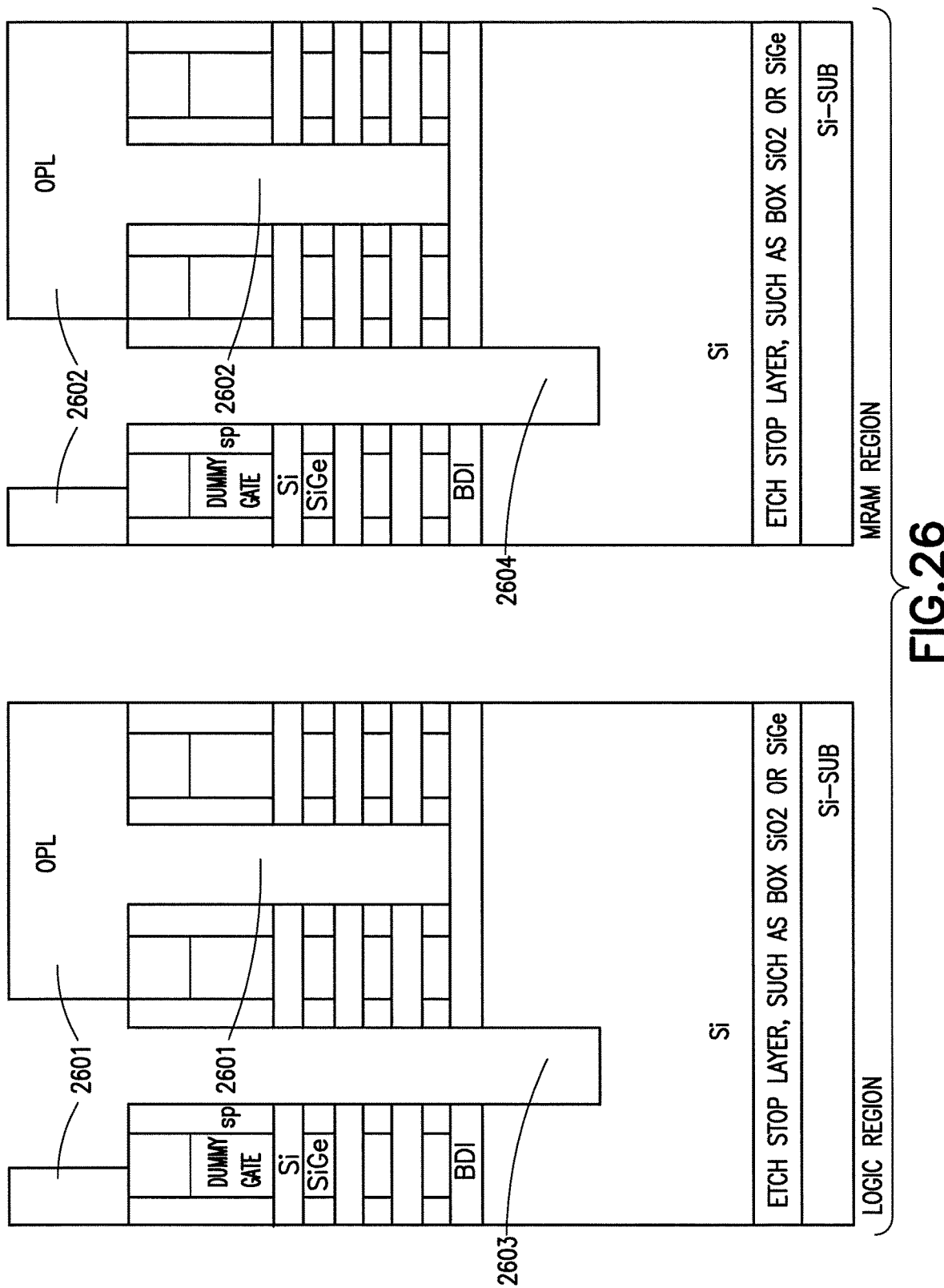
FIG. 26 depicts placeholder patterning.

FIG. 26 depicts placeholder patterning, including application of OPL layer 2601 within the logic region 2501 and OPL layer 2602 within the MRAM region 2502, and etching of placeholder region 2603 within the BDI layer 2509 and in some instances the silicon layer 2507 of logic region 2501 and etching of placeholder region 2604 within the BDI layer 2510 and in some instances the silicon layer 2508 of MRAM region 2502.

Figure 27:
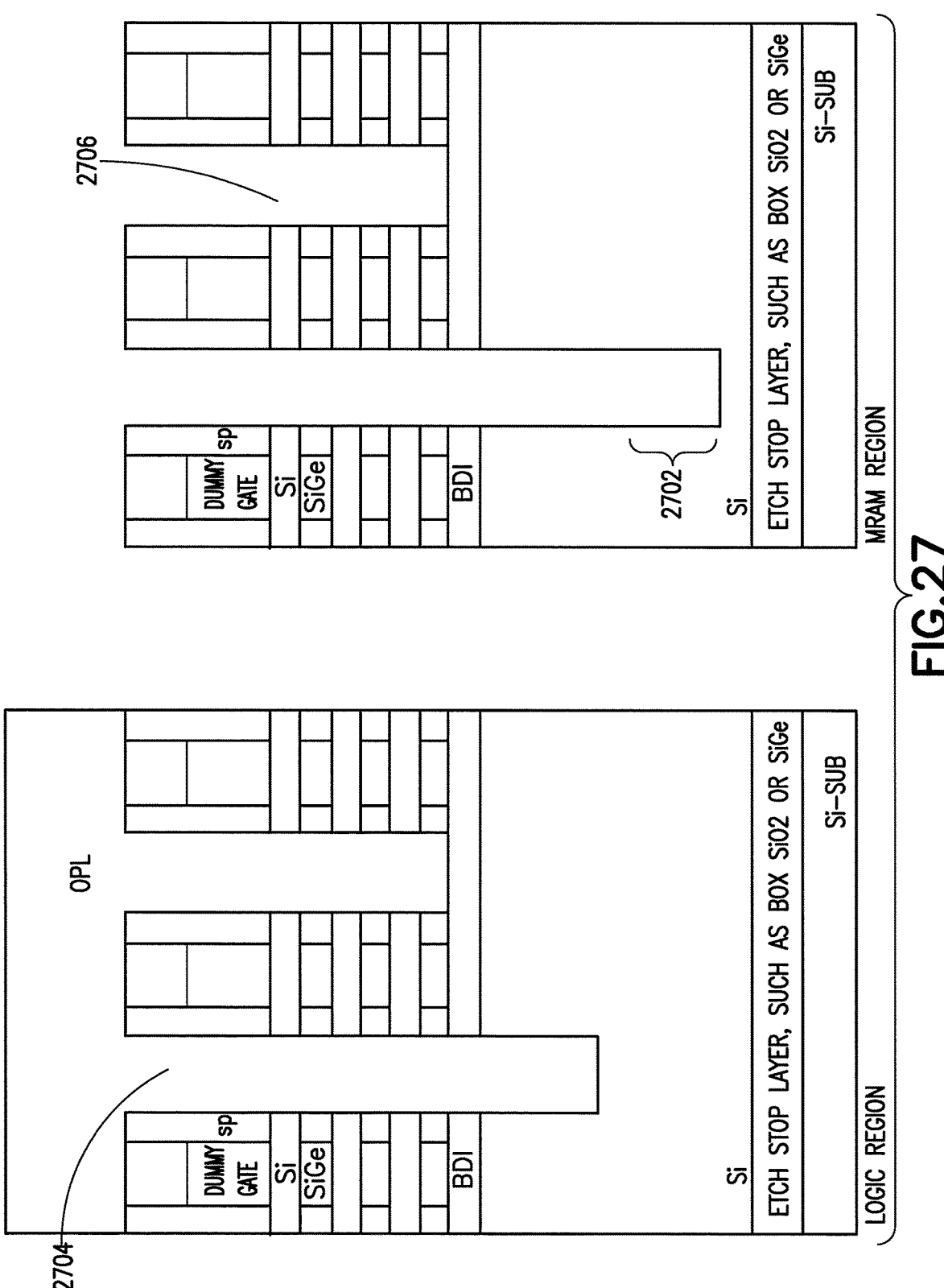
FIG. 27 depicts using a block mask to open an MRAM region to increase placeholder depth.

FIG. 27 depicts using a block mask to open the MRAM region 2502 to increase placeholder depth of the region 2604. The depth of the placeholder region 2604 for the MRAM is increased by an amount shown approximately by item 2702. Also shown in FIG. 27 is application of OPL layer 2704 within placeholder region 2603 of the logic region 2501 and between structures 2523 and 2525. Also shown in FIG. 27 is removal of OPL to generate placeholder region 2706 within the MRAM region 2502.

Figure 28:
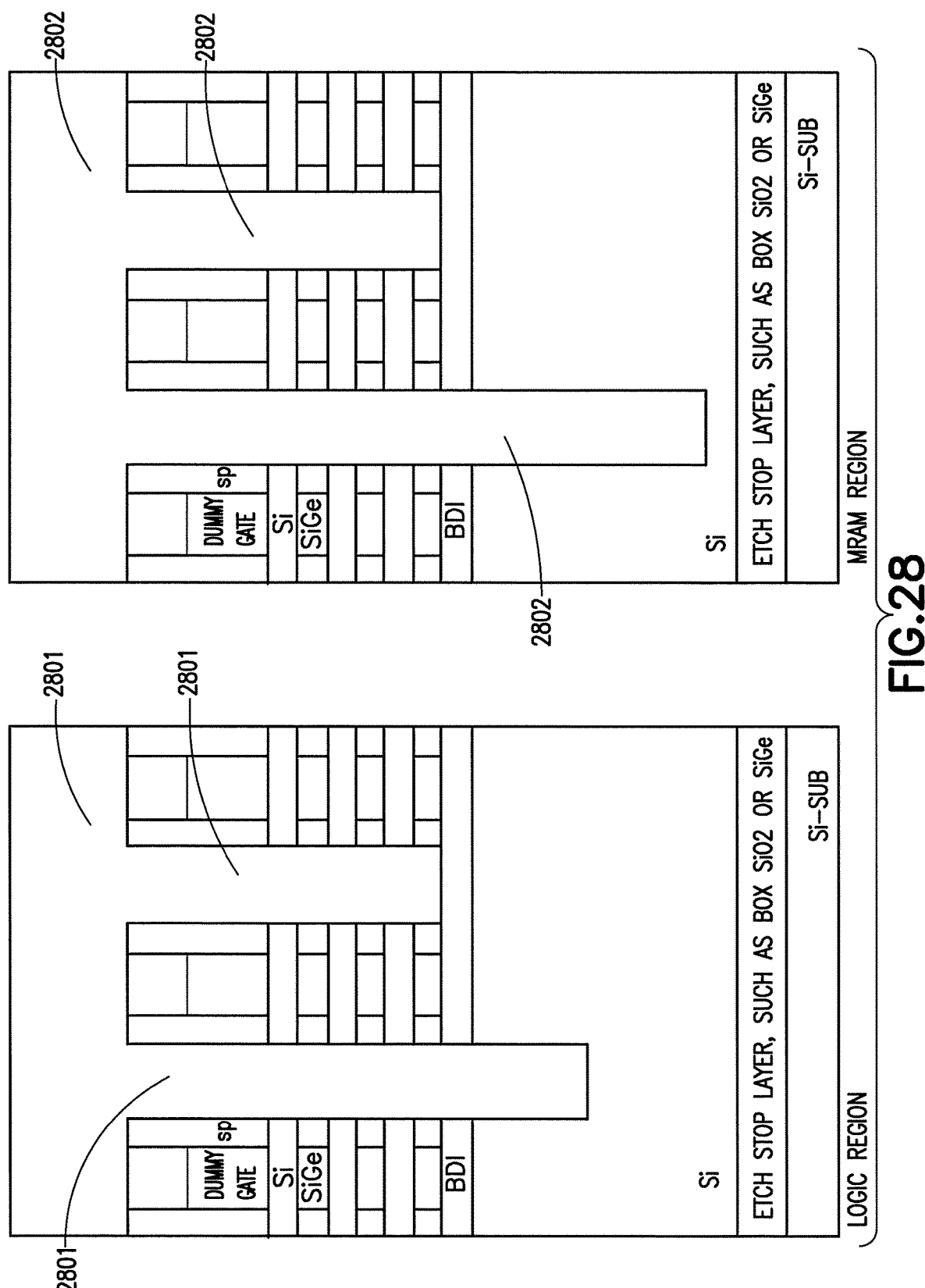
FIG. 28 depicts placeholder material fill.

FIG. 28 depicts placeholder material fill (e.g. titanium oxide (TiOx), or Aluminium oxide (AlOx)). Placeholder fill 2801 is applied in logic region 2501, and placeholder fill 2802 is applied in MRAM region 2502.

Figure 29:
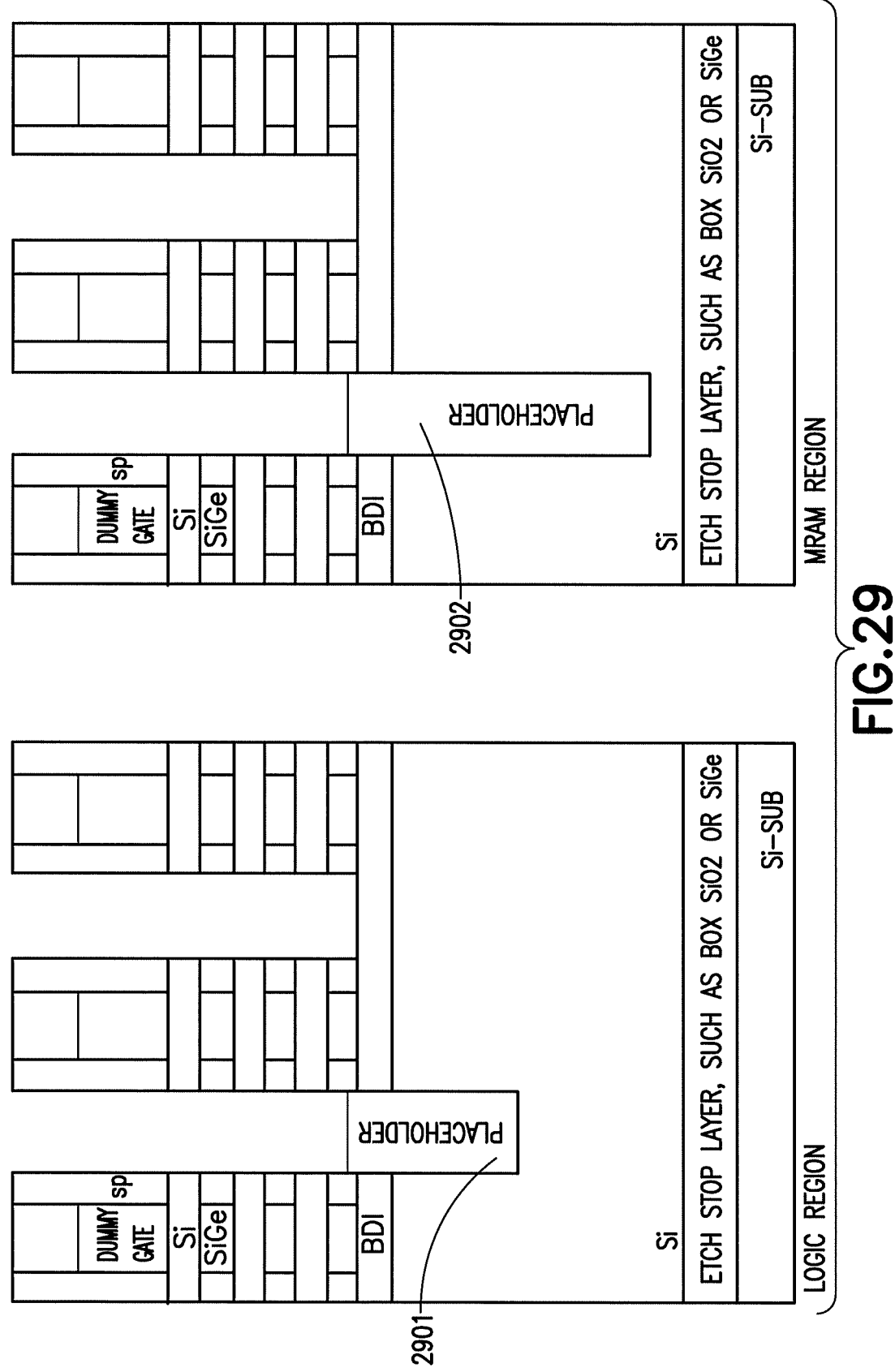
FIG. 29 depicts fabrication of a placeholder material recess.

FIG. 29 depicts fabrication of a placeholder material recess, removing a portion of the placeholder fill 2801 and generating placeholder 2901, and removing a portion of the placeholder fill 2802 and generating placeholder 2902.

Figure 30:
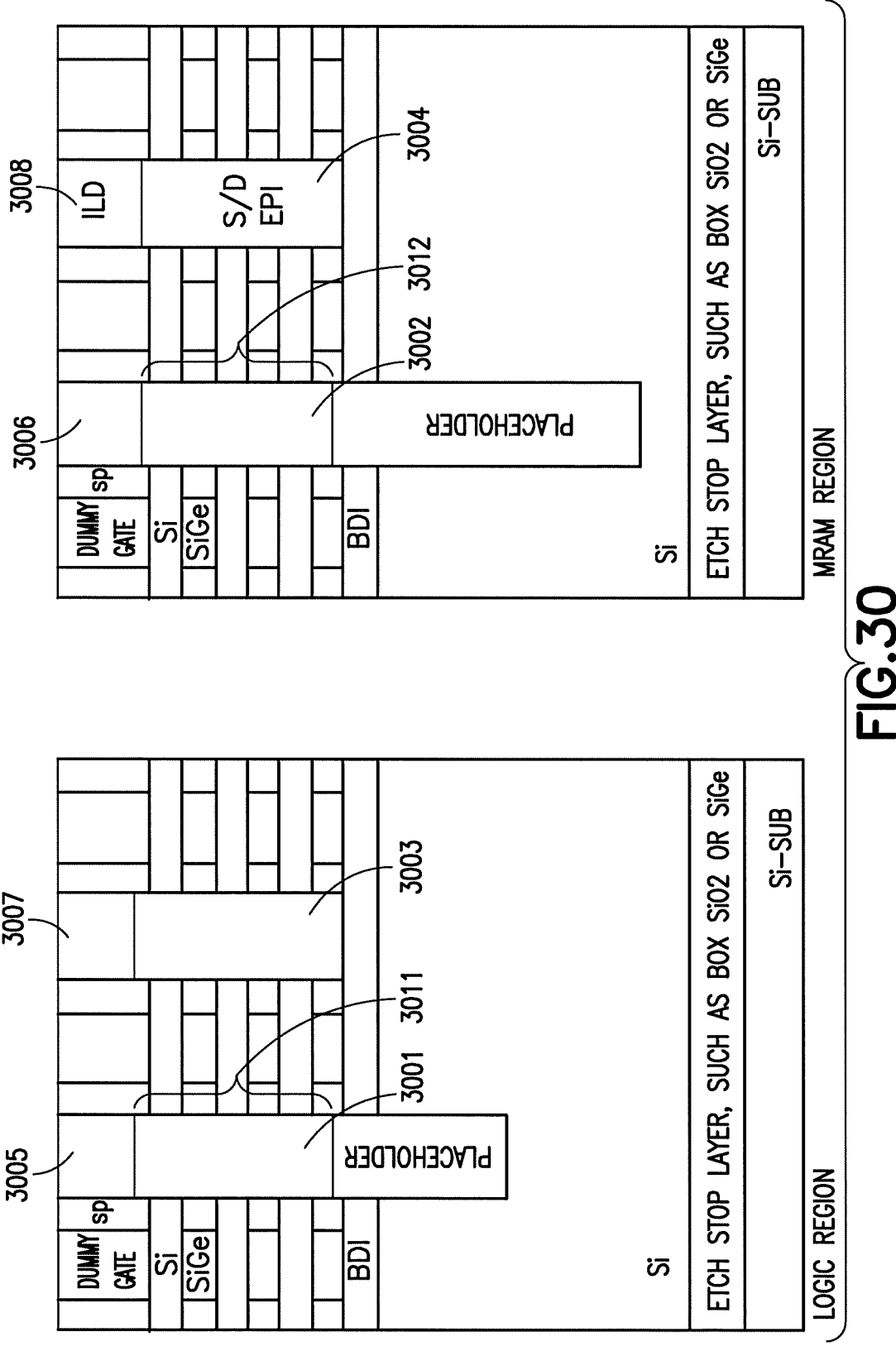
FIG. 30 depicts Source/Drain epitaxy formation, ILD deposition and CMP.

FIG. 30 depicts S/D epitaxy formation, ILD deposition and CMP. S/D epitaxy 3001 and S/D epitaxy 3003 are formed within logic region 2501, and S/D epitaxy 3002 and S/D epitaxy 3004 are formed within MRAM region 2502. S/D epitaxy 3001 is formed within S/D region 3011, and S/D epitaxy 3002 is formed within S/D region 3012. ILD 3005 is formed next to (e.g. above) S/D epitaxy 3001, ILD 3007 is formed next to (e.g. above) S/D epitaxy 3003, ILD 3006 is formed next to (e.g. above) S/D epitaxy 3002, and ILD 3008 is formed next to (e.g. above) S/D epitaxy 3004. Hardmask 2519 and hardmask 2520 are removed, as are the hard masks from structures 2525, 2527, 2526, and 2528.

Figure 31:
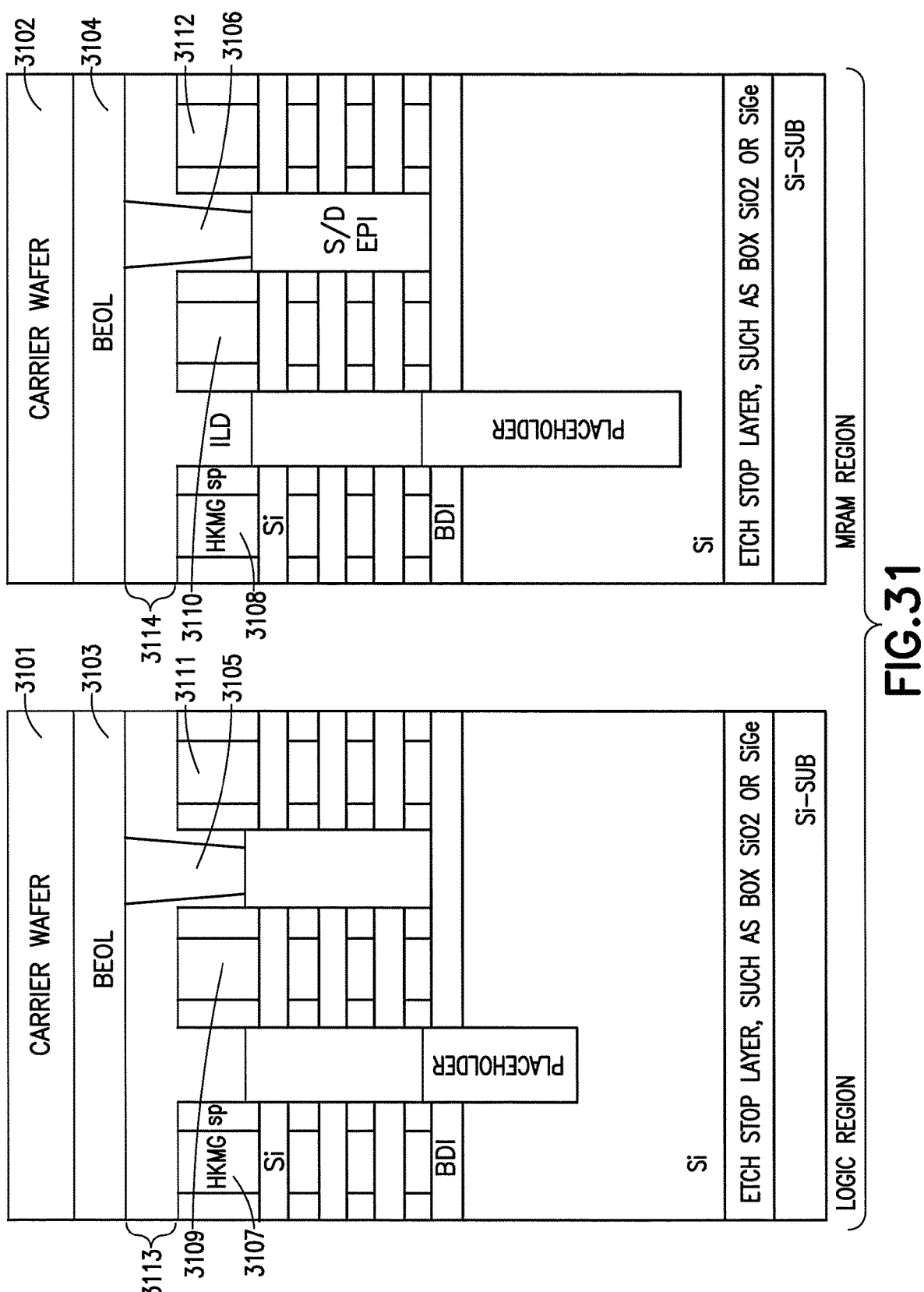
FIG. 31 depicts dummy gate removal, SiGe removal, replacement HKMG formation, MOL/BEOL interconnect formation, and carrier wafer bonding.

FIG. 31 depicts dummy gate removal, SiGe removal, replacement high-k/metal gate (HKMG) formation, MOL/BEOL interconnect formation, and carrier wafer bonding. In particular, dummy gate 2517 and dummy gate 2518 are removed, as are the dummy gates from structures 2525, 2527, 2526, and 2528. SiGe 2511 and SiGe 2512 are removed. HKMG 3107, HKMG 3109, HKMG 3111, HKMG 3108, HKMG 3110, and HKMG 3112 are formed to replace the removed dummy gates and SiGe. In the logic region 2501, BEOL 3103 is formed to bond the carrier wafer 3101 to additional ILD layer 3113 formed next to (e.g. above) HKMG 3107, HKMG 3109, and HKMG 3111. BEOL 3103 is also joined to contact 3105 which is joined to S/D epitaxy 3003. The source/drain contact 3105 is formed within ILD layer 3113 and ILD 3007. Similarly, in the MRAM region 2502, BEOL 3104 is formed to bond the carrier wafer 3102 to additional ILD layer 3114 formed next to (e.g. above) HKMG 3108, HKMG 3110, and HKMG 3112. BEOL 3104 is also joined to source/drain contact 3106 which is joined to S/D epitaxy 3004. The source/drain contact 3106 is formed within ILD layer 3114 and ILD 3008.

Figure 32:
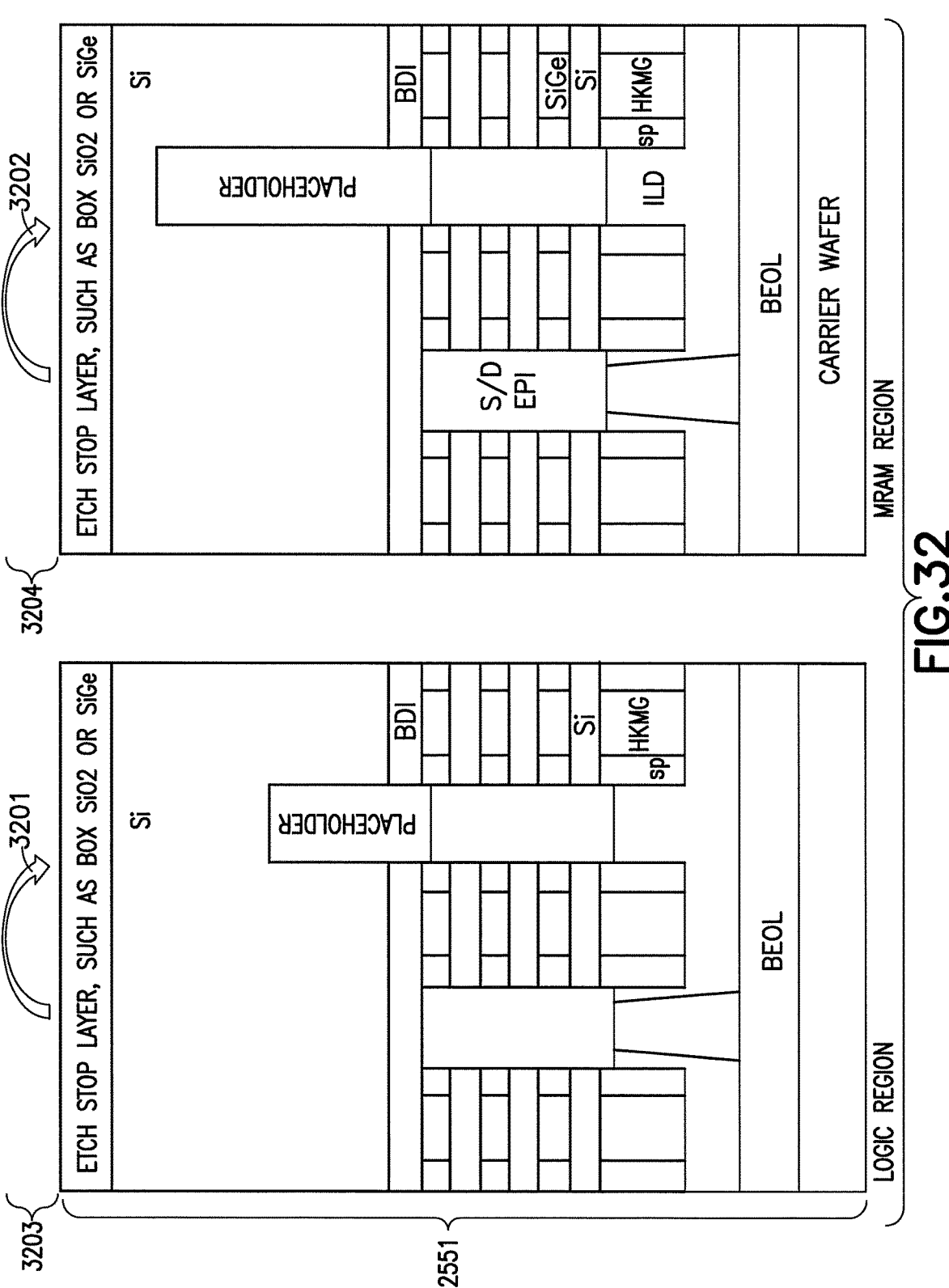
FIG. 32 depicts wafer flipping, substrate removal, and stopping on the etch stop layer.

FIG. 32 depicts wafer flipping, substrate removal, and stopping on the etch stop layer. The logic region wafer is flipped (3201) and the MRAM region wafer is flipped (3202), resulting in flipped wafer 2551. Silicon substrate 2503 is removed (depicted as item 3203) from the logic region 2501, and silicon substrate 2504 is removed (depicted as item 3204) from the MRAM region 2502.

Figure 33:
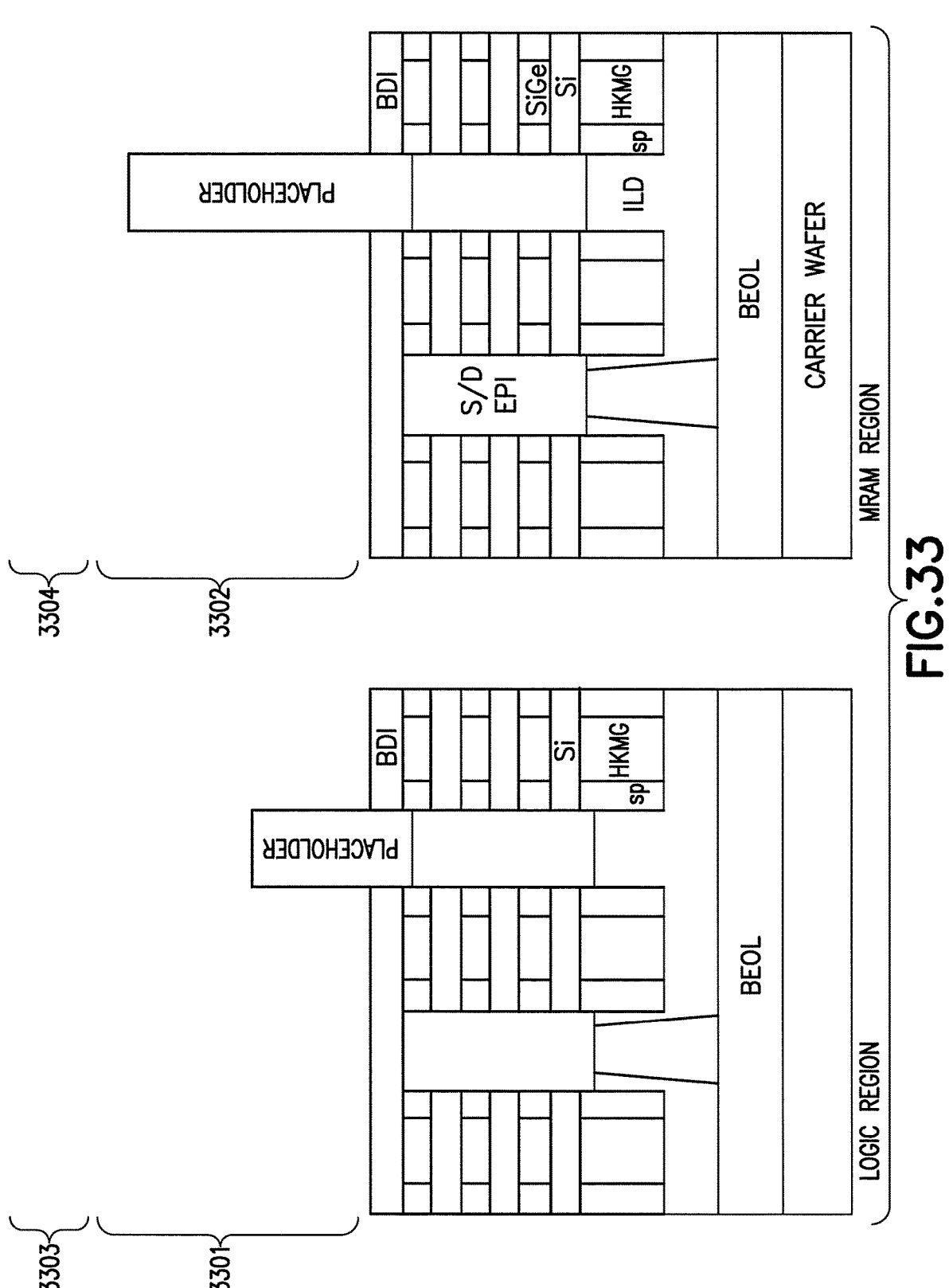
FIG. 33 depicts etch stop layer and Silicon removal.

FIG. 33 depicts etch stop layer and Si removal. In particular, the silicon layer 2507 is removed (depicted as item 3301) from the logic region 2501, and the silicon layer 2508 is removed (depicted as item 3302) from the MRAM region 2502. The etch stop layer 2505 is removed (depicted as item 3303) from the logic region 2501, and the etch stop layer 2506 is removed (depicted as item 3304) from the MRAM region 2502.

Figure 34:
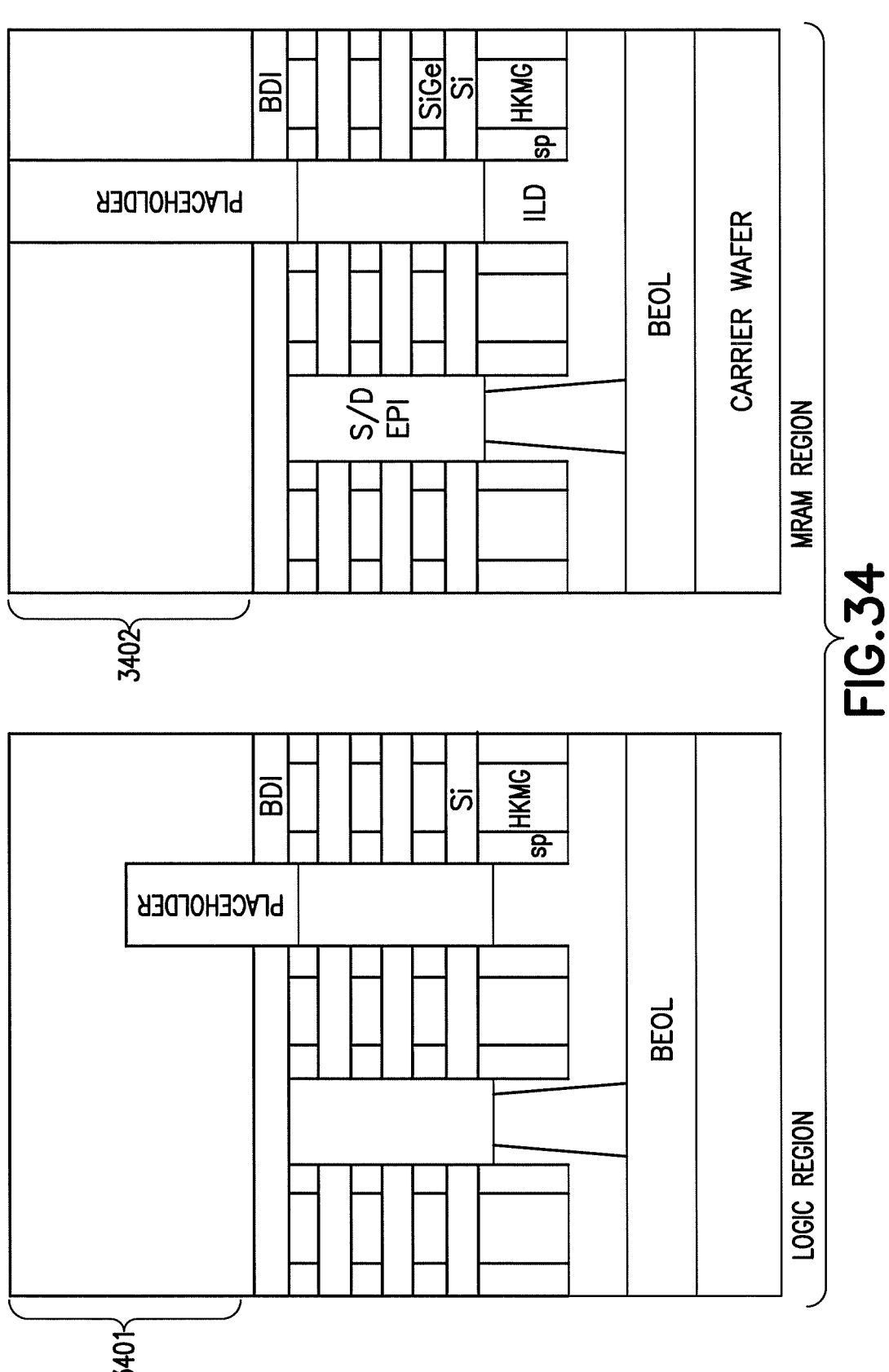
FIG. 34 depicts backside ILD deposition and CMP.
Figure 35:
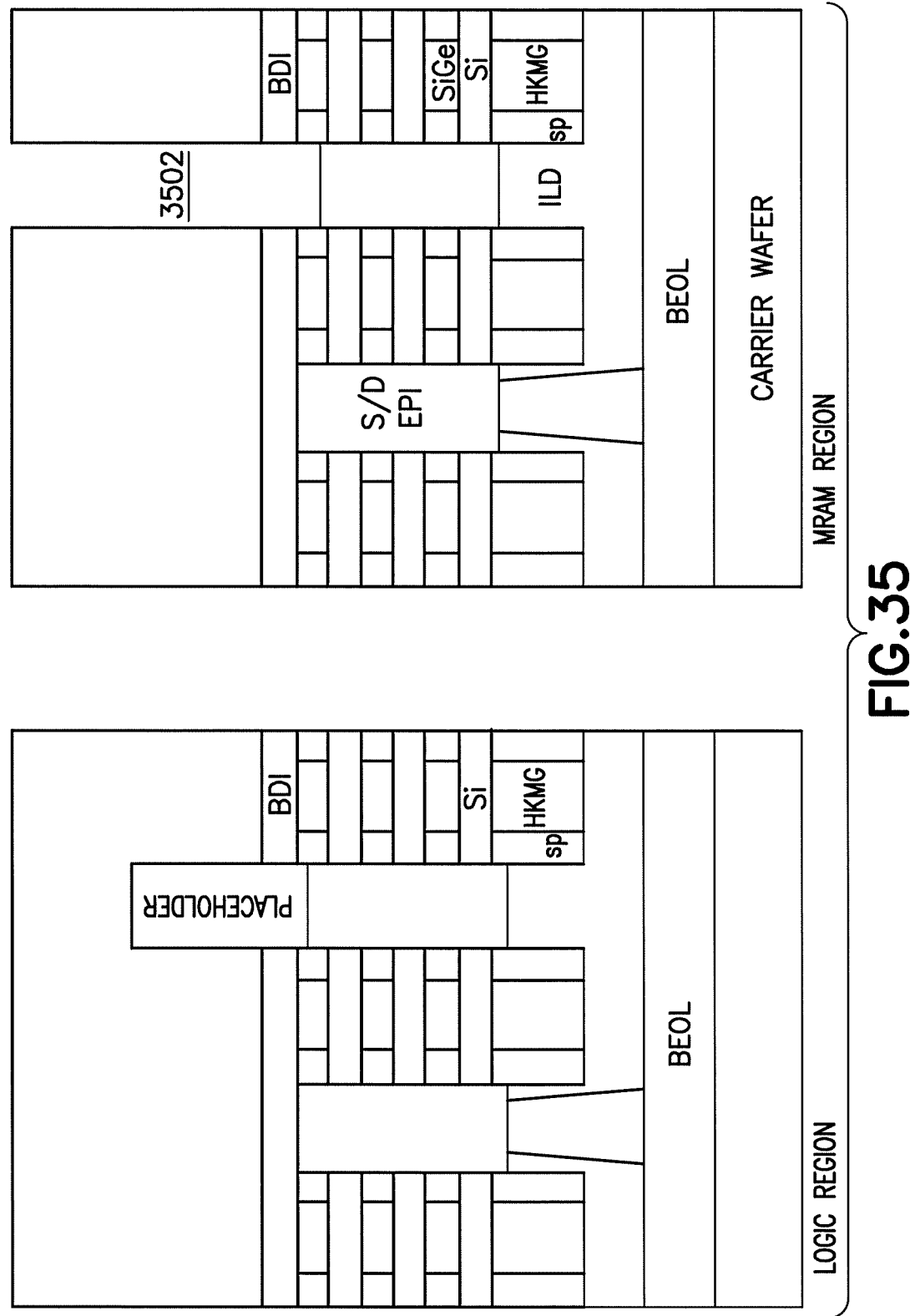
FIG. 35 depicts exposed placeholder removal.

FIG. 34 depicts backside ILD deposition and CMP. An ILD layer 3401 is formed on the backside of the logic region 2501 next to BDI layer 2509 to encapsulate placeholder 2901. An ILD layer 3402 is formed on the backside of the MRAM region 2502 next to the BDI layer 2510 to encapsulate placeholder 2902. FIG. 35 depicts exposed placeholder removal to form region 3502.

Figure 36:
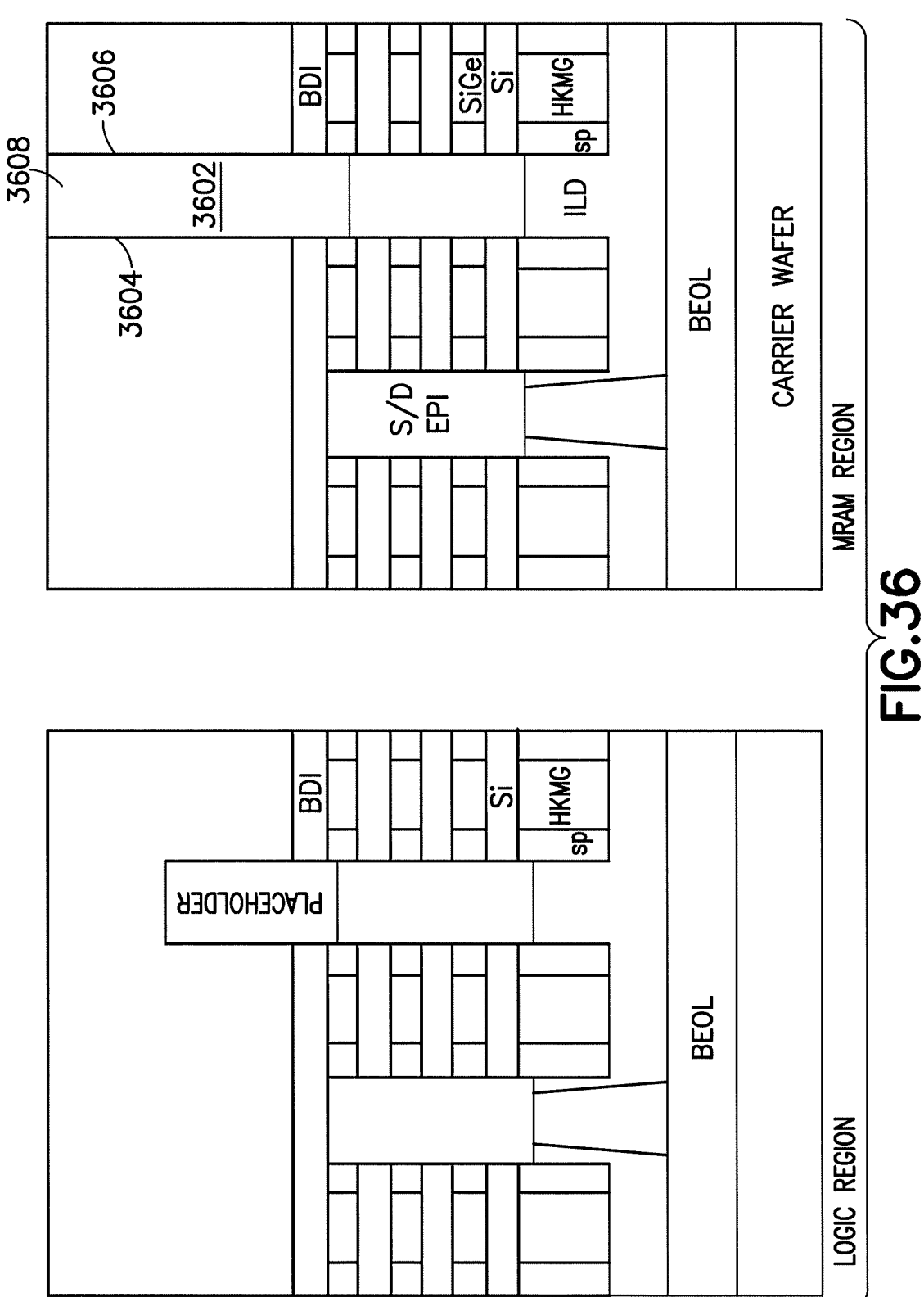
FIG. 36 depicts forming a contact including silicide liner, adhesion liner and metal fill.
Figure 37:
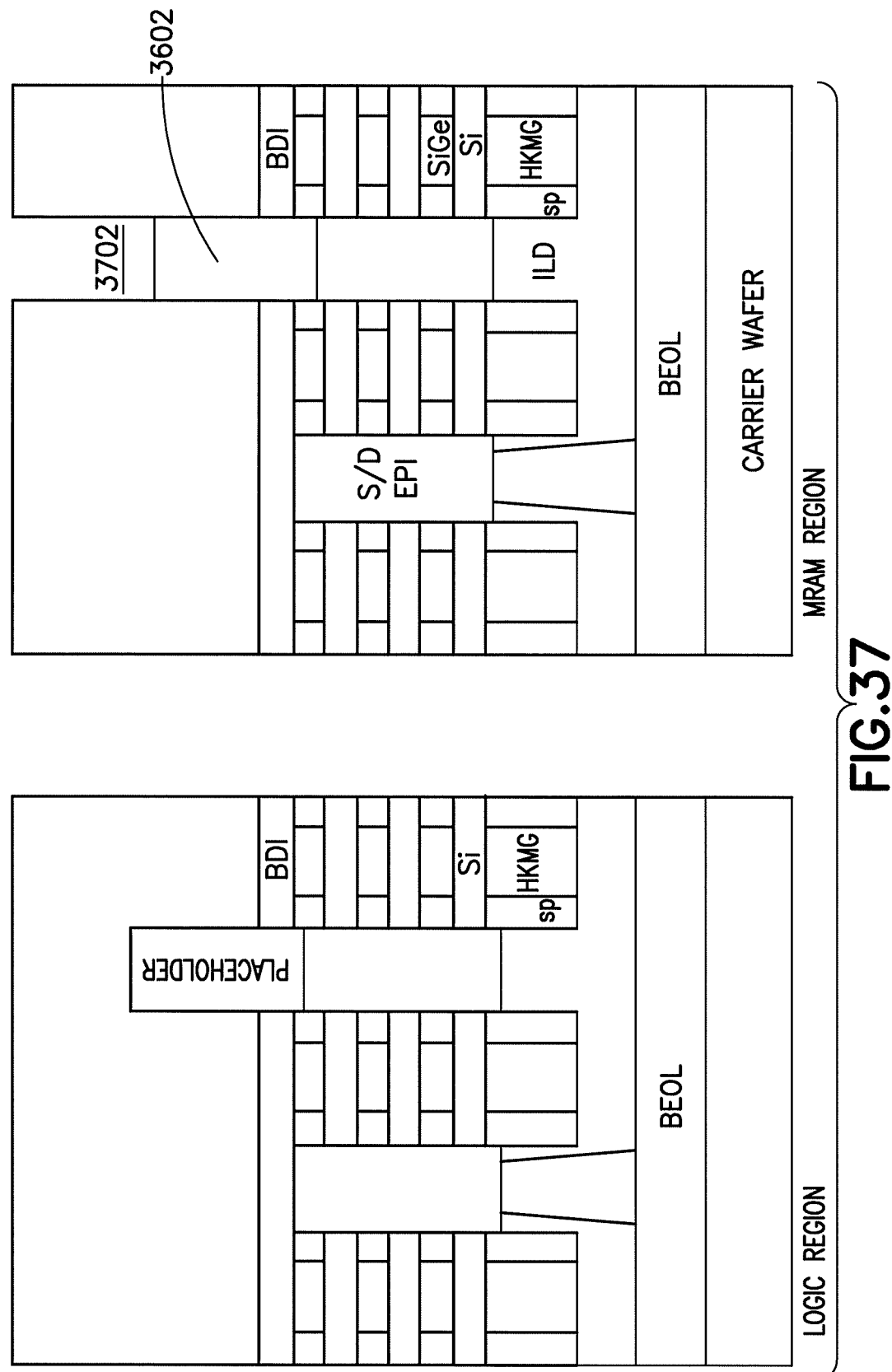
FIG. 37 depicts fabrication of a backside contact recess.
Figure 38:
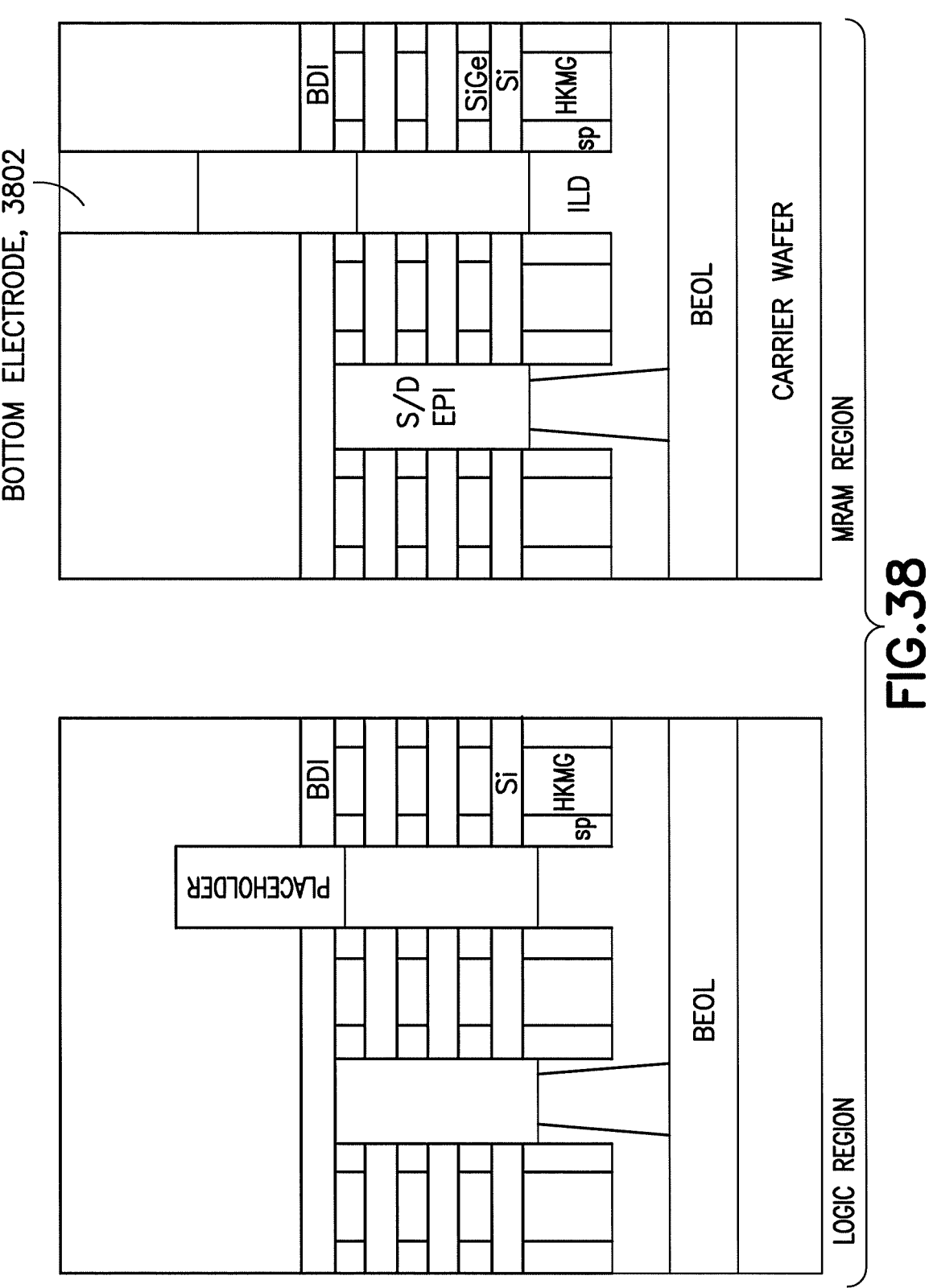
FIG. 38 depicts filling bottom electrode material for MRAM.
Figure 39:
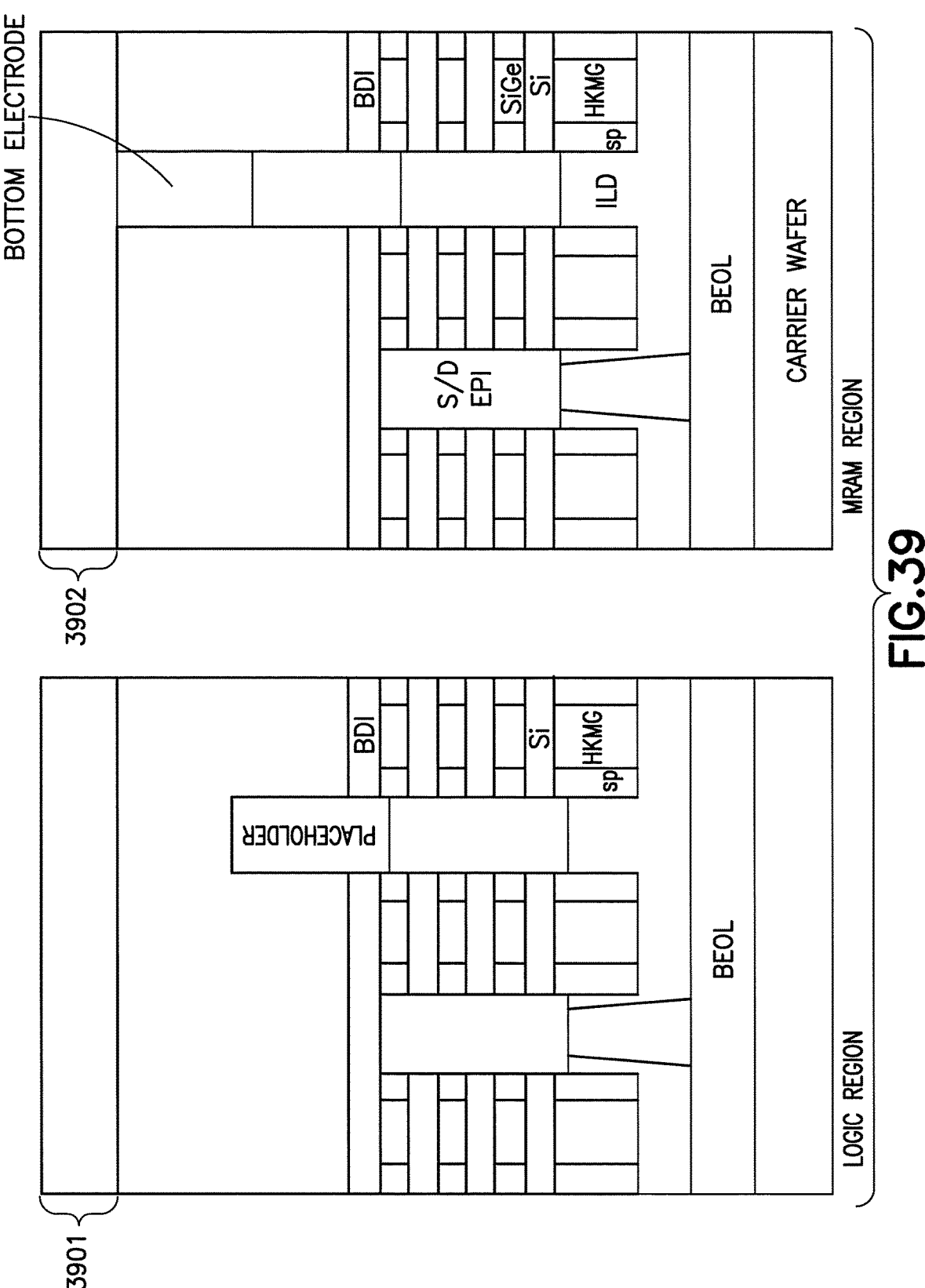
FIG. 39 depicts MRAM stack deposition.

FIG. 36 depicts forming contact 3602. Forming contact 3602 includes application of silicide liner (3604, 3606), such as titanium and adhesion liner titanium nitride (TiN) and metal fill 3608 such as Cobalt and CMP. FIG. 37 depicts fabrication of a backside contact recess 3702. FIG. 38 depicts filling bottom electrode material for the MRAM within recess 3702, to create a bottom electrode 3802. FIG. 39 depicts MRAM stack deposition 3901 in the logic region 2501 and MRAM stack deposition 3902 in the MRAM region 2502.

Figure 40:
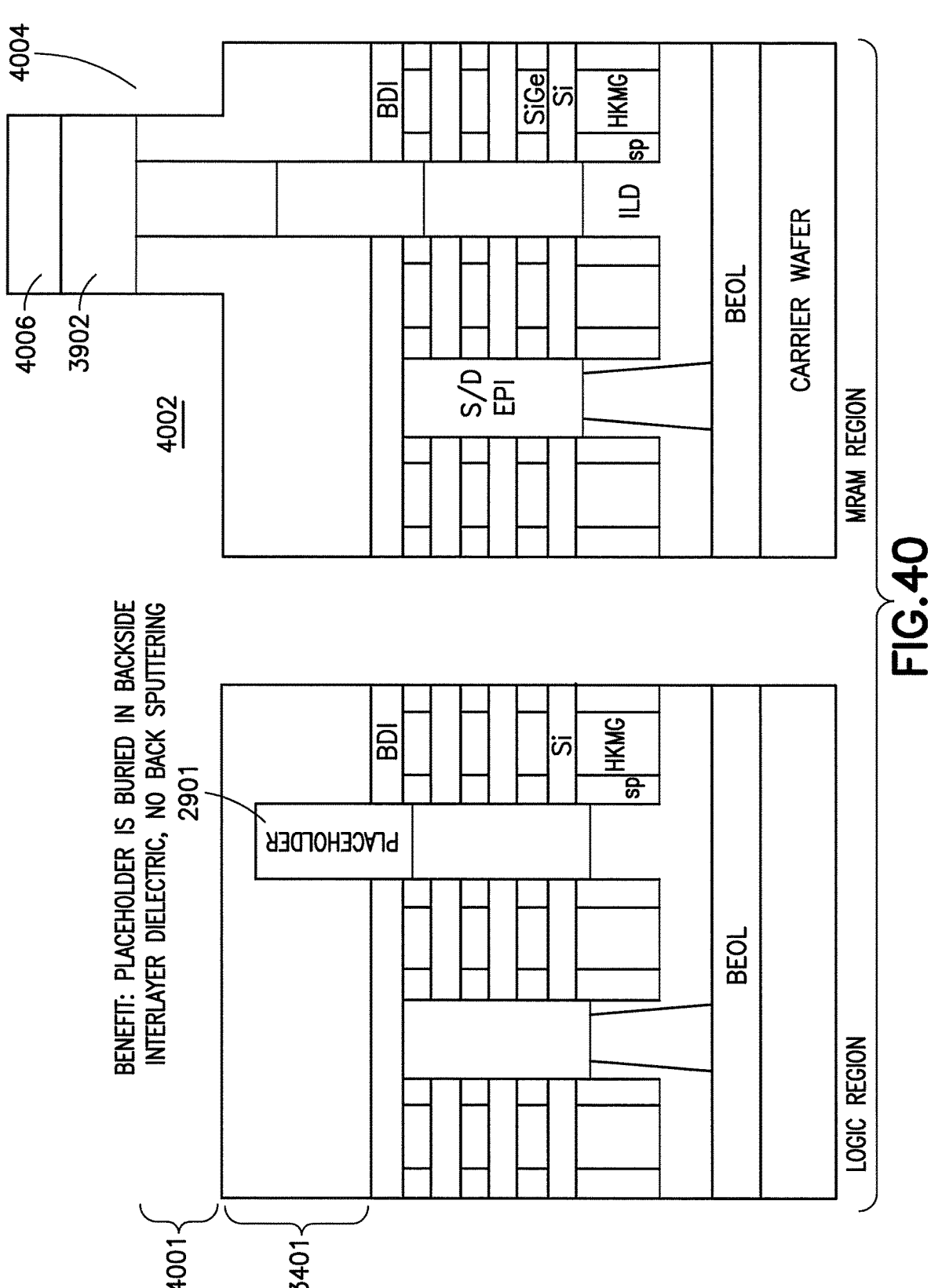
FIG. 40 depicts MRAM patterning by IBE.

FIG. 40 depicts MRAM patterning by IBE. In the logic region 2501, the MRAM stack deposition 3901 is removed and a portion (denoted by 4001) of the backside interlayer dielectric 3401 is removed. A benefit is that the placeholder 2901 is buried in the backside interlayer dielectric 3401 so that there is no back sputtering. In the MRAM region 2502, MRAM patterning includes creation of regions 4002 and 4004 by removing a portion of the backside interlayer dielectric 3402 and MRAM stack deposition 3902. A hardmask 4006 is applied to a side of a remaining portion of the MRAM stack deposition 3902.

Figure 41:
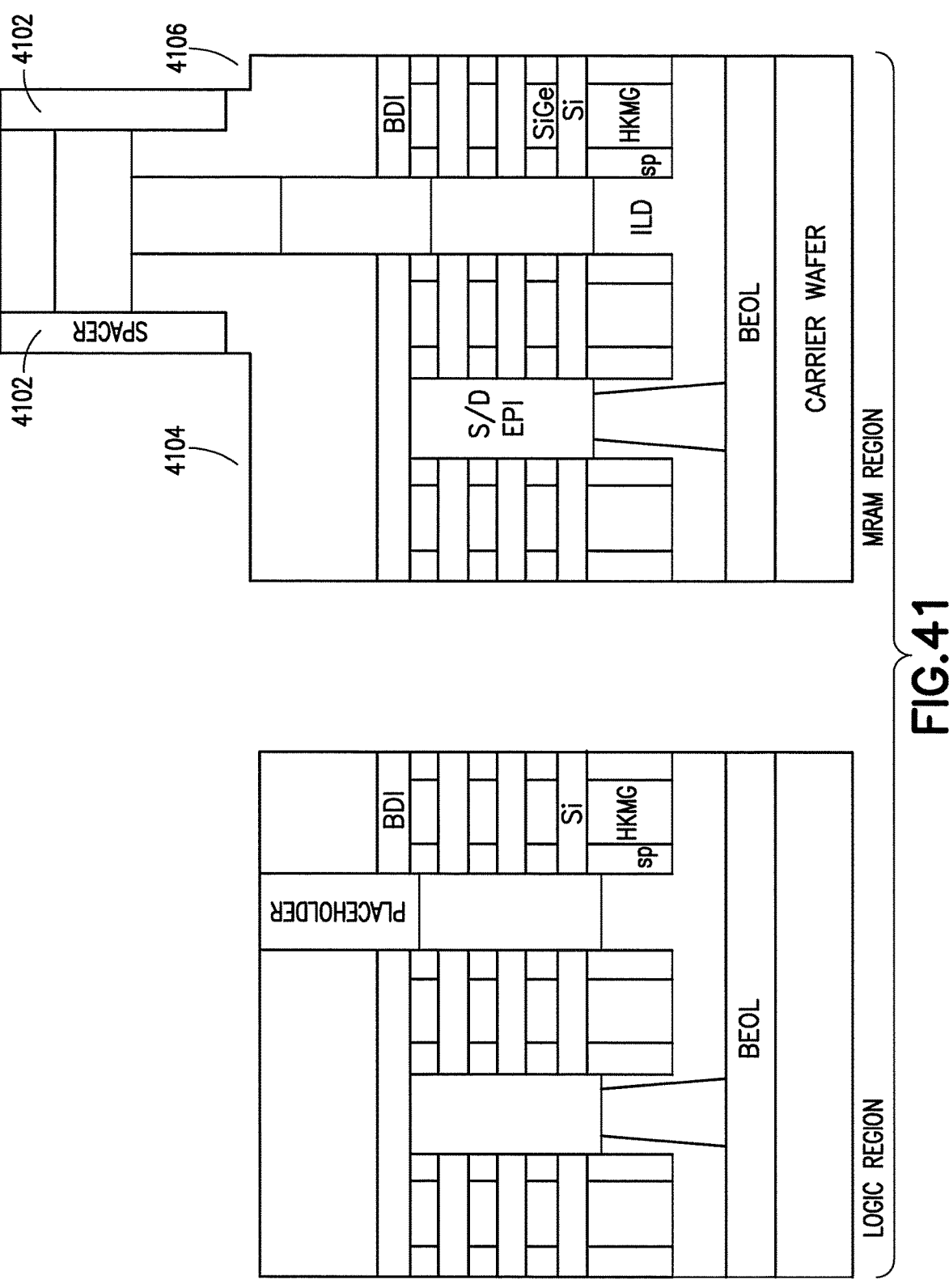
FIG. 41 depicts MRAM protective spacer deposition and RIE.
Figure 42:
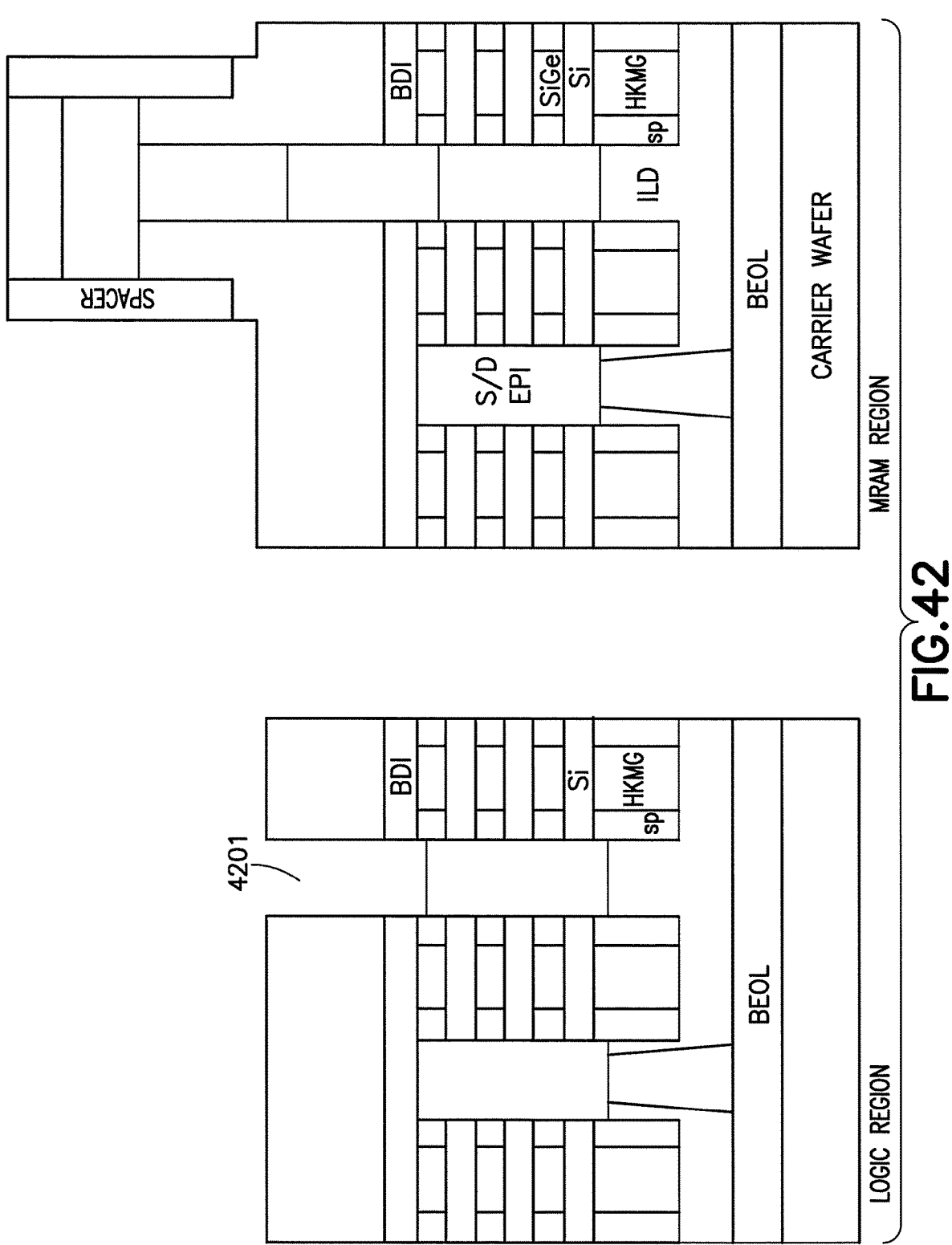
FIG. 42 depicts placeholder removal.
Figure 43:
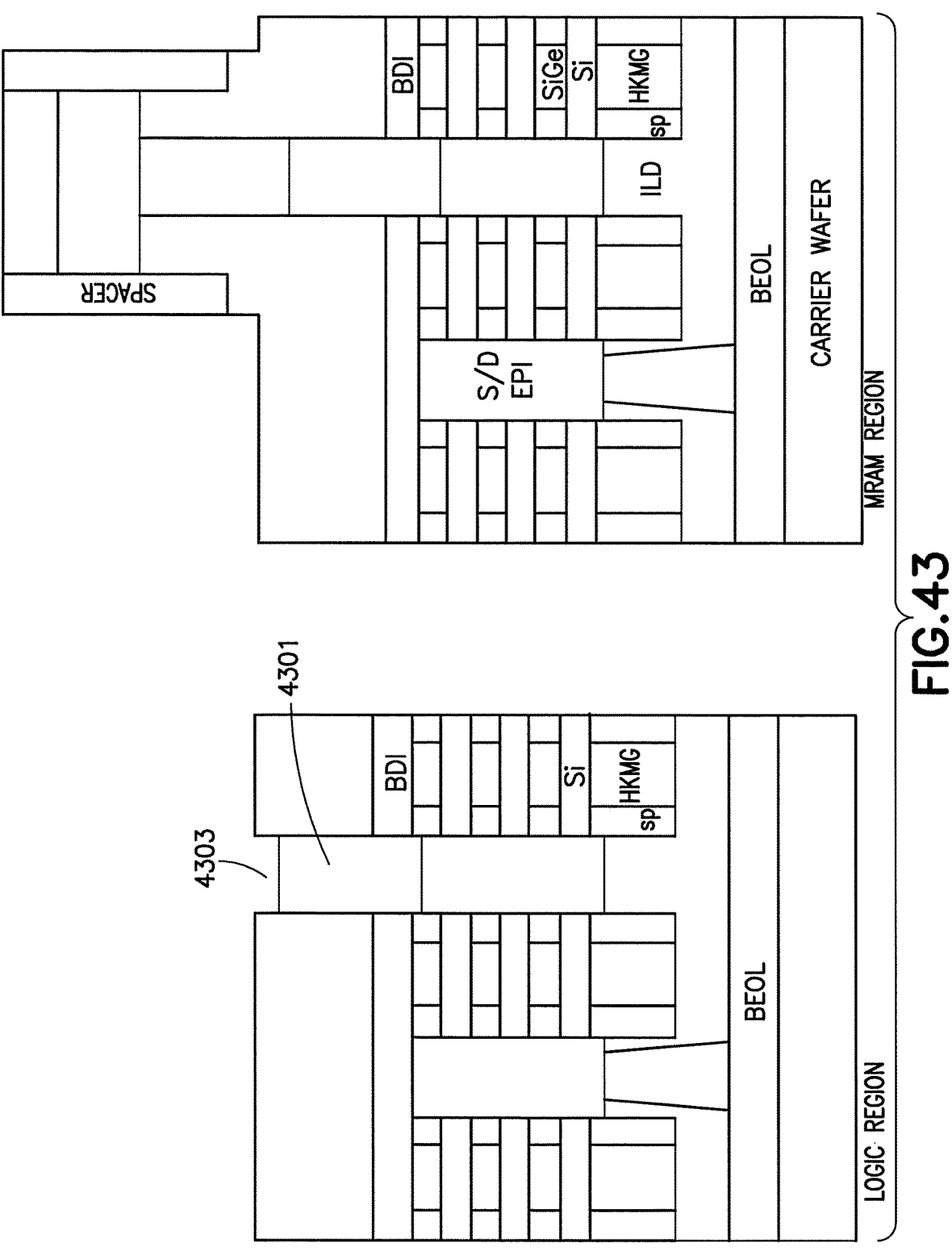
FIG. 43 depicts backside contact filling and recessing.

FIG. 41 depicts MRAM protective spacer deposition and RIE. An MRAM protective spacer 4102 is formed on the sides of hard mask 4006, MRAM stack deposition 3902, and backside interlayer dielectric 3402. Etching of the backside interlayer dielectric 3402 generates regions 4104 and 4106. FIG. 42 depicts placeholder removal, to remove placeholder 2901 from the logic region 2501, to generate region 4201. FIG. 43 depicts backside contact filling and recessing, to generate backside contact 4301 and recess 4303.

FIG. 44 depicts formation of a backside rail and backside interconnect formation. In the logic region 2501, backside power rail 4401 is connected to backside contact 4301 and to via 4403 which joins backside power rail 4401 to backside interconnect 4405. The backside interlayer dielectric layer 3401 is augmented (4407), so that the backside interlayer dielectric layer (3401, 4407) encapsulates backside power rail 4401 and via 4403. In the MRAM region 2502, backside interlayer dielectric layer 3402 is augmented (4408). In the MRAM region 2502, via 4404 connects backside interconnect layer 4406 to MRAM stack deposition 3902 through the backside interlayer dielectric layer (3402, 4408) and hard mask 4006. The backside interlayer dielectric layer (3402, 4408) encapsulates via 4404, hard mask 4006, spacer 4102, MRAM stack deposition 3902, bottom electrode 3802, and at least a portion of backside contact 3602. Also shown is S/D 4410 of transistor 4412, and S/D 4409 of transistor 4411, and memory device 4414. In FIG. 44, the MRAM device 4414 is directly connected to backside contact 3602.

Figure 45:
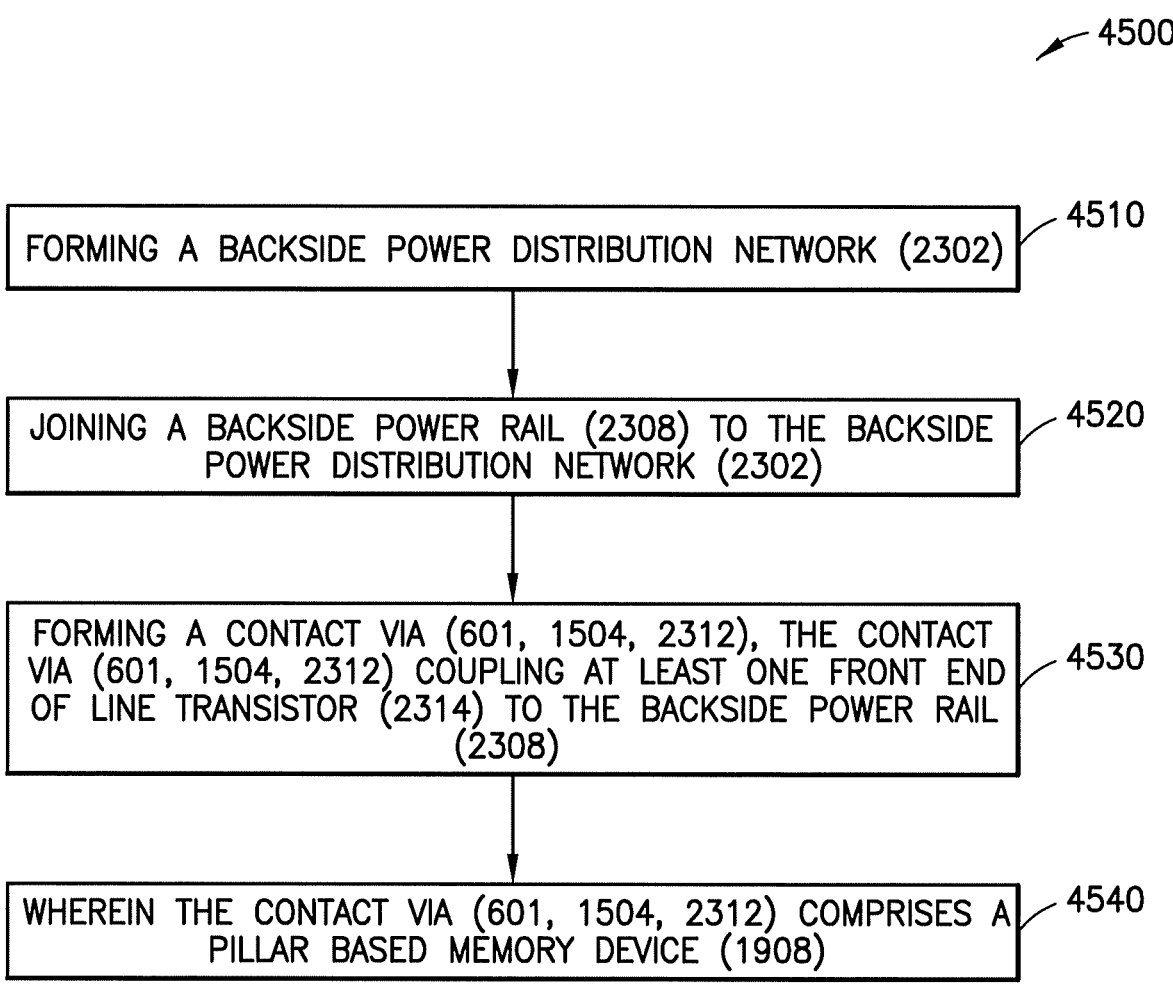
FIG. 45 is a logic flow diagram that illustrates a method of forming a pillar based memory device with a buried power rail and backside power distribution network.

FIG. 45 is a logic flow diagram 4500 that illustrates a method of forming a pillar based memory device with a buried power rail and backside power distribution network. At 4510, the method includes forming a backside power distribution network (2302). At 4520, the method includes joining a backside power rail (2308) to the backside power distribution network (2302). At 4530, the method includes forming a contact via (601, 1504, 2312), the contact via (601, 1504, 2312) coupling at least one front end of line transistor (2314) to the backside power rail (2308). At 4540, the method includes wherein the contact via (601, 1504, 2312) comprises a pillar based memory device (1908).

FIG. 46 is a logic flow diagram 4600 that illustrates a method of forming a semiconductor device. At 4610, the method includes forming, within a first region (2502) of a wafer (2551), a first sacrificial placeholder (2902) under a source or drain region (3012) of at least one transistor (4412) of the first region (2502). At 4620, the method includes forming, within a second region (2501) of the wafer (2551), a second sacrificial placeholder (2901) under a source or drain region (3011) of at least one transistor (4411) of the second region (2501). At 4630, the method includes wherein the first sacrificial placeholder (2902) is formed deeper within the wafer (2551) than the second sacrificial placeholder (2901). At 4640, the method includes flipping (3201, 3202) the wafer (2551). At 4650, the method includes removing the first sacrificial placeholder (2902) to form a first empty region (3502). At 4660, the method includes forming a first backside contact (3602) and an electrode (3802) for a memory device (4414) within at least partially the first empty region (3502), the first backside contact (3602) contacting a source (4410) or drain (4410) of the at least one transistor (4412) of the first region (2502). At 4670, the method includes depositing and patterning the memory device (4414) within at least partially the first empty region (3502). At 4680, the method includes removing the second sacrificial placeholder (2901) to form a second empty region (4201). At 4690, the method includes forming a second backside contact (4301) within at least partially the second empty region (4201), the second backside contact (4301) contacting a source (4409) or drain (4409) of the at least one transistor (4411) of the second region (2501).

Referring now to all the Figures, in one exemplary embodiment, an apparatus includes a backside power distribution network; a backside power rail joined to the backside power distribution network; and a backside contact via that couples at least one front end of line transistor to the backside power rail; wherein the backside contact via comprises a pillar based memory device.

A portion of the backside contact via couples a source or drain to the memory device. The apparatus may further include a non-magnetic conductive spacer between the memory device and the portion of the backside contact via. The memory device may be directly connected to the portion of the backside contact via. The memory device may comprise at least one of: a magnetoresistive random access memory; a phase change memory; or a resistive random access memory.

In another embodiment, a method includes forming a backside power distribution network; joining a backside power rail to the backside power distribution network; and forming a contact via, the contact via coupling at least one front end of line transistor to the backside power rail; wherein the contact via comprises a pillar based memory device.

The method may further include forming a recess within the contact via; and filling the recess with at least one non-magnetic material to form a non-magnetic conductive spacer between the memory device and a non-recessed portion of the contact via. The method may further include forming the memory device, the memory device formed with a method comprising: applying at least one non-magnetic pedestal material to a shallow trench isolation layer that encapsulates at least a portion of the contact via; depositing a hard mask to the non-magnetic pedestal material; forming a magnetic tunnel junction between the non-magnetic pedestal material and the hard mask; and forming an encapsulation spacer along at least one wall of the magnetic tunnel junction. The method may further include applying a block shape to a shallow trench isolation layer, wherein the block shape prevents etching into select portions of the contact via, the shallow trench isolation layer, and a silicon layer. The memory device may include at least one of: a magnetoresistive random access memory; a phase change memory; or a resistive random access memory.

In another embodiment, an apparatus includes a transistor comprising a source or drain; a backside contact coupled to the transistor; and a memory device formed at a backside of a wafer, the memory device comprising an electrode; wherein the electrode of the memory device is directly connected to the backside contact of the transistor.

The memory device may include at least one of: a magnetoresistive random access memory; a phase change memory; or a resistive random access memory. The backside contact may be substantially aligned with the electrode of the memory device, and the backside contact may be substantially aligned with the source or drain of the transistor. The backside contact may be isolated from gate metal of the transistor by a dielectric isolation layer and an inner spacer. The apparatus may further include a logic region of the wafer, the logic region differing from a region of the wafer comprising the memory device; and a logic region transistor within the logic region, the logic region transistor differing from the transistor; and a logic region backside contact within the logic region, the logic region backside contact differing from the backside contact; wherein the logic region backside contact comprises an upper surface that is lower than a lower surface of a spacer in the region of the wafer comprising the memory device, the spacer configured to isolate the backside contact from gate metal of the transistor.

In an embodiment, a method includes forming, within a first region of a wafer, a first sacrificial placeholder under a source or drain region of at least one transistor of the first region; forming, within a second region of the wafer, a second sacrificial placeholder under a source or drain region of at least one transistor of the second region; wherein the first sacrificial placeholder is formed deeper within the wafer than the second sacrificial placeholder; flipping the wafer; removing the first sacrificial placeholder to form a first empty region; forming a first backside contact and an electrode for a memory device within at least partially the first empty region, the first backside contact contacting a source or drain of the at least one transistor of the first region; depositing and patterning the memory device within at least partially the first empty region; removing the second sacrificial placeholder to form a second empty region; and forming a second backside contact within at least partially the second empty region, the second backside contact contacting a source or drain of the at least one transistor of the second region.

The method may further include coupling, with the first backside contact, the at least one transistor of the first region to the memory device; and coupling, with a via, the memory device to a back end of line interconnection. The method may further include coupling, with the second backside contact, the at least one transistor of the second region to a backside power rail; and coupling, with a via, the backside power rail to a back end of line interconnection. The first sacrificial placeholder may be formed deeper within the wafer than the second sacrificial placeholder so that an upper surface of the second backside contact is lower than a lower surface of a spacer in the first region of the wafer comprising the memory device, the spacer configured to isolate the first backside contact from gate metal of the at least one transistor of the first region. The memory device may include at least one of: a magnetoresistive random access memory; a phase change memory; or a resistive random access memory.

In another embodiment, a semiconductor device includes a first region comprising a first backside contact to couple at least one transistor of the first region to a memory device of the first region; and a second region comprising a second backside contact to couple at least one transistor of the second region to a backside power rail of the second region.

The first backside contact may directly connect a source or drain of the at least one transistor to an electrode of the memory device. An upper surface of the second backside contact may be lower than a lower surface of a spacer in the first region comprising the memory device, the spacer configured to isolate the first backside contact from gate metal of the at least one transistor of the first region. The memory device may include at least one of: a magnetoresistive random access memory; a phase change memory; or a resistive random access memory. The semiconductor device may further include an electrode of the memory device, wherein the first backside contact is substantially aligned with the electrode of the memory device.

References to a 'computer', 'processor', etc. should be understood to encompass not only computers having different architectures such as single/multi-processor architectures and sequential or parallel architectures but also specialized circuits such as field-programmable gate arrays (FPGAs), application specific circuits (ASICs), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The memory(ies) as described herein may be implemented using any suitable data storage technology, such as semiconductor based memory devices, flash memory, magnetic memory devices and systems, optical memory devices and systems, non-transitory memory, transitory memory, fixed memory and removable memory. The memory(ies) may comprise a database for storing data.

As used herein, circuitry may refer to the following: (a) hardware circuit implementations, such as implementations in analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. As a further example, as used herein, circuitry would also cover an implementation of merely a processor (or multiple processors) or a portion of a processor and its (or their) accompanying software and/or firmware. Circuitry would also cover, for example and if applicable to the particular element, a baseband integrated circuit or applications processor integrated circuit for a mobile phone or a similar integrated circuit in a server, a cellular network device, or another network device.

List of abbreviations, which abbreviations may be appended with each other or other characters using e.g. a dash or hyphen ("-"):

ASIC application-specific integrated circuit
BDI bottom dielectric isolation
BEOL back end of line
BOX buried oxide
CMP chemical mechanical planarization/polishing
DHF diluted hydrofluoric acid
eDRAM embedded dynamic random access memory
FEOL front end of line
FPGA field-programmable gate array
HF hydrofluoric acid
high-k high dielectric constant
HKMG high-k metal gate
IBE ion beam etching
ILD interlayer dielectric
M metal layer e.g. M1, M3
MOL middle of line MRAM magnetoresistive random access memory MTJ magnetic tunnel junction OPL organic planarization layer PCM phase change memory RC resistance capacitance ReRAM resistive random access memory RIE reactive-ion etching S/D source drain SHE-MRAM spin-hall effect MRAM Si silicon SiGe silicon-germanium Si:P phosphorus doped epitaxial silicon sp spacer STI shallow trench isolation STT spin-transfer torque TSV through silicon via VBPR via to buried power rail In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An apparatus comprising:

a transistor comprising a source or drain;

a backside contact coupled to the source or drain of the transistor, wherein a top surface of the backside contact is directly physically connected to a bottom surface of the source or drain of the transistor; and a memory device formed at a backside of a wafer, the memory device comprising an electrode;

wherein the electrode of the memory device is directly physically connected to the backside contact of the transistor.

2. The apparatus of claim 1, wherein the memory device comprises at least one of:

a magnetoresistive random access memory;

a phase change memory; or a resistive random access memory.

3. The apparatus of claim 1, wherein sidewalls of the backside contact are substantially aligned with sidewalls of the electrode of the memory device, and wherein sidewalls of the backside contact are substantially aligned with sidewalls the source or drain of the transistor.

4. The apparatus of claim 1, wherein the backside contact is isolated from gate metal of the transistor by a dielectric isolation layer and an inner spacer.

5. The apparatus of claim 1, further comprising:

a logic region of the wafer, the logic region differing from a region of the wafer comprising the memory device; and a logic region transistor within the logic region, the logic region transistor differing from the transistor; and a logic region backside contact within the logic region, the logic region backside contact differing from the backside contact;

wherein the logic region backside contact comprises an upper surface that is lower than a lower surface of a spacer in the region of the wafer comprising the memory device, the spacer configured to isolate the backside contact from gate metal of the transistor.

6. A method comprising:

forming, within a first region of a wafer, a first sacrificial placeholder under a source or drain region of at least one transistor of the first region;

forming, within a second region of the wafer, a second sacrificial placeholder under a source or drain region of at least one transistor of the second region;

wherein the first sacrificial placeholder is formed deeper within the wafer than the second sacrificial placeholder;

flipping the wafer;

removing the first sacrificial placeholder to form a first empty region;

forming a first backside contact and an electrode for a memory device within at least partially the first empty region, the first backside contact contacting a source or drain of the at least one transistor of the first region;

depositing and patterning the memory device within at least partially the first empty region;

removing the second sacrificial placeholder to form a second empty region; and forming a second backside contact within at least partially the second empty region, the second backside contact contacting a source or drain of the at least one transistor of the second region.

7. The method of claim 6, further comprising:

coupling, with the first backside contact, the at least one transistor of the first region to the memory device; and coupling, with a via, the memory device to a back end of line interconnection.

8. The method of claim 6, further comprising:

coupling, with the second backside contact, the at least one transistor of the second region to a backside power rail; and coupling, with a via, the backside power rail to a back end of line interconnection.

9. The method of claim 6, wherein the first sacrificial placeholder is formed deeper within the wafer than the second sacrificial placeholder so that an upper surface of the second backside contact is lower than a lower surface of a spacer in the first region of the wafer comprising the memory device, the spacer configured to isolate the first backside contact from gate metal of the at least one transistor of the first region.

10. The method of claim 6, wherein the memory device comprises at least one of:

a magnetoresistive random access memory;

a phase change memory; or a resistive random access memory.

11. A semiconductor device, comprising:

a first region comprising a first backside contact to couple at least one transistor of the first region to a memory device of the first region, wherein a top surface of the first backside contact is directly physically connected to a bottom surface source or drain of the at least one transistor; and a second region comprising a second backside contact to couple at least one transistor of the second region to a backside power rail of the second region.

12. The semiconductor device of claim 11, wherein a bottom surface of the first backside contact is directly physically connected to a top surface of an electrode of the memory device of the first region.

13. The semiconductor device of claim 11, wherein an upper surface of the second backside contact is lower than a lower surface of a spacer in the first region comprising the memory device, the spacer configured to isolate the first backside contact from gate metal of the at least one transistor of the first region.

14. The method of claim 6, wherein the memory device comprises at least one of:

a magnetoresistive random access memory;

a phase change memory; or a resistive random access memory.

15. The semiconductor device of claim 11, further comprising:

an electrode of the memory device, wherein sidewalls of the first backside contact are substantially aligned with sidewalls of the electrode of the memory device.

* * * * *